(12) United States Patent
Miyake et al.

(10) Patent No.: US 8,995,607 B2
(45) Date of Patent: Mar. 31, 2015

(54) PULSE SIGNAL OUTPUT CIRCUIT AND SHIFT REGISTER

(71) Applicant: Semiconductor Energy Laboratory Co., Ltd., Atsugi-shi, Kanagawa-ken (JP)

(72) Inventors: Hiroyuki Miyake, Kanagawa (JP); Kenichi Okazaki, Tochigi (JP); Toshiyuki Miyamoto, Tochigi (JP); Masafumi Nomura, Tochigi (JP); Takashi Hamochi, Tochigi (JP); Shunpei Yamazaki, Tokyo (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 15 days.

(21) Appl. No.: 13/903,193

(22) Filed: May 28, 2013

(65) Prior Publication Data

US 2013/0322592 A1 Dec. 5, 2013

(30) Foreign Application Priority Data

May 31, 2012 (JP) ................................. 2012-124661

(51) Int. Cl.
*G11C 19/00* (2006.01)
*G11C 19/18* (2006.01)
(Continued)

(52) U.S. Cl.
CPC .............. *H03K 3/353* (2013.01); *G11C 19/184* (2013.01); *G11C 19/28* (2013.01)
USPC ..................... 377/64; 377/68; 377/78; 377/79

(58) Field of Classification Search
None
See application file for complete search history.

(56) References Cited

U.S. PATENT DOCUMENTS 5,731,856 A 3/1998 Kim et al.
5,744,864 A 4/1998 Cillessen et al.
(Continued)

FOREIGN PATENT DOCUMENTS

EP 1 737 044 A1 12/2006
EP 2 226 847 A2 9/2010
(Continued)

OTHER PUBLICATIONS

Ohara, H et al., "Amorphous In—Ga—Zn—Oxide TFTs with Suppressed Variation for 4.0 inch QVGA AMOLED Display," AM-FPD '09 Digest of Technical Papers, Jul. 1, 2009, pp. 227-230, The Japan Society of Applied Physics.
(Continued)

*Primary Examiner* — Tuan T Lam
(74) *Attorney, Agent, or Firm* — Fish & Richardson P.C.

(57) ABSTRACT

To provide a pulse signal output circuit and a shift register which have lower power consumption, are not easily changed over time, and have a longer lifetime. A pulse signal output circuit includes a first input signal generation circuit; a second input signal generation circuit; an output circuit which includes a first transistor and a second transistor and outputs a pulse signal in response to a signal output from the first and second input signal generation circuits; a monitor circuit which obtains the threshold voltages of the first and second transistors; and a power supply output circuit which generates a power supply potential raised by a potential higher than or equal to a potential which is equal to or substantially equal to the threshold voltage and supplies the power supply potential to the first and second input signal generation circuits. A shift register includes the pulse signal output circuit.

19 Claims, 22 Drawing Sheets

(51) Int. Cl.
   *H03K 3/353* (2006.01)
   *G11C 19/28* (2006.01)

(56) References Cited

U.S. PATENT DOCUMENTS

| | | |
|---|---|---|
| 6,229,506 B1 | 5/2001 | Dawson et al. |
| 6,229,508 B1 | 5/2001 | Kane |
| 6,294,274 B1 | 9/2001 | Kawazoe et al. |
| 6,359,605 B1 | 3/2002 | Knapp et al. |
| 6,563,174 B2 | 5/2003 | Kawasaki et al. |
| 6,693,388 B2 | 2/2004 | Oomura |
| 6,727,522 B1 | 4/2004 | Kawasaki et al. |
| 6,943,371 B2 | 9/2005 | Chen et al. |
| 7,015,882 B2 | 3/2006 | Yumoto |
| 7,030,847 B2 | 4/2006 | Kimura |
| 7,049,190 B2 | 5/2006 | Takeda et al. |
| 7,061,014 B2 | 6/2006 | Hosono et al. |
| 7,064,346 B2 | 6/2006 | Kawasaki et al. |
| 7,105,868 B2 | 9/2006 | Nause et al. |
| 7,211,825 B2 | 5/2007 | Shih et al |
| 7,282,782 B2 | 10/2007 | Hoffman et al. |
| 7,297,977 B2 | 11/2007 | Hoffman et al. |
| 7,323,356 B2 | 1/2008 | Hosono et al. |
| 7,327,357 B2 | 2/2008 | Jeong |
| 7,385,224 B2 | 6/2008 | Ishii et al. |
| 7,402,506 B2 | 7/2008 | Levy et al. |
| 7,411,209 B2 | 8/2008 | Endo et al. |
| 7,453,065 B2 | 11/2008 | Saito et al. |
| 7,453,087 B2 | 11/2008 | Iwasaki |
| 7,462,862 B2 | 12/2008 | Hoffman et al. |
| 7,468,304 B2 | 12/2008 | Kaji et al. |
| 7,501,293 B2 | 3/2009 | Ito et al. |
| 7,564,433 B2 | 7/2009 | Hector et al. |
| 7,671,826 B2 | 3/2010 | Kimura |
| 7,674,650 B2 | 3/2010 | Akimoto et al. |
| 7,732,819 B2 | 6/2010 | Akimoto et al. |
| 8,164,547 B2 | 4/2012 | Kimura |
| 8,320,516 B2 | 11/2012 | Toyotaka |
| 8,325,111 B2 | 12/2012 | Kimura |
| 8,350,785 B2 | 1/2013 | Kimura |
| 8,369,478 B2 | 2/2013 | Miyake |
| 8,384,079 B2 | 2/2013 | Yamazaki et al. |
| 8,432,350 B2 | 4/2013 | Kimura |
| 8,442,183 B2 | 5/2013 | Amano et al. |
| 8,461,594 B2 | 6/2013 | Morosawa et al. |
| 8,546,180 B2 | 10/2013 | Yamazaki et al. |
| 8,730,220 B2 * | 5/2014 | Miyake et al. ............... 345/208 |
| 8,790,960 B2 | 7/2014 | Yamazaki |
| 2001/0046027 A1 | 11/2001 | Tai et al. |
| 2002/0056838 A1 | 5/2002 | Ogawa |
| 2002/0132454 A1 | 9/2002 | Ohtsu et al. |
| 2003/0189401 A1 | 10/2003 | Kido et al. |
| 2003/0218222 A1 | 11/2003 | Wager, III et al. |
| 2004/0038446 A1 | 2/2004 | Takeda et al. |
| 2004/0127038 A1 | 7/2004 | Carcia et al. |
| 2005/0017302 A1 | 1/2005 | Hoffman |
| 2005/0199959 A1 | 9/2005 | Chiang et al. |
| 2006/0035452 A1 | 2/2006 | Carcia et al. |
| 2006/0043377 A1 | 3/2006 | Hoffman et al. |
| 2006/0082528 A1 | 4/2006 | Guo et al. |
| 2006/0091793 A1 | 5/2006 | Baude et al. |
| 2006/0108529 A1 | 5/2006 | Saito et al. |
| 2006/0108636 A1 | 5/2006 | Sano et al. |
| 2006/0110867 A1 | 5/2006 | Yabuta et al. |
| 2006/0113536 A1 | 6/2006 | Kumomi et al. |
| 2006/0113539 A1 | 6/2006 | Sano et al. |
| 2006/0113549 A1 | 6/2006 | Den et al. |
| 2006/0113565 A1 | 6/2006 | Abe et al. |
| 2006/0163678 A1 | 7/2006 | Anezaki |
| 2006/0169973 A1 | 8/2006 | Isa et al. |
| 2006/0170111 A1 | 8/2006 | Isa et al. |
| 2006/0197092 A1 | 9/2006 | Hoffman et al. |
| 2006/0208977 A1 | 9/2006 | Kimura |
| 2006/0228974 A1 | 10/2006 | Thelss et al. |
| 2006/0231882 A1 | 10/2006 | Kim et al. |
| 2006/0238135 A1 | 10/2006 | Kimura |
| 2006/0244107 A1 | 11/2006 | Sugihara et al. |
| 2006/0284171 A1 | 12/2006 | Levy et al. |
| 2006/0284172 A1 | 12/2006 | Ishii |
| 2006/0292777 A1 | 12/2006 | Dunbar |
| 2007/0024187 A1 | 2/2007 | Shin et al. |
| 2007/0046191 A1 | 3/2007 | Saito |
| 2007/0052025 A1 | 3/2007 | Yabuta |
| 2007/0054507 A1 | 3/2007 | Kaji et al. |
| 2007/0090365 A1 | 4/2007 | Hayashi et al. |
| 2007/0108446 A1 | 5/2007 | Akimoto |
| 2007/0152217 A1 | 7/2007 | Lai et al. |
| 2007/0172591 A1 | 7/2007 | Seo et al. |
| 2007/0187678 A1 | 8/2007 | Hirao et al. |
| 2007/0187760 A1 | 8/2007 | Furuta et al. |
| 2007/0194379 A1 | 8/2007 | Hosono et al. |
| 2007/0252928 A1 | 11/2007 | Ito et al. |
| 2007/0272922 A1 | 11/2007 | Kim et al. |
| 2007/0287296 A1 | 12/2007 | Chang |
| 2008/0006877 A1 | 1/2008 | Mardilovich et al. |
| 2008/0038882 A1 | 2/2008 | Takechi et al. |
| 2008/0038929 A1 | 2/2008 | Chang |
| 2008/0050595 A1 | 2/2008 | Nakagawara et al. |
| 2008/0073653 A1 | 3/2008 | Iwasaki |
| 2008/0083950 A1 | 4/2008 | Pan et al. |
| 2008/0106191 A1 | 5/2008 | Kawase |
| 2008/0128689 A1 | 6/2008 | Lee et al. |
| 2008/0129195 A1 | 6/2008 | Ishizaki et al. |
| 2008/0166834 A1 | 7/2008 | Kim et al. |
| 2008/0182358 A1 | 7/2008 | Cowdery-Corvan et al. |
| 2008/0224133 A1 | 9/2008 | Park et al. |
| 2008/0254569 A1 | 10/2008 | Hoffman et al. |
| 2008/0258139 A1 | 10/2008 | Ito et al. |
| 2008/0258140 A1 | 10/2008 | Lee et al. |
| 2008/0258141 A1 | 10/2008 | Park et al. |
| 2008/0258143 A1 | 10/2008 | Kim et al. |
| 2008/0296568 A1 | 12/2008 | Ryu et al. |
| 2009/0068773 A1 | 3/2009 | Lai et al. |
| 2009/0073325 A1 | 3/2009 | Kuwabara et al. |
| 2009/0114910 A1 | 5/2009 | Chang |
| 2009/0134399 A1 | 5/2009 | Sakakura et al. |
| 2009/0152506 A1 | 6/2009 | Umeda et al. |
| 2009/0152541 A1 | 6/2009 | Maekawa et al. |
| 2009/0278122 A1 | 11/2009 | Hosono et al. |
| 2009/0280600 A1 | 11/2009 | Hosono et al. |
| 2010/0065844 A1 | 3/2010 | Tokunaga |
| 2010/0072467 A1 | 3/2010 | Yamazaki et al. |
| 2010/0092800 A1 | 4/2010 | Itagaki et al. |
| 2010/0102311 A1 | 4/2010 | Ito et al. |
| 2010/0109002 A1 | 5/2010 | Itagaki et al. |
| 2010/0188385 A1 * | 7/2010 | Boiko ............... 345/211 |
| 2010/0301328 A1 | 12/2010 | Yamazaki et al. |
| 2011/0062435 A1 | 3/2011 | Yamazaki et al. |
| 2011/0114942 A1 | 5/2011 | Akimoto et al. |
| 2011/0193846 A1 | 8/2011 | Kimura et al. |
| 2011/0227139 A1 | 9/2011 | Kakehata et al. |
| 2012/0061663 A1 | 3/2012 | Yamazaki et al. |
| 2012/0273779 A1 | 11/2012 | Yamazaki et al. |
| 2012/0273780 A1 | 11/2012 | Yamazaki et al. |
| 2012/0280230 A1 | 11/2012 | Akimoto et al. |
| 2013/0077735 A1 * | 3/2013 | Hirose ............... 377/64 |
| 2013/0264563 A1 | 10/2013 | Okazaki et al. |
| 2013/0270549 A1 | 10/2013 | Okazaki et al. |
| 2013/0320848 A1 | 12/2013 | Miyake et al. |
| 2014/0023173 A1 * | 1/2014 | Miyake ............... 377/54 |
| 2014/0044229 A1 * | 2/2014 | Chan et al. ............... 377/70 |
| 2014/0085285 A1 * | 3/2014 | Kim ............... 345/211 |
| 2014/0091997 A1 * | 4/2014 | Han et al. ............... 345/92 |

FOREIGN PATENT DOCUMENTS

| | | |
|---|---|---|
| JP | 60-198861 A | 10/1985 |
| JP | 63-210022 A | 8/1988 |
| JP | 63-210023 A | 8/1988 |
| JP | 63-210024 A | 8/1988 |
| JP | 63-215519 A | 9/1988 |
| JP | 63-239117 A | 10/1988 |
| JP | 63-265818 A | 11/1988 |
| JP | 05-251705 A | 9/1993 |

(56) References Cited

FOREIGN PATENT DOCUMENTS

| JP | 08-264794 A | 10/1996 |
|---|---|---|
| JP | 11-505377 A | 5/1999 |
| JP | 2000-044236 A | 2/2000 |
| JP | 2000-150900 A | 5/2000 |
| JP | 2002-076356 A | 3/2002 |
| JP | 2002-289859 A | 10/2002 |
| JP | 2003-086000 A | 3/2003 |
| JP | 2003-086808 A | 3/2003 |
| JP | 2004-103957 A | 4/2004 |
| JP | 2004-273614 A | 9/2004 |
| JP | 2004-273732 A | 9/2004 |
| JP | 2007-096055 A | 4/2007 |
| JP | 2007-123861 A | 5/2007 |
| JP | 2011-205627 A | 10/2011 |
| WO | 2004/114391 A1 | 12/2004 |

OTHER PUBLICATIONS

Orita, M et al., "Amorphous transparent conductive oxide InGaO3(ZnO)m (m<4):a Zn4s conductor," Philosophical Magazine, 2001, vol. 81, No. 5, pp. 501-515.

Orita, M et al., "Mechanism of Electrical Conductivity of Transparent InGaZnO4," Phys. Rev. B (Physical Review. B), Jan. 15, 2000, vol. 61, No. 3, pp. 1811-1816.

Osada, T et al., "15.2: Development of Driver-Integrated Panel using Amorphous In—Ga—Zn—Oxide TFT," SID Digest '09 : SID International Symposium Digest of Technical Papers, May 31, 2009, pp. 184-187.

Osada, T et al., "Development of Driver-Integrated Panel Using Amorphous In—Ga—Zn—Oxide TFT," AM-FPD '09 Digest of Technical Papers, Jul. 1, 2009, pp. 33-36.

Park, J et al., "Dry etching of ZnO films and plasma-induced damage to optical properties," J. Vac. Sci. Technol. B (Journal of Vacuum Science & Technology B), Mar. 1, 2003, vol. 21, No. 2, pp. 800-803.

Park, J et al., "Improvements in the Device Characteristics of Amorphous Indium Gallium Zinc Oxide Thin-Film Transistors by Ar Plasma Treatment," Appl. Phys. Lett. (Applied Physics Letters), Jun. 26, 2007, vol. 90, No. 26, pp. 262106-1-262106-3.

Park, J et al., "Electronic Transport Properties of Amorphous Indium—Gallium—Zinc Oxide Semiconductor Upon Exposure to Water," Appl. Phys. Lett. (Applied Physics Letters), 2008, vol. 92, pp. 072104-1-072104-3.

Park, J et al., "High performance amorphous oxide thin film transistors with self-aligned top-gate structure," IEDM 09: Technical Digest of International Electron Devices Meeting, Dec. 7, 2009, pp. 191-194.

Park, Sang-Hee et al., "42.3: Transparent ZnO Thin Film Transistor for the Application of High Aperture Ratio Bottom Emission AM-OLED Display," SID Digest '08 : SID International Symposium Digest of Technical Papers, May 20, 2008, vol. 39, pp. 629-632.

Park, J et al., "Amorphous Indium—Gallium—Zinc Oxide TFTs and Their Application for Large Size AMOLED," AM-FPD '08 Digest of Technical Papers, Jul. 2, 2008, pp. 275-278.

Park, S et al., "Challenge to Future Displays: Transparent AM-OLED Driven by PEALD Grown ZnO TFT," IMID '07 Digest, 2007, pp. 1249-1252.

Prins, M et al., "A Ferroelectric Transparent Thin-Film Transistor," Appl. Phys. Lett. (Applied Physics Letters), Jun. 17, 1996, vol. 68, No. 25, pp. 3650-3652.

Sakata, J et al., "Development of 4.0-In. AMOLED Display With Driver Circuit Using Amorphous In—Ga—Zn—Oxide TFTs," IDW '09 : Proceedings of the 16th International Display Workshops, 2009, pp. 689-692.

Son, K et al., "42.4L: Late-News Paper: 4 Inch QVGA AMOLED Driven by the Threshold Voltage Controlled Amorphous GIZO (Ga2O3—In2O3—ZnO) TFT," SID Digest '08 : SID International Symposium Digest of Technical Papers, May 20, 2008, vol. 39, pp. 633-636.

Takahashi, M et al., "Theoretical Analysis of IGZO Transparent Amorphous Oxide Semiconductor," IDW '08 : Proceedings of the 15th International Display Workshops, Dec. 3, 2008, pp. 1637-1640.

Tsuda, K et al., "Ultra Low Power Consumption Technologies for Mobile TFT-LCDs," IDW '02 : Proceedings of the 9th International Display Workshops, Dec. 4, 2002, pp. 295-298.

Ueno, K et al., "Field-Effect Transistor on SrTiO3 with Sputtered Al2O3 Gate Insulator," Appl. Phys. Lett. (Applied Physics Letters), Sep. 1, 2003, vol. 83, No. 9, pp. 1755-1757.

Van De Walle, C, "Hydrogen as a Cause of Doping in Zinc Oxide," Phys. Rev. Lett. (Physical Review Letters), Jul. 31, 2000, vol. 85, No. 5, pp. 1012-1015.

Asakuma, N et al., "Crystallization and Reduction of Sol-Gel-Derived Zinc Oxide Films by Irradiation With Ultraviolet Lamp," Journal of Sol-Gel Science and Technology, 2003, vol. 26, pp. 181-184.

Asaoka, Y et al., "29.1: Polarizer-Free Reflective LCD Combined With Ultra Low-Power Driving Technology," SID Digest '09 : SID International Symposium Digest of Technical Papers, 2009, pp. 395-398.

Chern, H et al., "An Analytical Model for the Above-Threshold Characteristics of Polysilicon Thin-Film Transistors," IEEE Transactions on Electron Devices, Jul. 1, 1995, vol. 42, No. 7, pp. 1240-1246.

Cho, D et al., "21.2: Al and Sn-Doped Zinc Indium Oxide Thin Film Transistors for AMOLED Back-Plane," SID Digest '09 : SID International Symposium Digest of Technical Papers, May 31, 2009, pp. 280-283.

Clark, S et al., "First Principles Methods Using CASTEP," Zeitschrift fur Kristallographie, 2005, vol. 220, pp. 567-570.

Coates. D et al., "Optical Studies of the Amorphous Liquid-Cholesteric Liquid Crystal Transition: The Blue Phase," Physics Letters, Sep. 10, 1973, vol. 45A, No. 2, pp. 115-116.

Costello, M et al., "Electron Microscopy of a Cholesteric Liquid Crystal and Its Blue Phase," Phys. Rev. A (Physical Review. A), May 1, 1984, vol. 29, No. 5, pp. 2957-2959.

Dembo, H et al., "RFCPUS on Glass and Plastic Substrates Fabricated by TFT Transfer Technology," IEDM 05: Technical Digest of International Electron Devices Meeting, Dec. 5, 2005, pp. 1067-1069.

Fortunato, E et al., "Wide-Bandgap High-Mobility ZnO Thin-Film Transistors Produced at Room Temperature," Appl. Phys. Lett. (Applied Physics Letters), Sep. 27, 2004, vol. 85, No. 13, pp. 2541-2543.

Fung, T et al., "2-D Numerical Simulation of High Performance Amorphous In—Ga—Zn—O TFTs for Flat Panel Displays," AM-FPD '08 Digest of Technical Papers, Jul. 2, 2008, pp. 251-252, The Japan Society of Applied Physics.

Godo, H et al., "P-9: Numerical Analysis on Temperature Dependence of Characteristics of Amorphous In—Ga—Zn—Oxide TFT," SID Digest '09 : SID International Symposium Digest of Technical Papers, May 31, 2009, pp. 1110-1112.

Godo, H et al., "Temperature Dependence of Characteristics and Electronic Structure for Amorphous In—Ga—Zn—Oxide TFT," AM-FPD '09 Digest of Technical Papers, Jul. 1, 2009, pp. 41-44.

Hayashi, R et al., "42.1: Invited Paper: Improved Amorphous In—Ga—Zn—O TFTs," SID Digest '08 : SID International Symposium Digest of Technical Papers, May 20, 2008, vol. 39, pp. 621-624.

Hirao, T et al., "Novel Top-Gate Zinc Oxide Thin-Film Transistors (ZnO TFTs) for AMLCDs," Journal of the SID , 2007, vol. 15, No. 1, pp. 17-22.

Hosono, H et al., "Working hypothesis to explore novel wide band gap electrically conducting amorphous oxides and examples," J. Non-Cryst. Solids (Journal of Non-Crystalline Solids), 1996, vol. 198-200, pp. 165-169.

Hosono, H, "68.3: Invited Paper:Transparent Amorphous Oxide Semiconductors for High Performance TFT," SID Digest '07 : SID International Symposium Digest of Technical Papers, 2007, vol. 38, pp. 1830-1833.

Hsieh, H et al., "P-29: Modeling of Amorphous Oxide Semiconductor Thin Film Transistors and Subgap Density of States," SID Digest '08 : SID International Symposium Digest of Technical Papers, 2008, vol. 39, pp. 1277-1280.

(56) References Cited

OTHER PUBLICATIONS

Ikeda, T et al., "Full-Functional System Liquid Crystal Display Using Cg-Silicon Technology," SID Digest '04 : SID International Symposium Digest of Technical Papers, 2004, vol. 35, pp. 860-863.

Janotti, A et al., "Native Point Defects in ZnO," Phys. Rev. B (Physical Review. B), 2007, vol. 76, No. 16, pp. 165202-1-165202-22.

Janotti, A et al., "Oxygen Vacancies in ZnO," Appl. Phys. Lett. (Applied Physics Letters), 2005, vol. 87, pp. 122102-1-122102-3.

Jeong, J et al., "3.1: Distinguished Paper: 12.1-Inch WXGA AMOLED Display Driven by Indium—Gallium—Zinc Oxide TFTs Array," SID Digest '08 : SID International Symposium Digest of Technical Papers, May 20, 2008, vol. 39, No. 1, pp. 1-4.

Jin, D et al., "65.2: Distinguished Paper:World-Largest (6.5") Flexible Full Color Top Emission AMOLED Display on Plastic Film and Its Bending Properties," SID Digest '09 : SID International Symposium Digest of Technical Papers, May 31, 2009, pp. 983-985.

Kanno, H et al., "White Stacked Electrophosphoreent Organic Light-Emitting Devices Employing MOO3 as a Charge-Generation Layer," Adv. Mater. (Advanced Materials), 2006, vol. 18, No. 3, pp. 339-342.

Kikuchi, H et al., "39.1: Invited Paper: Optically Isotropic Nano-Structured Liquid Crystal Composites for Display Applications," SID Digest '09 : SID International Symposium Digest of Technical Papers, May 31, 2009, pp. 578-581.

Kikuchi, H et al., "62.2: Invited Paper: Fast Electro-Optical Switching in Polymer-Stabilized Liquid Crystalline Blue Phases for Display Application," SID Digest '07 : SID International Symposium Digest of Technical Papers, 2007, vol. 38, pp. 1737-1740.

Kikuchi, H et al., "Polymer-Stabilized Liquid Crystal Blue Phases," Nature Materials, Sep. 1, 2002, vol. 1, pp. 64-68.

Kim, S et al., "High-Performance oxide thin film transistors passivated by various gas plasmas," The Electrochemical Society, 214th ECS Meeting, 2008, No. 2317, 1 page.

Kimizuka, N et al., "Spinel,YBFe2O4, and YB2Fe3O7 Types of Structures for Compounds in the In2O3 and SC2O3—A2O3—BO Systems [A; Fe, Ga, or Al; B: Mg, Mn, Fe, Ni, Cu,or Zn] at Temperatures Over 1000° C.," Journal of Solid State Chemistry, 1985, vol. 60, pp. 382-384.

Kimizuka, N. et al., "Syntheses and Single-Crystal Data of Homologous Compounds, In2O3(ZnO)m (m=3, 4, and 5), InGaO3(ZnO)3, and Ga2O3(ZnO)m (m=7, 8, 9, and 16) in the In2O3—ZnGa2O4—ZnO System," Journal of Solid State Chemistry, Apr. 1, 1995, vol. 116, No. 1, pp. 170-178.

Kitzerow, H et al., "Observation of Blue Phases in Chiral Networks," Liquid Crystals, 1993, vol. 14, No. 3, pp. 911-916.

Kurokawa, Y et al., "UHF RFCPUS on Flexible and Glass Substrates for Secure RFID Systems," Journal of Solid-State Circuits , 2008, vol. 43, No. 1, pp. 292-299.

Lany, S et al., "Dopability, Intrinsic Conductivity, and Nonstoichiometry of Transparent Conducting Oxides," Phys. Rev. Lett. (Physical Review Letters), Jan. 26, 2007, vol. 98, pp. 045501-1-045501-4.

Lee, H et al., "Current Status of, Challenges to, and Perspective View of AM-OLED," IDW '06 : Proceedings of the 13th International Display Workshops, Dec. 7, 2006, pp. 663-666.

Lee, J et al., "World's Largest (15-Inch) XGA AMLCD Panel Using IGZO Oxide TFT," SID Digest '08 : SID International Symposium Digest of Technical Papers, May 20, 2008, vol. 39, pp. 625-628.

Lee, M et al., "15.4: Excellent Performance of Indium—Oxide-Based Thin-Film Transistors by DC Sputtering," SID Digest '09 : SID International Symposium Digest of Technical Papers, May 31, 2009, pp. 191-193.

Li, C et al., "Modulated Structures of Homologous Compounds InMO3(ZnO)m (M=In,Ga; m=Integer) Described by Four-Dimensional Superspace Group," Journal of Solid State Chemistry, 1998, vol. 139, pp. 347-355.

Masuda, S et al., "Transparent thin film transistors using ZnO as an active channel layer and their electrical properties," J. Appl. Phys. (Journal of Applied Physics), Feb. 1, 2003, vol. 93, No. 3, pp. 1624-1630.

Meiboom, S et al., "Theory of the Blue Phase of Cholesteric Liquid Crystals," Phys. Rev. Lett. (Physical Review Letters), May 4, 1981, vol. 46, No. 18, pp. 1216-1219.

Miyasaka, M, "SUFTLA Flexible Microelectronics on Their Way to Business," SID Digest '07 : SID International Symposium Digest of Technical Papers, 2007, vol. 38, pp. 1673-1676.

Mo, Y et al., "Amorphous Oxide TFT Backplanes for Large Size AMOLED Displays," IDW '08 : Proceedings of the 6th International Display Workshops, Dec. 3, 2008, pp. 581-584.

Nakamura, "Synthesis of Homologous Compound with New Long-Period Structure," NIRIM Newsletter, Mar. 1995, vol. 150, pp. 1-4 with English translation.

Nakamura, M et al., "The phase relations in the In2O3—Ga2ZnO4—ZnO system at 1350° C.," Journal of Solid State Chemistry, Aug. 1, 1991, vol. 93, No. 2, pp. 298-315.

Nomura, K et al., "Thin-Film Transistor Fabricated in Single-Crystalline Transparent Oxide Semiconductor," Science, May 23, 2003, vol. 300, No. 5623, pp. 1269-1272.

Nomura, K et al., "Amorphous Oxide Semiconductors for High-Performance Flexible Thin-Film Transistors," Jpn. J. Appl. Phys. (Japanese Journal of Applied Physics) , 2006, vol. 45, No. 5B, pp. 4303-4308.

Nomura, K et al., "Room-Temperature Fabrication of Transparent Flexible Thin-Film Transistors Using Amorphous Oxide Semiconductors," Nature, Nov. 25, 2004, vol. 432, pp. 488-492.

Nomura, K et al., "Carrier transport in transparent oxide semiconductor with intrinsic structural randomness probed using single-crystalline InGaO3(ZnO)5 films," Appl. Phys. Lett. (Applied Physics Letters) , Sep. 13, 2004, vol. 85, No. 11, pp. 1993-1995.

Nowatari, H et al., "60.2: Intermediate Connector With Suppressed Voltage Loss for White Tandem OLEDS," SID Digest '09 : SID International Symposium Digest of Technical Papers, May 31, 2009, vol. 40, pp. 899-902.

Oba, F et al., "Defect energetics in ZnO: A hybrid Hartree-Fock density functional study," Phys. Rev. B (Physical Review. B), 2008, vol. 77, pp. 245202-1-245202-6.

Oh, M et al., "Improving the Gate Stability of ZnO Thin-Film Transistors With Aluminum Oxide Dielectric Layers," J. Electrochem. Soc. (Journal of the Electrochemical Society), 2008, vol. 155, No. 12, pp. H1009-H1014.

Ohara, H et al., "21.3: 4.0 In. QVGA AMOLED Display Using In—Ga—Zn—Oxide TFTs With a Novel Passivation Layer," SID Digest '09 : SID International Symposium Digest of Technical Papers, May 31, 2009, pp. 284-287.

Kamiya.T et al., "Carrier transport properties and electronic structures of amorphous oxide semiconductors: the present status", Solid State Physics, Sep. 1, 2009, vol. 44, No. 9, pp. 921-633, Agne Gijitsu Center.

Jeon.S et al., "180nm Gate Length Amorphous InGaZnO Thin Film Transistor for High Density Image Sensor Applications", IEDM 10: Technical Digest of International Electron Devices Meeting, Dec. 6, 2010, pp. 504-507.

\* cited by examiner

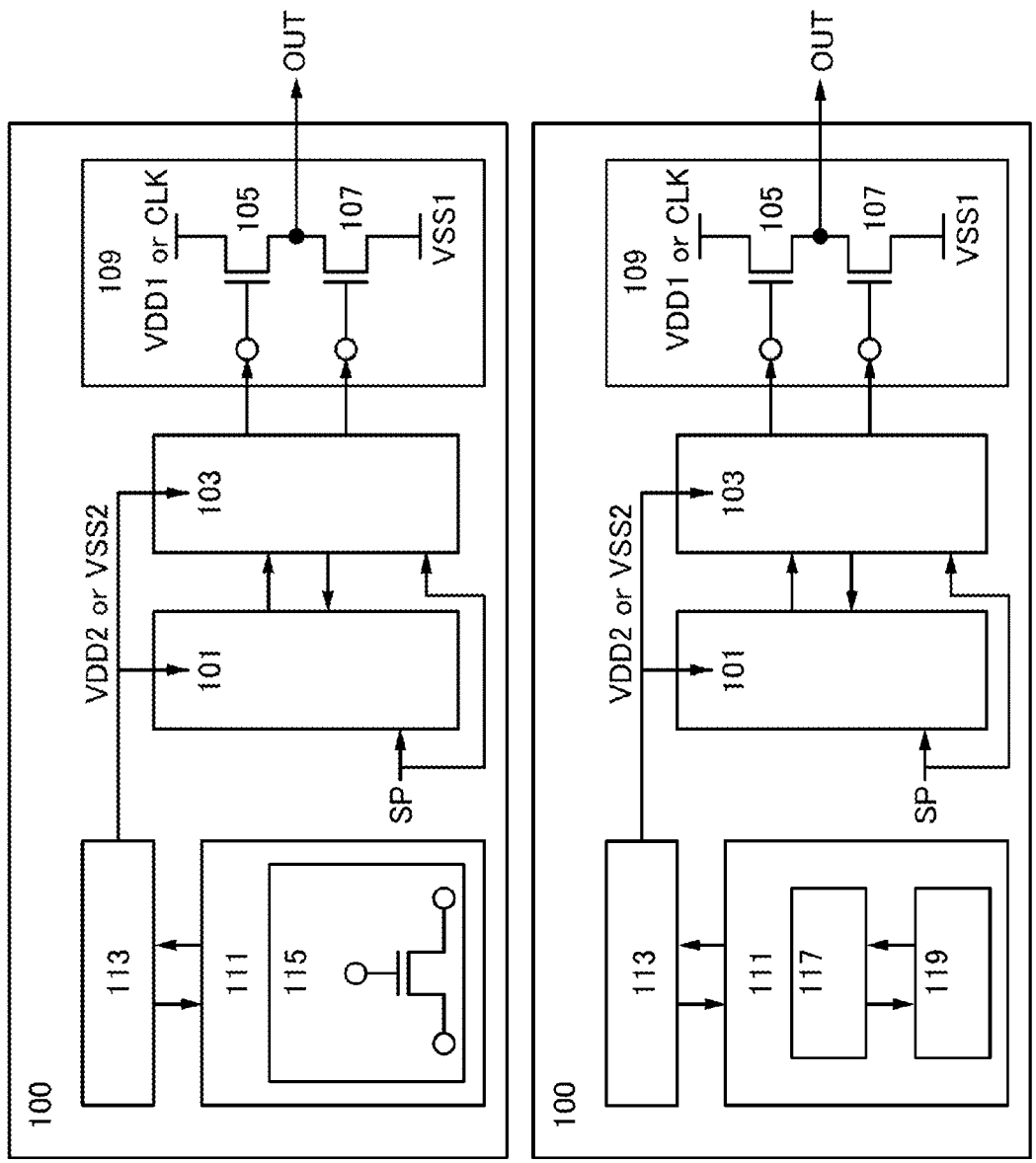

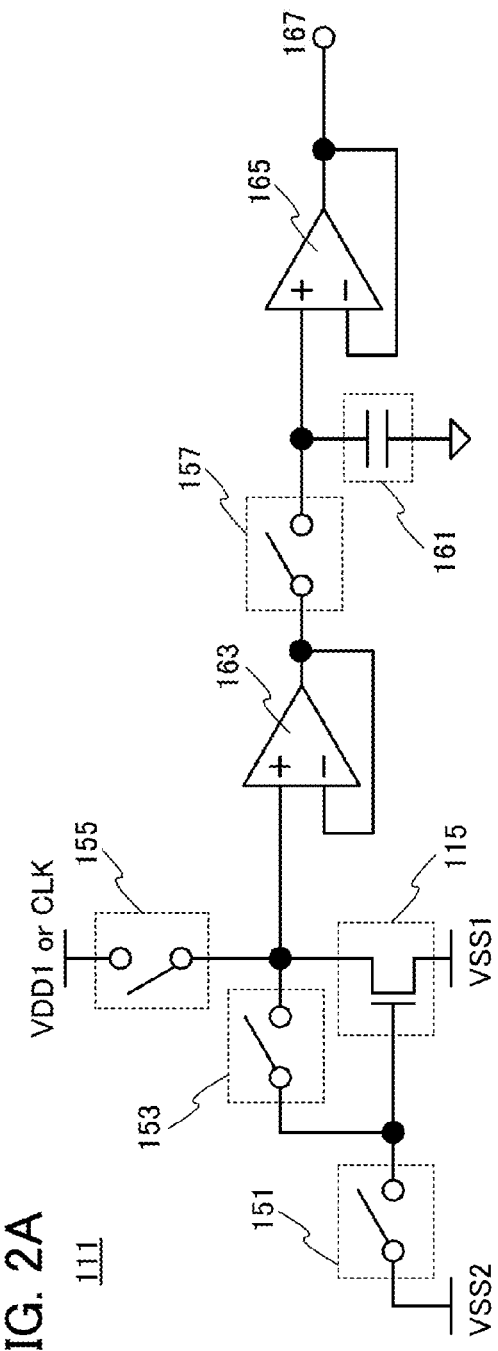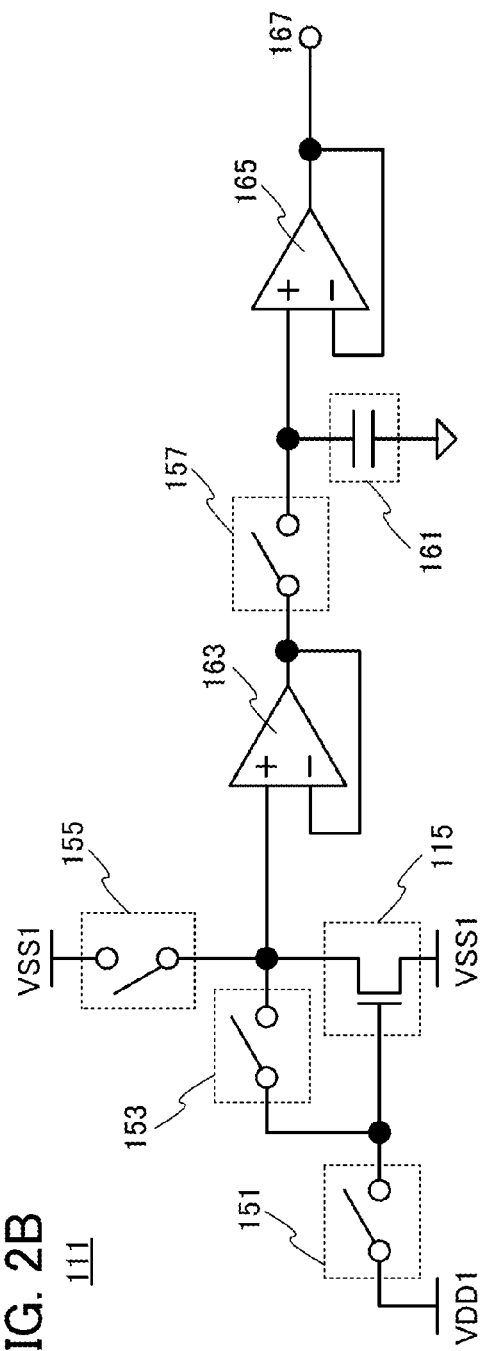

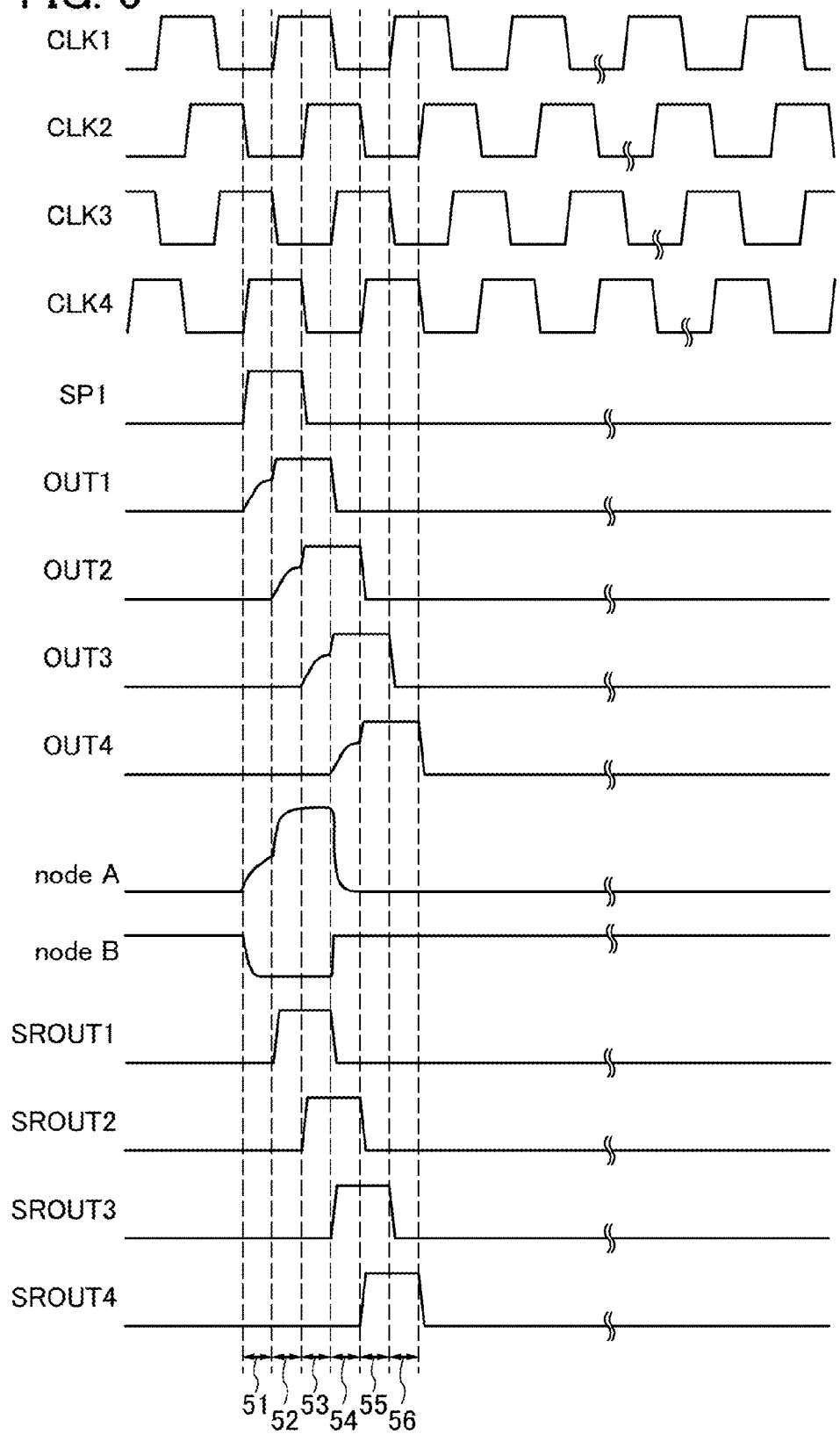

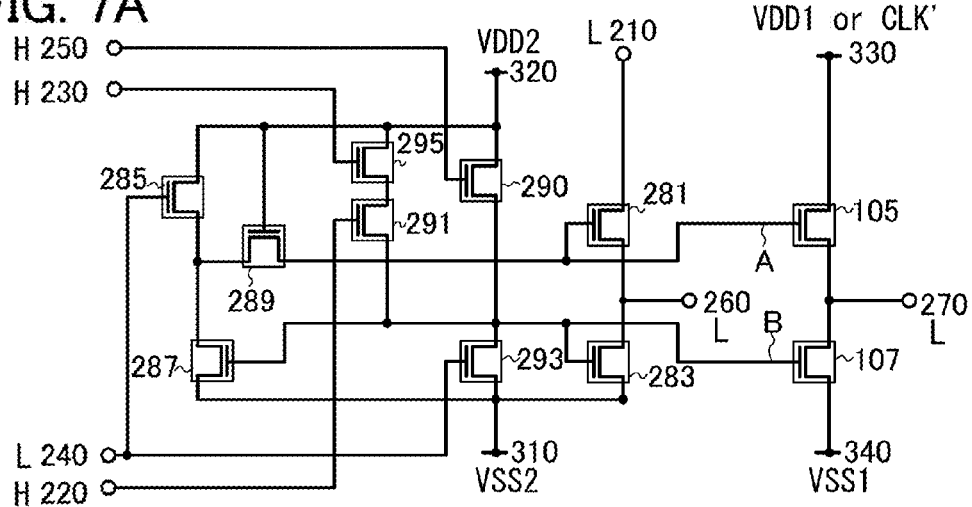
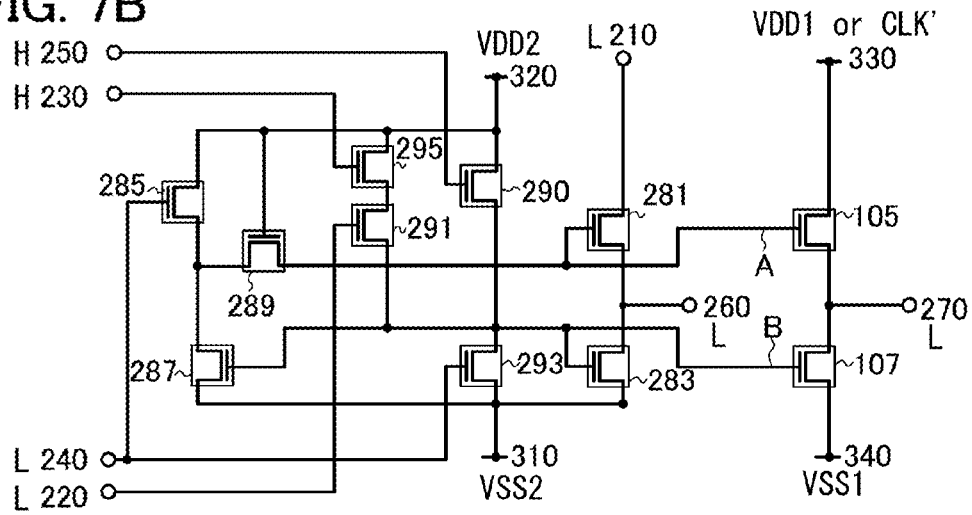
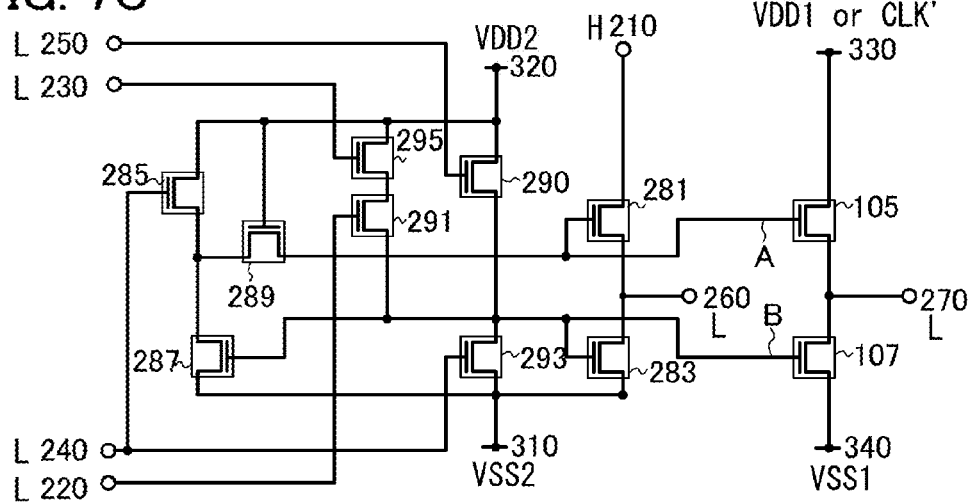

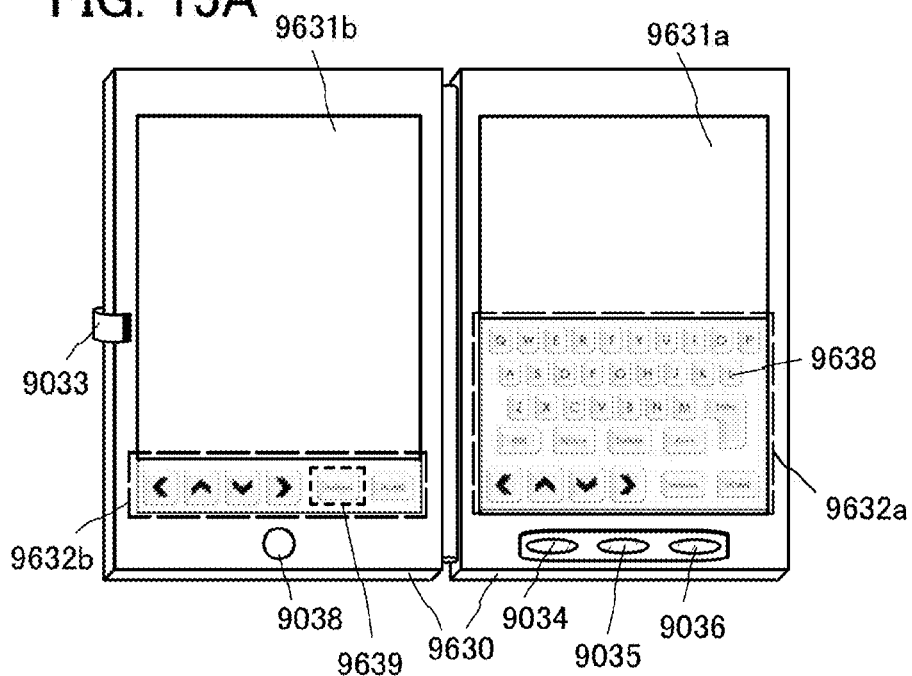
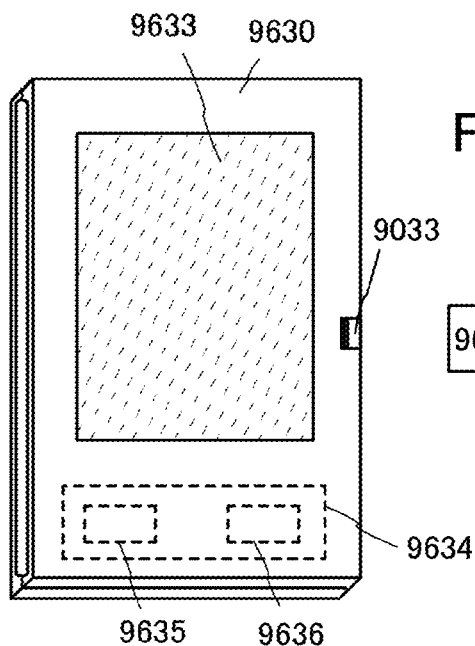
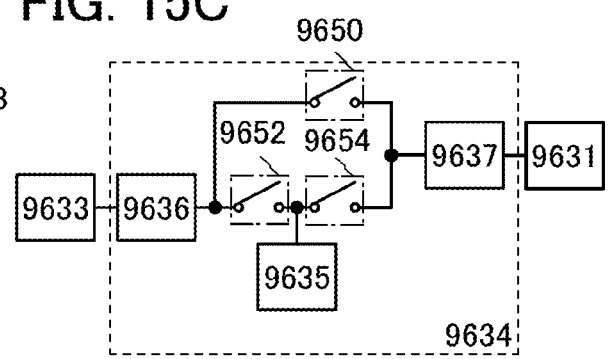

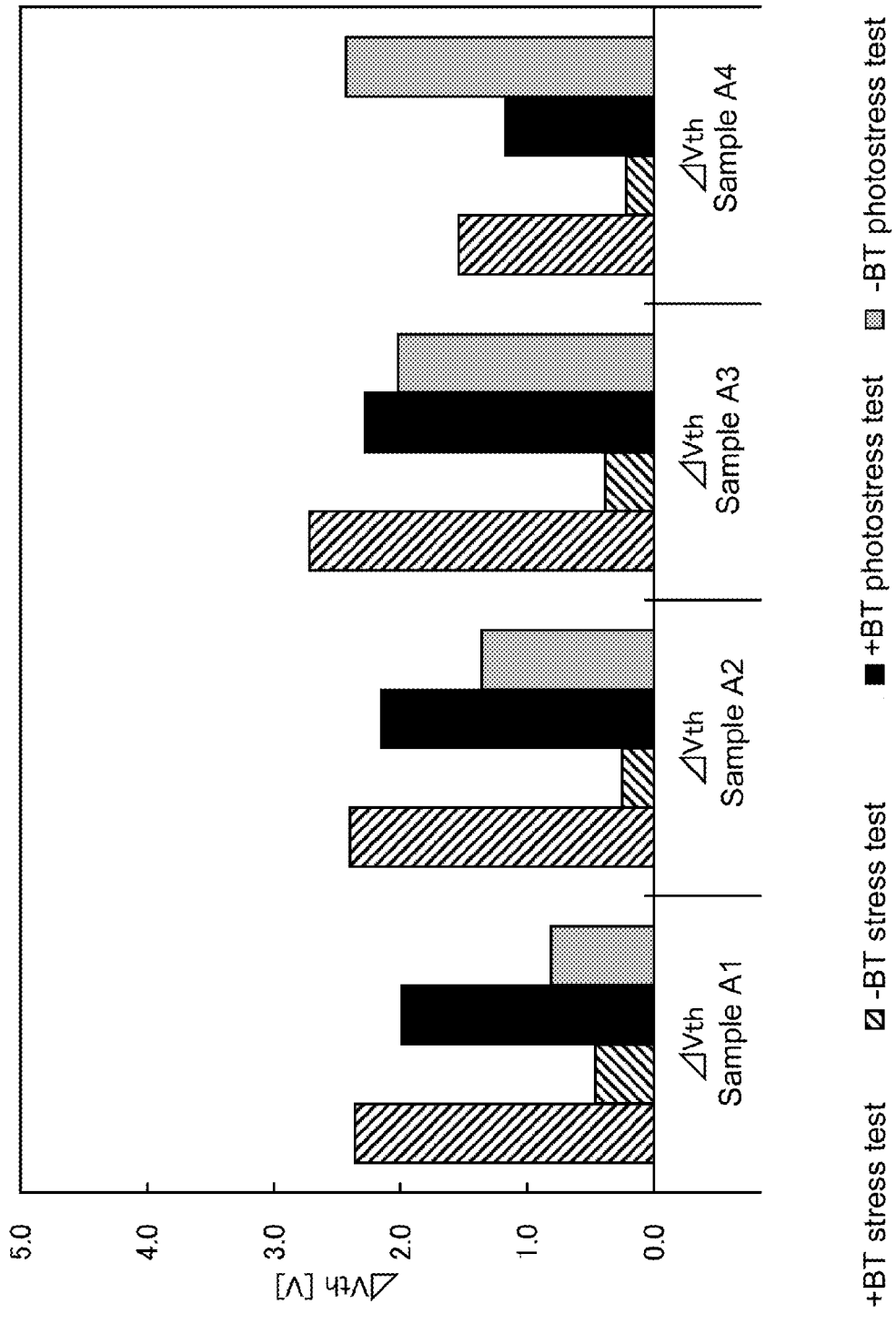

PULSE SIGNAL OUTPUT CIRCUIT AND SHIFT REGISTER

BACKGROUND OF THE INVENTION

1. Field of the Invention

One embodiment of the present invention relates to pulse signal output circuits and shift registers.

2. Description of the Related Art

Transistors which are used for most flat panel displays typified by liquid crystal display devices and light-emitting display devices include silicon semiconductors such as amorphous silicon, single crystal silicon, and polycrystalline silicon in many cases.

Although transistors including amorphous silicon have low field effect mobility, they can be formed over larger glass substrates. In contrast, although transistors including polycrystalline silicon have high field effect mobility, they need a crystallization process such as laser annealing and cannot be always formed over larger glass substrates.

In recent years, attention has been drawn to a technique in which, instead of a silicon semiconductor, a metal oxide exhibiting semiconductor characteristics is used for transistors. Note that in this specification, a metal oxide exhibiting semiconductor characteristics is referred to as an oxide semiconductor. For example, Patent Documents 1 and 2 disclose a technique by which a transistor is formed using zinc oxide or an In—Ga—Zn—O-based oxide semiconductor as a semiconductor material and is used as a switching element of an image display device.

Further, such transistors including oxide semiconductors can be used as switching elements included in pixel portions and driver circuits of display devices such as liquid crystal displays, electroluminescent displays, and electronic paper. For example, Patent Document 3 discloses a technique in which a driver circuit is formed using a shift register and the like including a pulse signal output circuit, and a transistor including the above oxide semiconductor is used as a transistor in the pulse signal output circuit.

Transistors including oxide semiconductors in channel regions can have higher field effect mobility than transistors including amorphous silicon. Further, oxide semiconductor films can be formed at a temperature of 300° C. or lower by sputtering or the like, and a manufacturing process of the transistors including oxide semiconductor films is simpler than that of the transistors including polycrystalline silicon.

REFERENCE

Patent Document

[Patent Document 1] Japanese Published Patent Application No. 2007-123861
[Patent Document 2] Japanese Published Patent Application No. 2007-096055
[Patent Document 3] Japanese Published Patent Application No. 2011-205627

SUMMARY OF THE INVENTION

In the case where the shift register included in the driver circuit includes transistors having the same polarity, the shift register might have a problem of unstable operation, for example.

FIG. 22 illustrates a circuit configuration example of a conventional pulse signal output circuit included in a shift register included in a scan line driver circuit.

The conventional pulse signal output circuit includes an input terminal 93, a first output terminal 95, a set-reset (SR) circuit 90, a transistor 91, and a transistor 92. The input terminal 93 and the first output terminal 95 are electrically connected to the SR circuit 90. A first terminal of the transistor 91, a first terminal of the transistor 92, and a second output terminal 97 are electrically connected to one another. A high-potential-side power supply potential (VDD) and a low-potential-side power supply potential (VSS) are supplied to the SR circuit 90. The VDD or a clock signal (CLK) is supplied to a second terminal of the transistor 91. The VSS is supplied to a second terminal of the transistor 92. A start pulse (SP) signal or an output signal from the previous stage is input to the input terminal 93. The first output terminal 95 outputs an output signal (OUT1) from the SR circuit 90. The second output terminal 97 outputs an output signal (OUT2) which is input to a scan line.

The scan line driver circuit has a heavy load of the scan line; thus, in many cases, the transistors 91 and 92 have larger channel widths than a transistor included in the SR circuit 90.

Continuous driving of transistors leads to a change in threshold voltages of the transistors in some cases. For example, in the case of a transistor in which the threshold voltage is shifted in the positive direction, current supply capability of the transistor is reduced due to change over time. In the pulse signal output circuit illustrated in FIG. 22, the threshold voltage of the transistor 91 tends to be shifted in the negative direction, and the threshold voltage of the transistor 92 tends to be shifted in the positive direction. In consideration of reduction in current supply capability due to change over time, a channel width of the transistor 92 in which the threshold voltage tends to be shifted in the positive direction is formed to be wide in advance or a power supply voltage applied to the transistor 92 in advance is increased in many cases.

However, since the channel widths of the transistors 91 and 92 are already large, it is not preferable to further increase the channel widths in consideration of change over time and to increase the sizes of the transistors because these increases lead to an increase in power consumption. Further, to increase the channel widths and to increase the sizes of the transistors also lead to poor frequency characteristics. Further, the size of the driver circuit is increased; thus, a frame of a display device or the like is increased, which is a problem.

Further, also in the case where the power supply voltage applied to the transistor 92 is set to high in advance, power consumption is more likely to be increased. An increase in the level of the power supply voltage supplied to the transistor 92 leads to a serious stress to the transistor 92, which accelerates change over time of the transistor 92. Moreover, noise increases in the pulse signal output circuit.

One object of one embodiment of the present invention is to provide a pulse signal output circuit with lower power consumption. Another object of one embodiment of the present invention is to provide a pulse signal output circuit whose characteristics are not easily changed over time and which has a longer lifetime. Another object of one embodiment of the present invention is to achieve at least one of the above-described objects.

One embodiment of the present invention is a pulse signal output circuit including a first input signal generation circuit; a second input signal generation circuit; an output circuit including a first transistor in which the threshold voltage is shifted in the positive direction and a second transistor in which the threshold voltage is shifted in the positive direction; a reference circuit which obtains the threshold voltages of the first and second transistors; and a power supply output circuit which generates a power supply potential raised by a potential higher than or equal to a potential which is equal to or substantially equal to the threshold voltage and supplies the power supply potential to the first and second input signal generation circuits. The output circuit outputs a pulse signal in response to a signal output from the first and second input signal generation circuits. When the power supply potential raised by a potential higher than or equal to a potential which is equal to or substantially equal to the threshold voltage is supplied, a potential to be added is preferably determined as appropriate in consideration of the power consumption.

The reference circuit includes a third transistor and a fourth transistor.

The reference circuit includes a counter detecting the driving time of each of the first and second transistors and a memory storing at least reference data for obtaining the threshold voltages of the first and second transistors which depend on the driving time. Further, the counter may detect the accumulation of driving time (accumulation driving time) of the first and second transistors.

The first and second transistors have the same polarity and have the threshold voltages changed due to a bias-temperature stress test.

More specifically, the pulse signal output circuit of one embodiment of the present invention can have the following configuration.

One embodiment of the present invention is a pulse signal output circuit which includes a first transistor, a second transistor, a third transistor, a fourth transistor, a first input signal generation circuit, a second input signal generation circuit, and a reference circuit. A first terminal of the first transistor and a first terminal of the second transistor are electrically connected to each other and function as a first output terminal. A first terminal of the third transistor and a first terminal of the fourth transistor are electrically connected to each other and function as a second output terminal. A gate terminal of the first transistor, a gate terminal of the third transistor, and an output terminal of the first input signal generation circuit are electrically connected to one another. A gate terminal of the second transistor, a gate terminal of the fourth transistor, and an output terminal of the second input signal generation circuit are electrically connected to one another. A first clock signal is input to a second terminal of the first transistor. A second low-potential-side power supply potential is supplied to a second terminal of the second transistor. A first high-potential-side power supply potential is supplied to a second terminal of the third transistor. A first low-potential-side power supply potential is supplied to a second terminal of the fourth transistor. At least a first pulse signal is input to the first input signal generation circuit. At least a second clock signal is input to the second input signal generation circuit. A second high-potential-side power supply potential raised by a potential higher than or equal to a potential which is equal to or substantially equal to the threshold voltage of the third transistor and which is obtained by the reference circuit and the second low-potential-side power supply potential raised by a potential higher than or equal to a potential which is equal to or substantially equal to the threshold voltage of the fourth transistor and which is obtained by the reference circuit are input to the first input signal generation circuit and the second input signal generation circuit. A second pulse signal is output from the first output terminal or the second output terminal.

In the above pulse signal output circuit, a load connected to the second output terminal can be larger than a load connected to the first output terminal.

In the above pulse signal output circuit, an output signal of the second input signal generation circuit is input to the first input signal generation circuit in addition to the first pulse signal in some cases.

In the above pulse signal output circuit, the first input signal generation circuit can include a fifth transistor and a sixth transistor. A first terminal of the fifth transistor and a first terminal of the sixth transistor can be electrically connected to each other and function as the output terminal of the first input signal generation circuit. The second high-potential-side power supply potential can be supplied to a second terminal of the fifth transistor. The second low-potential-side power supply potential can be supplied to a second terminal of the sixth transistor. The first pulse signal can be input to a gate terminal of the fifth transistor. The output signal of the second input signal generation circuit can be input to a gate terminal of the sixth transistor.

Alternatively, the first input signal generation circuit can include a fifth transistor, a sixth transistor, and a seventh transistor. A first terminal of the fifth transistor, a first terminal of the sixth transistor, and a first terminal of the seventh transistor can be electrically connected to one another. A second terminal of the seventh transistor can function as the output terminal of the first input signal generation circuit. The second high-potential-side power supply potential can be supplied to a second terminal of the fifth transistor. The second low-potential-side power supply potential can be supplied to a second terminal of the sixth transistor. The first pulse signal can be input to a gate terminal of the fifth transistor. The output signal of the second input signal generation circuit can be input to a gate terminal of the sixth transistor. The second high-potential-side power supply potential can be supplied to a gate terminal of the seventh transistor.

In the above pulse signal output circuit, the first pulse signal and the third pulse signal are input to the second input signal generation circuit in addition to the second clock signal in some cases.

In the above pulse signal output circuit, the second input signal generation circuit can include an eighth transistor, a ninth transistor, and a tenth transistor. A second terminal of the eighth transistor, a second terminal of the ninth transistor, and a first terminal of the tenth transistor can be electrically connected to one another and function as the output terminal of the second input signal generation circuit. The second high-potential-side power supply potential can be supplied to a first terminal of the eighth transistor and a first terminal of the ninth transistor. The second low-potential-side power supply potential can be supplied to a second terminal of the tenth transistor. The third pulse signal can be input to a gate terminal of the eighth transistor. The second clock signal can be input to a gate terminal of the ninth transistor. The first pulse signal can be input to a gate terminal of the tenth transistor.

In the pulse signal output circuit, a third clock signal, the first pulse signal, and the third pulse signal are input to the second input signal generation circuit in addition to the second clock signal in some cases.

In the pulse signal output circuit, the second input signal generation circuit can include an eighth transistor, a ninth transistor, a tenth transistor, and an eleventh transistor. A second terminal of the eleventh transistor and a first terminal of the ninth transistor can be electrically connected to each other. A second terminal of the ninth transistor, a second terminal of the eighth transistor, and a first terminal of the tenth transistor can be electrically connected to one another and function as the output terminal of the second input signal generation circuit. The second high-potential-side power supply potential can be supplied to a first terminal of the eighth transistor and a first terminal of the eleventh transistor. The second low-potential-side power supply potential can be supplied to a second terminal of the tenth transistor. The third pulse signal can be input to a gate terminal of the eighth transistor. The second clock signal can be input to a gate terminal of the ninth transistor. The first pulse signal can be input to a gate terminal of the tenth transistor. The third clock signal can be input to a gate terminal of the eleventh transistor.

In the pulse signal output circuit, the third and fourth transistors have the same polarity and have the threshold voltages changed due to a bias-temperature stress test.

A shift register can include any of the pulse signal output circuits with the above configurations.

According to one embodiment of the present invention, a pulse signal output circuit with lower power consumption can be provided. Further, a pulse signal output circuit whose characteristics are not easily changed over time and which has a longer lifetime can be provided.

Further, with the pulse signal output circuit and the shift register of embodiments of the present invention, one of or both a display device with lower power consumption and a display device with a smaller frame can be manufactured.

BRIEF DESCRIPTION OF THE DRAWINGS

FIGS. 1A and 1B are each a block diagram of a pulse signal output circuit.

FIGS. 2A and 2B are each a circuit diagram of an example of a reference circuit.

FIG. 5 is a timing chart of the pulse signal output circuit illustrated in FIGS. 4A to 4C.

FIGS. 7A to 7C show operation of the pulse signal output circuit illustrated in FIGS. 4A to 4C.

FIGS. 15A to 15C illustrate an example of an electronic device.

FIG. 16 shows the amount of change in the threshold voltages of transistors in Example 1.

DETAILED DESCRIPTION OF THE INVENTION

Figure 3:
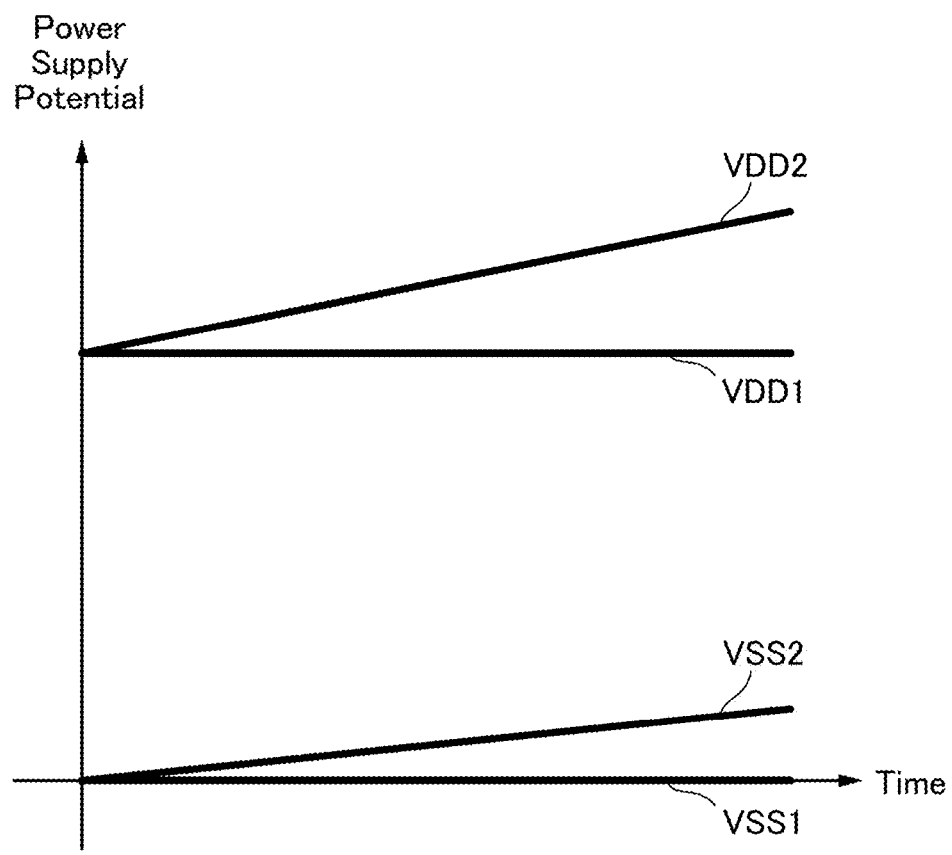
FIG. 3 shows change over time of power supply potentials.

Embodiments and examples are described in detail with reference to the accompanying drawings. Note that the invention is not limited to the following description, and it is easily understood by those skilled in the art that various changes and modifications can be made without departing from the spirit and scope of the invention. Therefore, the invention should not be construed as being limited to the description in the following embodiments and examples. Note that in the structures of the invention described below, the same portions or portions having similar functions are denoted by the same reference numerals in different drawings, and description of such portions is not repeated.

Note that in each drawing described in this specification, the size, the layer thickness, or the region of each component is exaggerated for clarity in some cases. Therefore, embodiments of the present invention are not limited to such scales.

In this specification and the like, ordinal numbers such as "first", "second", and "third" are used in order to avoid confusion among components, and the terms do not limit the components numerically.

Embodiment 1

In this embodiment, the configuration of a pulse signal output circuit of one embodiment of the present invention is described with reference to drawings.

First, configuration examples of pulse signal output circuits of embodiments of the present invention are described. FIGS. 1A and 1B are each a block diagram of a pulse signal output circuit 100. The pulse signal output circuit 100 includes a first input signal generation circuit 101, a second input signal generation circuit 103, an output circuit 109 including at least a transistor 105 and a transistor 107, a reference circuit 111, and a power supply output circuit 113.

In the pulse signal output circuit 100 in FIG. 1A, the reference circuit 111 includes a reference transistor 115 which obtains the threshold voltages of the transistors 105 and 107. In the pulse signal output circuit 100 in FIG. 1B, the reference circuit 111 includes a counter 117 detecting the driving time of each of the transistors 105 and 107 and a memory 119 storing reference data for obtaining the threshold voltages of the transistors 105 and 107 which depend on the driving time.

A start pulse (SP) signal, a clock signal, and the like are input to the first input signal generation circuit 101 and the second input signal generation circuit 103. The first input signal generation circuit 101 and the second input signal generation circuit 103 supply output signals generated based on the start pulse signal, the clock signal, and the like to the output circuit 109. The clock signal in this specification is a signal which alternates between an H-level signal (high potential) and an L-level signal (low potential) at regular intervals.

The output circuit 109 includes the transistors 105 and 107 in each of which the threshold voltage is shifted in the positive direction and which have the same polarity. The transistor 105 is connected to the transistor 107 in series. The first high-potential-side power supply potential or the clock signal is supplied to the transistor 105. The first low-potential-side power supply potential is supplied to the transistor 107. An output signal output from the second input signal generation circuit 103 is supplied to gate terminals of the transistors 105 and 107. The output circuit 109 generates a pulse signal based on the output signals and output the pulse signal (OUT). As the first high-potential-side power supply potential and the first low-potential-side power supply potential, constant potentials are always supplied. A transistor which can be used as the transistors 105 and 107 in each of which the threshold voltage is shifted in the positive direction and which have the same polarity is described in later embodiments.

The reference circuit 111 has a function of obtaining the threshold voltages of the transistors 105 and 107 of output circuit 109 which are changed over time. In order to obtain the threshold voltages, as illustrated in FIG. 1A, the reference transistor 115 which has a threshold voltage which is changed in a manner similar to the threshold voltages of the transistors 105 and 107 is provided, and the threshold voltage of the reference transistor 115 is regarded as the threshold voltages of the transistors 105 and 107. To be exact, the change in threshold voltage of the transistor 105 is not the same as that of the transistor 107; thus, two reference transistors 115 are preferably provided, that is, one of the reference transistors 115 is for the transistor 105 and the other is for the transistor 107. Transistors manufactured through the same process as the transistors 105 and 107 can be used as the reference transistors 115.

The reference circuit 111 includes the counter 117 detecting the driving time of each of the transistors 105 and 107 of the output circuit 109 and the memory 119 storing at least reference data for obtaining the threshold voltages of the transistors 105 and 107 which depend on the driving time. The reference circuit 111 can obtain the threshold voltages of the transistors 105 and 107 which are changed over time from the reference data (see FIG. 1B). In this manner, the threshold voltages of the transistors 105 and 107 which are changed over time can be obtained without the reference transistor 115.

The power supply output circuit 113 has a function of controlling the reference circuit 111, generating power supply potentials which are raised by potentials higher than or equal to potentials which are equal to or substantially equal to the threshold voltages of the transistors 105 and 107 (power supply potentials to which potentials equal to or substantially equal to the threshold voltages of the transistors 105 and 107 are added), and supplying the power supply potentials to the first input signal generation circuit 101 and the second input signal generation circuit 103.

As described above, the second high-potential-side power supply potential and the second low-potential-side power supply potential which are supplied to the first input signal generation circuit 101 and the second input signal generation circuit 103 are changed over time. Further, since the threshold voltages of the transistors 105 and 107 are shifted in the positive direction over time, the second high-potential-side power supply potential and the second low-potential-side power supply potential are increased over time.

For example, in the case where the second high-potential-side power supply potential and the second low-potential-side power supply potential are constant and, in particular, are the same as the first high-potential-side power supply potential and the first low-potential-side power supply potential, respectively, current supply capability of the transistors 105 and 107 is reduced because the threshold voltages of the transistors 105 and 107 are shifted in the positive direction over time. Thus, the channel widths of the transistors 105 and 107 need to be made large in advance or power supply voltages supplied to the transistors 105 and 107 need to be increased in advance; however, these cause the above described problems and thus are not effective. In contrast, since the pulse signal output circuit 100 includes the reference circuit 111 and the power supply output circuit 113, power supply potentials needed for making up the decrease in the current supply capability of the transistors 105 and 107 can be appropriately supplied as needed. Thus, the pulse signal output circuit 100 has lower power consumption, is not easily changed over time, and has a longer lifetime. Further, the pulse signal output circuit 100 operates stably.

The structures, methods, and the like described in this embodiment can be used as appropriate in combination with any of the structures, methods, and the like described in the other embodiments and examples.

Embodiment 2

In this embodiment, the configuration of a reference circuit included in a pulse signal output circuit of one embodiment of the present invention is described with reference to drawings. The pulse signal output circuit 100 is used as an example also in this embodiment.

Configuration examples which can be used for the reference circuit 111 included in the pulse signal output circuit 100 are illustrated in FIGS. 2A and 2B. The reference circuits 111 illustrated in FIGS. 2A and 2B each include the reference transistor 115, a switch 151, a switch 153, a switch 155, a switch 157, a capacitor 161, a voltage follower 163, and a voltage follower 165. Note that the voltage follower 163 and the voltage follower 165 are not necessarily provided.

The reference circuit 111 illustrated in FIG. 2A is for obtaining the threshold voltage of the transistor 105 of the output circuit 109. The reference circuit 111 illustrated in FIG. 2B is for obtaining the threshold voltage of the transistor 107 of the output circuit 109. The kind of power supply potential supplied to the switch 151 and the kind of power supply potential supplied to the switch 155 in the reference circuit 111 illustrated in FIG. 2A are different from those in the reference circuit 111 illustrated in FIG. 2B.

The connection relation in the reference circuit 111 illustrated in FIG. 2A is described below. The second low-potential-side power supply potential (also referred to as VSS2) is supplied to one terminal of the switch 151. The other terminal of the switch 151, one terminal of the switch 153, and a gate terminal of the reference transistor 115 are electrically connected to one another. The other terminal of the switch 153, a first terminal (in this specification, "first terminal" means one of a source terminal and a drain terminal) of the reference transistor 115, and one terminal of the switch 155 are electrically connected to a positive input terminal of the voltage follower 163. The first high-potential-side power supply potential (also referred to as VDD1) or the clock signal which is the same as that supplied to the transistor 105 is supplied to the other terminal of the switch 155. The first low-potential-side power supply potential (also referred to as VSS1) is supplied to a second terminal (in this specification, "second terminal" means the other of the source terminal and the drain terminal) of the reference transistor 115. An output terminal of the voltage follower 163 is electrically connected to a negative input terminal of the voltage follower 163 and one terminal of the switch 157. The other terminal of the switch 157 and one electrode of the capacitor 161 are electrically connected to a positive input terminal of the voltage follower 165. A fixed potential (e.g., a ground potential) is supplied to the other electrode of the capacitor 161. An output terminal of the voltage follower 165 is electrically connected to a negative input terminal of the voltage follower 165 and an output terminal 167.

The connection relation in the reference circuit 111 illustrated in FIG. 2B is described below. The first high-potentialside power supply potential is supplied to the one terminal of the switch 151. The first low-potential-side power supply potential is supplied to the other terminal of the switch 155. The other connection relation in the reference circuit 111 in FIG. 2B is the same as that in the reference circuit 111 in FIG. 2A.

Although not illustrated in FIGS. 2A and 2B, the output terminal 167 is electrically connected to the power supply output circuit 113. The power supply output circuit 113 has a function of controlling the reference circuit 111 in FIGS. 2A and 2B.

By providing the voltage follower 163 and the voltage follower 165, a potential drop due to the switches 151, 153, 155, and 157, the capacitor 161, and the like can be suppressed. Thus, the reference circuit 111 illustrated in FIG. 2A or 2B can output the threshold voltage of the reference transistor 115 accurately. That is, the reference circuit 111 can output the threshold voltage to the power supply output circuit 113 stably.

For the switches 151, 153, 155, and 157, a switching element including a semiconductor (e.g., a transistor) can be used.

Even when the switch 157 is turned off, the threshold voltage of the reference transistor 115 is held by the capacitor 161; thus, an appropriate potential can be generated, and the threshold voltage of the reference transistor 115 can be output to the output terminal 167 and the power supply output circuit 113.

In order to obtain the threshold voltages of the transistors 105 and 107 which are changed over time, two reference circuits 111 illustrated in FIGS. 2A and 2B may be provided, so that one of the two reference circuits 111 can obtain the threshold voltage of the transistor 105 and the other can obtain the threshold voltage of the transistor 107. When two reference transistors 115 are provided, that is, one of the two reference transistors 115 is used for the transistor 105 and the other is used for the transistor 107, a circuit configuration in which the threshold voltages of the transistors 105 and 107 can be obtained by one circuit can be achieved.

The operation method of the reference circuit 111 included in the pulse signal output circuit 100 is described here.

Table 1 shows operation timing of the switches 151, 153, 155, and 157 in the case of obtaining the threshold voltage of the transistor 105 of the output circuit 109 using the reference circuit 111 illustrated in FIG. 2A.

TABLE 1

|  | First Period | Second Period | Third Period | Fourth Period |
| --- | --- | --- | --- | --- |
| Switch 151 | ON | OFF | OFF | OFF |
| Switch 153 | OFF | ON | ON | ON |
| Switch 155 | ON | ON | OFF | OFF |
| Switch 157 | OFF | OFF | OFF | ON |

The threshold voltage of the reference transistor 115 can be obtained with four periods, which are a first period, a second period, a third period, and a fourth period; accordingly, the threshold voltage of the transistor 105 can be obtained.

The first period is a period before and after the threshold voltage of the reference transistor 115 is obtained. In the first period, the switch 151 is on, the switch 153 is off, the switch 155 is on, and the switch 157 is off. Under the condition, the operation environment of the reference transistor 115 is the same as that of the transistor 105. Further, since a change in the threshold voltage occurs in the reference transistor 115 in FIG. 2A is similar to that in the transistor 105, the reference transistor 115 deteriorates over time similarly as in the transistor 105. Note that the first period is referred to as a normal driving period for convenience.

The second period is a period for resetting the reference transistor 115 to obtain the threshold voltage of the reference transistor 115. In the second period, the switch 151 is off, the switch 153 is on, the switch 155 is on, and the switch 157 is off. Under the condition, the reference transistor 115 is diode-connected, and the potential difference (voltage) between the first terminal and the second terminal of the reference transistor 115 is the same as that between the first high-potential-side power supply potential and the first low-potential-side power supply potential, so that the reference transistor 115 can be reset. Thus, the second period is referred to as a reset period for convenience.

The third period is a period for obtaining the threshold voltage of the reference transistor 115. In the third period, the switch 151 is off, the switch 153 is on, the switch 155 is off, and the switch 157 is off. Under the condition, the diode connection of the reference transistor 115 is canceled, and a portion between the gate terminal and the first terminal of the reference transistor 115 becomes in a floating state. A drain current flows in the direction from the first terminal of the reference transistor 115 to the second terminal of the reference transistor 115 and the potential difference (voltage) between the gate terminal of the reference transistor 115 and the second terminal of the reference transistor 115 is gradually decreased from the potential difference between the first high-potential-side power supply potential and the first low-potential-side power supply potential. When the potential difference is decreased to the threshold voltage of the reference transistor 115, the reference transistor 115 is turned off. At that time, the potential difference (voltage) between the gate terminal of the reference transistor 115 and the second terminal of the reference transistor 115 is equal to the threshold voltage of the reference transistor 115; accordingly, the threshold voltage of the reference transistor 115 can be obtained. Thus, the third period is referred to as a period for obtaining the threshold voltage for convenience.

Finally, the fourth period is a period for outputting the threshold voltage obtained in the third period to the output terminal 167 and the power supply output circuit 113. In the fourth period, the switch 151 is off, the switch 153 is on, the switch 155 is off, and the switch 157 is on. Under the condition, the threshold voltage of the reference transistor 115 which is equal to that of the transistor 105 can be output to the power supply output circuit 113. Thus, the fourth period is referred to as a period for outputting the threshold voltage for convenience.

The power supply output circuit 113 generates the second high-potential-side power supply potential (also referred to as VDD2) which is raised by a potential higher than or equal to a potential which is equal to or substantially equal to the threshold voltage of the reference transistor 115 (the transistor 105) obtained through the first to fourth periods, and supplies the second high-potential-side power supply potential to the first input signal generation circuit 101 and the second input signal generation circuit 103.

Table 2 shows operation timing of the switches 151, 153, 155, and 157 in the case of obtaining the threshold voltage of the transistor 107 of the output circuit 109 using the reference circuit 111 illustrated in FIG. 2B.

TABLE 2

|  | First Period | Second Period | Third Period | Fourth Period |
| --- | --- | --- | --- | --- |
| Switch 151 | ON | ON | OFF | OFF |
| Switch 153 | OFF | ON | ON | ON |
| Switch 155 | ON | OFF | OFF | OFF |
| Switch 157 | OFF | OFF | OFF | ON |

The first period is a normal driving period. In the first period, the switch 151 is on, the switch 153 is off, the switch 155 is on, and the switch 157 is off. Accordingly, the operation environment of the reference transistor 115 is the same as that of the transistor 107. Further, since a change in the threshold voltage occurs in the reference transistor 115 in FIG. 2B is similar to that in the transistor 107, the reference transistor 115 deteriorates over time similarly as in the transistor 107.

Next, the second period is a reset period. In the second period, the switch 151 is on, the switch 153 is on, the switch 155 is off, and the switch 157 is off. Accordingly, the reference transistor 115 is diode-connected, and the potential difference (voltage) between the first terminal and the second terminal of the reference transistor 115 is the same as that between the first high-potential-side power supply potential and the first low-potential-side power supply potential, so that the reference transistor 115 is reset.

Then, the third period is a period for obtaining the threshold voltage. In the third period, the switch 151 is off, the switch 153 is on, the switch 155 is off, and the switch 157 is off. Accordingly, the diode connection of the reference transistor 115 is canceled, and a portion between the gate terminal and the first terminal of the reference transistor 115 becomes in a floating state. A drain current flows in the direction from the first terminal of the reference transistor 115 to the second terminal of the reference transistor 115 and the potential difference (voltage) between the gate terminal of the reference transistor 115 and the second terminal of the reference transistor 115 is gradually decreased from the potential difference between the first low-potential-side power supply potential and the first low-potential-side power supply potential. When the potential difference is decreased to the threshold voltage of the reference transistor 115, the reference transistor 115 is turned off. The potential difference (voltage) between the gate terminal of the reference transistor 115 and the second terminal of the reference transistor 115 becomes the same as the threshold voltage of the reference transistor 115, and the threshold voltage of the reference transistor 115 can be obtained.

Finally, the fourth period is a period for outputting the threshold voltage. In the fourth period, the switch 151 is off, the switch 153 is on, the switch 155 is off, and the switch 157 is on. Accordingly, the threshold voltage of the reference transistor 115 which is the same as that of the transistor 107 can be output to the power supply output circuit 113.

The power supply output circuit 113 generates the second low-potential-side power supply potential raised by a potential higher than or equal to a potential which is equal to or substantially equal to the threshold voltage of the reference transistor 115 (the transistor 107) obtained through the first to fourth periods, and supplies the second low-potential-side power supply potential to the first input signal generation circuit 101 and the second input signal generation circuit 103.

As described above, since the threshold voltages of the transistors 105 and 107 are shifted in the positive direction over time, the second high-potential-side power supply potential and the second low-potential-side power supply potential which are generated by the power supply output circuit 113 are increased over time. FIG. 3 shows an example of change over time of a power supply potential supplied in the pulse signal output circuit of one embodiment of the present invention.

The reference circuit 111 in the pulse signal output circuit 100 does not include the reference transistor 115 but includes the counter 117 detecting the driving time of each of the transistors 105 and 107 of the output circuit 109 and the memory 119 storing at least reference data for obtaining the threshold voltages of the transistors 105 and 107 which depend on the driving time. The reference circuit 111 can obtain the threshold voltages of the transistors 105 and 107 which are changed over time from the reference data (see FIG. 1B).

The counter 117 has a function of counting the driving time of each of at least the transistors 105 and 107 at regular intervals (every second, for example). As a method for counting, the driving time may be counted as a digital data or an analog data. Counted data may be converted or amplified using a converter, an amplifier, or the like as appropriate.

The reference data stored in the memory 119 shows the correlation between the driving time and the threshold voltages of the transistors 105 and 107. The reference data may be data which is led from the threshold voltage or the like of the transistor which deteriorates similarly as in the transistors 105 and 107 and on which a positive bias temperature (BT) stress test or a negative BT stress test is performed. Note that in this specification, a test performed under the condition that a potential supplied to a gate electrode is higher than the potentials of a source and a drain is referred to as a positive BT stress test.

To be exact, the threshold voltage of the transistor 105 is not the same as that of the transistor 107; thus, two reference data is preferably provided in the memory 119, that is, one of the reference data is for the transistor 105 and the other is for the transistor 107.

The memory 119 preferably has a circuit configuration including a nonvolatile memory element, but may have a circuit configuration including a volatile memory element. Any nonvolatile memory element and any volatile memory element may be used for the memory 119. For example, a flash EEPROM (flash memory) or the like can be used for the nonvolatile memory element, and a register, a static random access memory (SRAM), a dynamic random access memory (DRAM), or the like can be used for the volatile memory element. Alternatively, the memory 119 may have a circuit configuration including a memory element including a transistor formed using an oxide semiconductor (OS) which can achieve an off-state current lower than that of a transistor including an amorphous silicon semiconductor.

The threshold voltages of the transistors 105 and 107 can be uniquely determined using the counter 117 and the memory 119; thus, by outputting the threshold voltage to the power supply output circuit 113, power supply potentials needed for making up the decrease in the current supply capability of the transistors 105 and 107 can be appropriately supplied as needed, as in the case of using the reference transistor 115.

As described above, by providing a reference circuit and a power supply output circuit as in the pulse signal output circuit of one embodiment of the present invention, even when the threshold voltage of a transistor included in an output circuit which outputs a pulse signal is changed over time, the pulse signal can be output stably. By providing a reference circuit and a power supply output circuit, power consumption of a pulse signal output circuit can be reduced.

Further, by providing a reference circuit and a power supply output circuit, a pulse signal output circuit whose characteristics are not easily changed over time and has a longer lifetime can be provided.

Note that the structures, methods, and the like described in this embodiment can be used as appropriate in combination with any of the structures, methods, and the like described in the other embodiments and examples.

Embodiment 3

In this embodiment, specific configuration examples of a pulse signal output circuit of one embodiment of the present invention and a shift register including the pulse signal output circuit and the operation thereof are described with reference to drawings.

<Circuit Configuration>

Configuration examples of a pulse signal output circuit and a shift register including the pulse signal output circuit of embodiments of the present invention are described with reference to drawings.

Figure 4A:
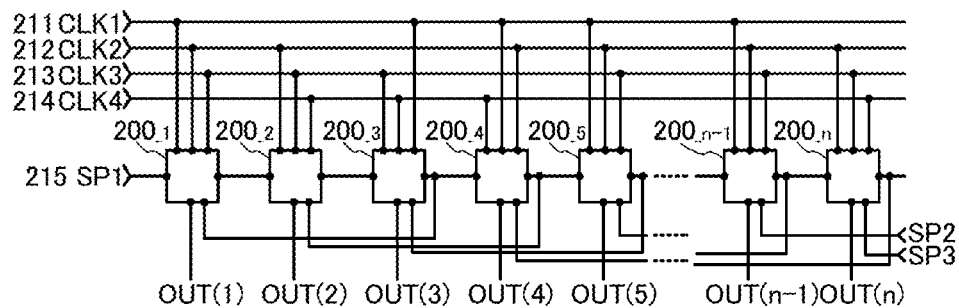
FIGS. 4A to 4C are circuit diagrams of examples of a shift register and a pulse output circuit.

A shift register described in this embodiment includes first to n-th pulse signal output circuits $200\_1$ to $200\_n$ ($n \geq 2$) and first to fourth signal lines 211 to 214 which transmit clock signals (see FIG. 4A). A first clock signal (CLK1) is supplied to the first signal line 211. A second clock signal (CLK2) is supplied to the second signal line 212. A third clock signal (CLK3) is supplied to the third signal line 213. A fourth clock signal (CLK4) is supplied to the fourth signal line 214.

In this embodiment, the first to fourth clock signals (CLK1 to CLK4) are delayed by ¼ period sequentially. The control of the pulse signal output circuit or the like is performed utilizing the clock signals.

Figure 4B:
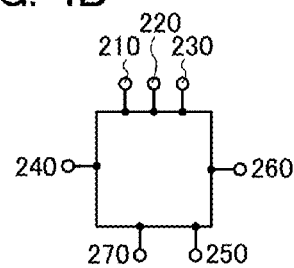

Each of the first to n-th pulse signal output circuits $200\_1$ to $200\_n$ includes a first input terminal 210, a second input terminal 220, a third input terminal 230, a fourth input terminal 240, a fifth input terminal 250, a first output terminal 260, and a second output terminal 270 (see FIG. 4B).

The first input terminal 210, the second input terminal 220, and the third input terminal 230 are electrically connected to any of the first to fourth signal lines 211 to 214. For example, the first input terminal 210 in the first pulse signal output circuit $200\_1$ is electrically connected to the first signal line 211, the second input terminal 220 in the first pulse signal output circuit $200\_1$ is electrically connected to the second signal line 212, and the third input terminal 230 in the first pulse signal output circuit $200\_1$ is electrically connected to the third signal line 213. In addition, the first input terminal 210 in the second pulse signal output circuit $200\_2$ is electrically connected to the second signal line 212, the second input terminal 220 in the second pulse signal output circuit $200\_2$ is electrically connected to the third signal line 213, and the third input terminal 230 in the second pulse signal output circuit $200\_2$ is electrically connected to the fourth signal line 214. Note that here, the case where the second signal line 212, the third signal line 213, and the fourth signal lines 214 are connected to the n-th pulse signal output circuit $200\_n$ is described. However, the signal line that is connected to the n-th pulse signal output circuit $200\_n$ is changed depending on the value of n. Thus, it is to be noted that the configuration described herein is just an example.

In the m-th pulse signal output circuit ($m \geq 2$) of the shift register described in this embodiment, the fourth input terminal 240 in the m-th pulse signal output circuit is electrically connected to the first output terminal 260 in the (m−1)-th pulse signal output circuit. The fifth input terminal 250 in the m-th pulse signal output circuit is electrically connected to the first output terminal 260 in the (m+2)-th pulse signal output circuit. The first output terminal 260 in the m-th pulse signal output circuit is electrically connected to the fourth input terminal 240 in the (m+1)-th pulse signal output circuit. The second output terminal 270 in the m-th pulse signal output circuit outputs a signal to an OUT(m).

For example, the fourth input terminal 240 in the third pulse signal output circuit $200\_3$ is electrically connected to the first output terminal 260 in the second pulse signal output circuit $200\_2$. The fifth input terminal 250 in the third pulse signal output circuit $200\_3$ is electrically connected to the first output terminal 260 in the fifth pulse signal output circuit $200\_5$. The first output terminal 260 in the third pulse signal output circuit $200\_3$ is electrically connected to the fourth input terminal 240 in the fourth pulse signal output circuit $200\_4$ and the fifth input terminal 250 in the first pulse signal output circuit $200\_1$.

In addition, a first start pulse (SP1) is input from a fifth wiring 215 to the fourth input terminal 240 in the first pulse signal output circuit $200\_1$. A pulse output from the previous stage is input to the fourth input terminal 240 in the k-th pulse signal output circuit $200\_k$ (k is a natural number greater than or equal to 2 and less than or equal to n). A second start pulse (SP2) is input to the fifth input terminal 250 in the (n−1)-th pulse signal output circuit $200\_{n-1}$. A third start pulse (SP3) is input to the fifth input terminal 250 in the n-th pulse signal output circuit $200\_n$. The second start pulse (SP2) and the third start pulse (SP3) may be input from the outside or generated inside the circuit.

Next, specific configurations of the first to n-th pulse signal output circuits $200_1$ to $200_n$ are described.

Figure 4C:
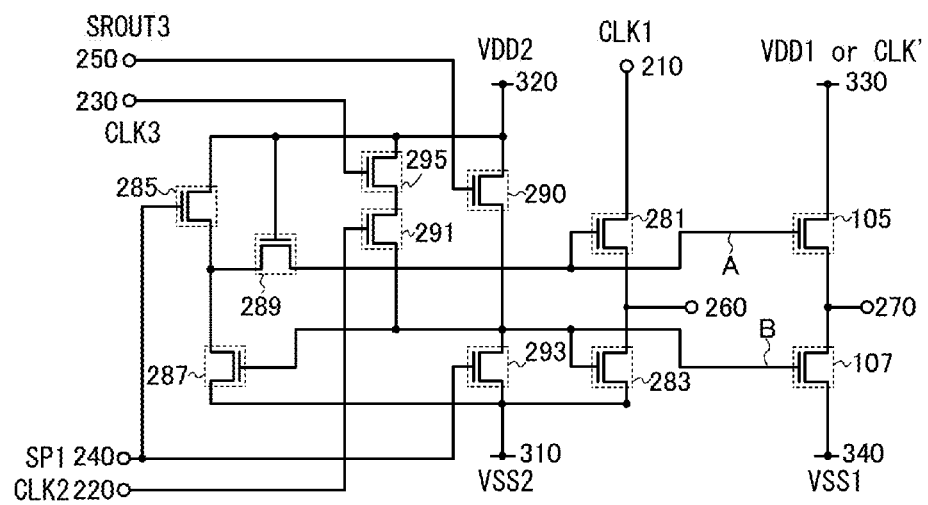
Figure 6A:
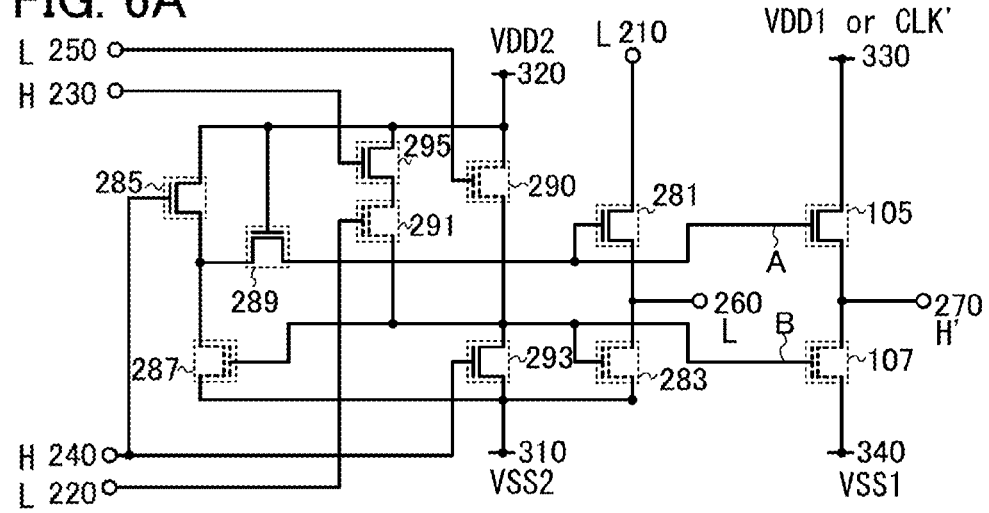
FIGS. 6A to 6C show operation of the pulse signal output circuit illustrated in FIGS. 4A to 4C.
Figure 6B:
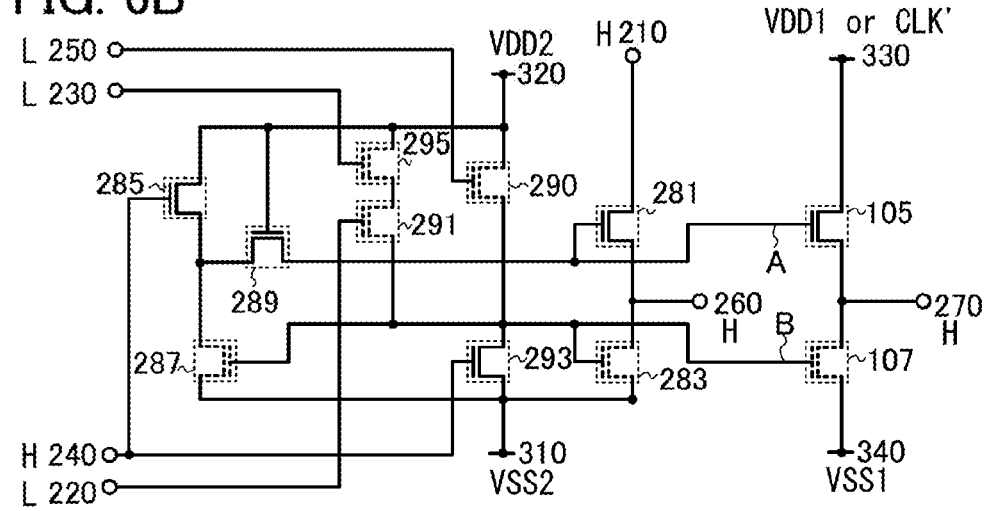
Figure 6C:
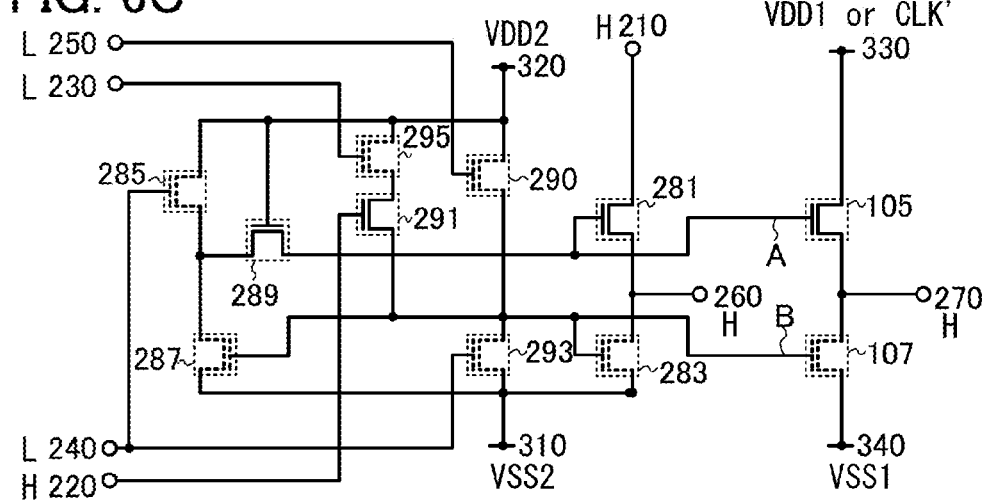

Each of the first to n-th pulse signal output circuits $200\_1$ to $200\_n$ includes an output circuit including a first transistor 281, a second transistor 283, the third transistor 105, and the fourth transistor 107; a first input signal generation circuit including a fifth transistor 285, a sixth transistor 287, and a seventh transistor 289; and a second input signal generation circuit including an eighth transistor 290, a ninth transistor 291, a tenth transistor 293, and an eleventh transistor 295 (see FIG. 4C). Further, in addition to the first input terminal 210 to the fifth input terminal 250, power supply potentials are supplied to the first transistor 281 to the eleventh transistor 295 from a first power supply line 310, a second power supply line 320, a third power supply line 330, and a fourth power supply line 340.

A specific configuration example of the output circuit is as follows.

A first terminal of the first transistor 281 and a first terminal of the second transistor 283 are electrically connected to each other and function as the first output terminal 260. Similarly, a first terminal of the third transistor 105 and a first terminal of the fourth transistor 107 are electrically connected to each other and function as the second output terminal 270. A gate terminal of the first transistor 281, a gate terminal of the third transistor 105, and an output terminal of the first input signal generation circuit are electrically connected to one another. A gate terminal of the second transistor 283, a gate terminal of the fourth transistor 107, and an output terminal of the second input signal generation circuit are electrically connected to one another.

The first clock signal is input to a second terminal of the first transistor 281. Further, the second terminal of the first transistor 281 also functions as the first input terminal 210 of the pulse signal output circuit. The second low-potential-side power supply potential (VSS2) is supplied to a second terminal of the second transistor 283 through the first power supply line 310. The first high-potential-side power supply potential (VDD1) or a clock signal (CLK') is supplied to a second terminal of the third transistor 105 through the third power supply line 330. The first low-potential-side power supply potential (VSS1) is supplied to a second terminal of the fourth transistor 107 through the fourth power supply line 340. In this embodiment, the VSS1, the VDD1, and the VSS2 are the first low-potential-side power supply potential, the first high-potential-side power supply potential, and the second low-potential-side power supply potential that are described in the above embodiments, respectively.

A specific configuration example of the first input signal generation circuit is as follows.

A first terminal of the fifth transistor 285, a first terminal of the sixth transistor 287, and a first terminal of the seventh transistor 289 are electrically connected to one another. Further, a second terminal of the seventh transistor 289 functions as the output terminal of the first input signal generation circuit.

The second high-potential-side power supply potential (VDD2) is supplied to a second terminal of the fifth transistor 285 through the second power supply line 320. The VSS2 is supplied to a second terminal of the sixth transistor 287 through the first power supply line 310. A pulse signal from the previous stage (in the first pulse signal output circuit, the pulse signal is a start pulse signal) is input to a gate terminal of the fifth transistor 285. The gate terminal of the fifth transistor 285 functions as a first input terminal of the first input signal generation circuit and also as the fourth input terminal 240 of the pulse signal output circuit. An output signal of the second input signal generation circuit is input to a gate terminal of the sixth transistor 287. The gate terminal of the sixth transistor 287 functions as a second input terminal of the first input signal generation circuit. The VDD2 is supplied to a gate terminal of the seventh transistor 289 through the second power supply line 320. In this embodiment, the VDD2 is the second high-potential-side power supply potential described in the above embodiments.

Although the seventh transistor 289 is provided in this embodiment, a configuration in which the seventh transistor 289 is not provided may be employed. In the case where the seventh transistor 289 is provided, an increase in potential of the first terminal of the fifth transistor 285, which might be caused by bootstrap operation, can be suppressed. That is to say, application of high bias voltage to a region between the gate and the source (or between the gate and the drain) of the fifth transistor 285 can be prevented; thus, deterioration of the fifth transistor 285 can be suppressed.

A specific example of a configuration of the second input signal generation circuit is as follows.

A second terminal of the eleventh transistor 295 and a first terminal of the ninth transistor 291 are electrically connected to each other. A second terminal of the ninth transistor 291, a second terminal of the eighth transistor 290, and a first terminal of the tenth transistor 293 are electrically connected to one another and function as the output terminal of the second input signal generation circuit.

The VDD2 is supplied to a first terminal of the eighth transistor 290 and a first terminal of the eleventh transistor 295 through the second power supply line 320. The VSS2 is supplied to a second terminal of the tenth transistor 293 through the first power supply line 310. A pulse signal from the stage following the next stage is input to a gate terminal of the eighth transistor 290. The gate terminal of the eighth transistor 290 functions as a first input terminal of the second input signal generation circuit and also as the fifth input terminal 250 of the pulse signal output circuit. The second clock signal is input to a gate terminal of the ninth transistor 291. The gate terminal of the ninth transistor 291 functions as a second input terminal of the second input signal generation circuit and also as the second input terminal 220 of the pulse signal output circuit. The pulse signal from the previous stage (in the first pulse signal output circuit, the pulse signal is the start pulse signal) is input to a gate terminal of the tenth transistor 293. The gate terminal of the tenth transistor 293 functions as a third input terminal of the second input signal generation circuit and also as the fourth input terminal 240 of the pulse signal output circuit. The third clock signal is input to a gate terminal of the eleventh transistor 295. The gate terminal of the eleventh transistor 295 functions as a fourth input terminal of the second input signal generation circuit and also as the third input terminal 230 of the pulse signal output circuit.

Note that components of the pulse signal output circuit (e.g., configuration examples of the output circuit, the first input signal generation circuit, and the second input signal generation circuit) are just examples, and the disclosed invention is not limited thereto.

In the following description of this embodiment, a node where the gate terminal of the first transistor 281, the gate terminal of the third transistor 105, and the output terminal of the first input signal generation circuit are connected to one another in the pulse signal output circuit in FIG. 4C is referred to as a node A. In addition, a node where the gate terminal of the second transistor 283, the gate terminal of the fourth transistor 107, and the output terminal of the second input signal generation circuit are connected to one another is referred to as a node B.

A capacitor for favorably performing bootstrap operation may be provided between the node A and the first output terminal 260. Furthermore, a capacitor electrically connected to the node B may be provided in order to hold the potential of the node B.

A transistor which can be manufactured using a known semiconductor material can be used for each of the first transistor 281 to the eleventh transistor 291. Note that a transistor whose threshold voltage is shifted in the positive direction over time is used as the third transistor 105 and the fourth transistor 107. An oxide semiconductor is preferably used for the first to eleventh transistors 281 to 291. With the use of an oxide semiconductor, the off-state current of the transistors can be reduced and the on-state current and field-effect mobility of the transistors can be increased as compared to those in the case where amorphous silicon semiconductor or the like is used.

Furthermore, the deterioration of the transistors can be suppressed. Consequently, an electronic circuit that consumes low power, can operate at high speed, and operates with higher accuracy can be obtained. Note that the description of a method of manufacturing the transistor including an oxide semiconductor is omitted here because it is described in detail in one embodiment below.

<Operation>

Next, operation of the shift register in FIGS. 4A to 4C is described with reference to FIG. 5, FIGS. 6A to 6C, and FIGS. 7A to 7C. Specifically, operation in each of first to sixth periods 51 to 56 in a timing chart in FIG. 5 is described with reference to FIGS. 6A to 6C and FIGS. 7A to 7C. In the timing chart, CLK1 to CLK4 denote clock signals; SP1 denotes a first start pulse; OUT1 to OUT4 denote outputs from the second output terminals of the first to fourth pulse signal output circuits $200\_1$ to $200\_4$; node A and node B denote potentials of the node A and the node B; and SROUT1 to SROUT4 denote outputs from the first output terminals of the first to fourth pulse signal output circuits $200\_1$ to $200\_4$.

Note that in the following description, the first to eleventh transistors 281 to 295 are all n-channel transistors. Further, in FIGS. 6A to 6C and FIGS. 7A to 7C, transistors indicated by solid lines mean that the transistors are in a conduction state (on), and transistors indicated by dashed lines mean that the transistors are in a non-conduction state (off).

Typically, the operation of the first pulse signal output circuit 200$_{\_1}$ is described. The configuration of the first pulse signal output circuit 200$_{\_1}$ is as described above. Further, the relation among input signals and supplied potentials is also as described above. Note that in the following description, VDD (VDD1 or VDD2) is used for the high potentials (also referred to as H levels, H-level signals, or the like) to be supplied to input terminals and power supply lines, and VSS (VSS1 or VSS2) is used for the low potentials (also referred to as L levels, L-level signals, or the like) to be supplied to input terminals and power supply lines.

In the first period 51, SP1 is at H level, so that a high potential is supplied to the gate terminal of the fifth transistor 285 and the gate terminal of the tenth transistor 293 which function as the fourth input terminal 240 in the first pulse signal output circuit 200$_{\_1}$. Thus, the fifth transistor 285 and the tenth transistor 293 are turned on. In the first period 51, CLK3 is also at H level, so that the eleventh transistor 295 is also turned on. In addition, since a high potential is supplied to the gate terminal of the seventh transistor 289, the seventh transistor 289 is also turned on (see FIG. 6A).

Since the fifth transistor 285 and the seventh transistor 289 are turned on, the potential of the node A is increased. Since the tenth transistor 293 is turned on, the potential of the node B is decreased. The potential of the second terminal of the fifth transistor 285 is VDD2. Therefore, the potential of the first terminal of the fifth transistor 285 becomes VDD2−Vth285, which is a potential obtained by subtracting the threshold voltage of the fifth transistor 285 from the potential of the second terminal. The potential of the gate terminal of the seventh transistor 289 is VDD2. Therefore, in the case where Vth289, which is the threshold voltage of the seventh transistor 289, is higher than or equal to Vth285, the potential of the node A becomes VDD2−Vth289, whereby the seventh transistor 289 is turned off. On the other hand, in the case where Vth289 is lower than Vth285, the potential of the node A is increased to VDD2−Vth285 while the seventh transistor 289 is kept on. Hereinafter, a potential which the node A eventually has in the first period 51 is denoted by $V_{AH}$.

When the potential of the node A becomes $V_{AH}$, the first transistor 281 and the third transistor 105 are turned on. Here, since CLK1 is at L level, an L-level signal is output from the first output terminal 260. In contrast, a signal H' corresponding to $V_{AH}$ is output from the second output terminal 270.

In the second period 52, CLK1 is changed from L level to H level. Since the first transistor 281 is on, the potential of the first output terminal 260 is increased. A capacitance is generated between the gate terminal and the source terminal (or the drain terminal) of the first transistor 281; with the capacitance, the gate terminal and the source terminal (or the drain terminal) thereof are capacitively coupled. Thus, the potential of the node A in a floating state is increased as the potential of the first output terminal 260 is increased (bootstrap operation). The potential of the node A finally becomes higher than VDD+Vth281, and each of the potential of the first output terminal 260 and the potential of the second output terminal 270 becomes VDD1 (H level) (see FIG. 5 and FIG. 6B).

In the second period 52, the tenth transistor 293 is in an on state; therefore, the node B is kept at L level. Thus, variation in the potential of the node B due to capacitive coupling, which occurs when the potential of the first output terminal 260 is changed from L level to H level, can be suppressed, so that a malfunction due to the variation in the potential can be prevented.

In the third period 53, SP1 becomes L level, so that the fifth transistor 285 and the tenth transistor 293 are turned off. Further, CLK1 is kept at H level and the potential of the node A is not changed; thus, VDD (an H-level signal) is output from the first output terminal 260 and the second output terminal 270 (see FIG. 6C). Note that in the third period 53, although the node B is in a floating state, the potential of the first output terminal 260 is not changed; therefore, a malfunction due to the capacitive coupling is negligible.

In the fourth period 54, since CLK1 is at L level, the potential of the first output terminal 260 falls. In the fourth period 54, since CLK2 and CLK3 are at H level, the potential of the node B is increased in a short time. Consequently, the second transistor 283 and the fourth transistor 107 are turned on, so that the potentials of the first output terminal 260 and the second output terminal 270 are decreased in a short time (see FIG. 7A). Further, the sixth transistor 287 is turned on, so that the potential of the node A becomes L level. Thus, the first transistor 281 and the third transistor 105 are turned off, whereby the potential of the first output terminal 260 and that of the second output terminal 270 become L level.

In the fifth period 55, the potential of the fifth input terminal 250 (i.e., SROUT3) is kept at H level, whereby the potential of the node B is held. Thus, the second transistor 283, the fourth transistor 107, and the sixth transistor 287 are kept on, so that the potentials of the first output terminal 260 and the second output terminal 270 are kept at L level (see FIG. 7B).

In the sixth period 56, the fifth input terminal 250 (i.e., SROUT3) becomes L level, so that the eighth transistor 290 is turned off. At this time, the node B is made to be in a floating state while keeping the potential. Thus, the second transistor 283, the fourth transistor 107, and the sixth transistor 287 are kept on (see FIG. 7C). Note that in general, the potential of the node B is decreased due to the off-state current of a transistor, for example. However, a transistor with a sufficiently low off-state current (e.g., a transistor including an oxide semiconductor) does not have such a problem. Note that a capacitor may be provided in order to reduce a decrease in potential of the node B.

In the case where both CLK2 and CLK3 become H level in a subsequent period, the ninth transistor 291 and the eleventh transistor 295 are turned on, and a potential is supplied to the node B periodically. Therefore, even when a transistor whose off-state current is relatively large is used, a malfunction of the pulse signal output circuit can be prevented.

In the shift register and the pulse signal output circuit described in this embodiment, a clock signal is supplied to the first transistor 281, and VDD1 or the clock signal (CLK') is applied to the third transistor 105. For example, in a display device or the like, the second output terminal 270 serves as a terminal for outputting a signal to each pixel. In other words, many electric elements might be connected to the second output terminal 270, so that sufficient current drive capability is needed. Thus, it is necessary to increase the size (specifically, the channel width W or the ratio W/L of the channel width W to the channel length L) of the transistor included in the second output terminal 270 (here, the third transistor 105). Under such a condition, power consumed by the input of a clock signal becomes too large to ignore. Therefore, instead of the clock signal, a fixed potential (VDD1) is supplied to the transistor included in the second output terminal 270, so that charge and discharge of the transistor by the input of the clock signal (CLK') are not performed. Accordingly, power consumption can be sufficiently reduced. In this embodiment, the pulse signal output circuit of one embodiment of the present invention includes a reference circuit and a power supply output circuit although not illustrated. Since the threshold voltages of the third transistor 105 and the fourth transistor 107 are changed over time, the VDD1 and the VSS1 are set constant and the VDD2 and the VSS2 are set higher than a potential which is equal to or substantially equal to the threshold voltages of the third transistor 105 and the fourth transistor 107, so that a decrease in the current supply capability of the transistors 105 and 107 can be suppressed and thus, the pulse signal output circuit can operate stably. Further, the sizes of the third transistor 105 and the fourth transistor 107 do not need to be increased; thus, the pulse signal output circuit can have lower power consumption.

Further, when VDD1 is applied to the third transistor 105, a potential is supplied from a power supply to the second output terminal 270, so that sufficient charge capability can be obtained. This effect is particularly effective when many electric elements are connected to an output terminal of the pulse signal output circuit or drive frequency is increased. Thus, high speed operation can be performed even when the pulse signal output circuit is under heavy load. Furthermore, malfunctions caused by the load are suppressed, so that the pulse signal output circuit can operate stably.

In addition, the shift register of this embodiment is driven by a driving method in which a pulse output from the m-th pulse signal output circuit overlaps with half of a pulse output from the (m+1)-th pulse signal output circuit. Therefore, a wiring can be charged for a longer time as compared to that in the case where the driving method is not used. That is to say, with the driving method, a pulse signal output circuit which withstands a heavy load and operates at high frequency can be provided.

As described above, the pulse signal output circuit of one embodiment of the present invention can output the pulse signal stably even when the threshold voltage of a transistor included in an output circuit which outputs a pulse signal is changed over time. By providing the reference circuit and the power supply output circuit, power consumption of the pulse signal output circuit can be reduced. Further, by providing the reference circuit and the power supply output circuit, the pulse signal output circuit whose characteristics are not easily changed over time and has a longer lifetime can be provided.

Embodiment 4

In this embodiment, an example of a transistor which can be used as a transistor included in a pulse signal output circuit of one embodiment of the present invention is described. In particular, the transistors 105 and 107 included in the output circuit 109 included in the pulse signal output circuit 100 are described.

Figure 8A:
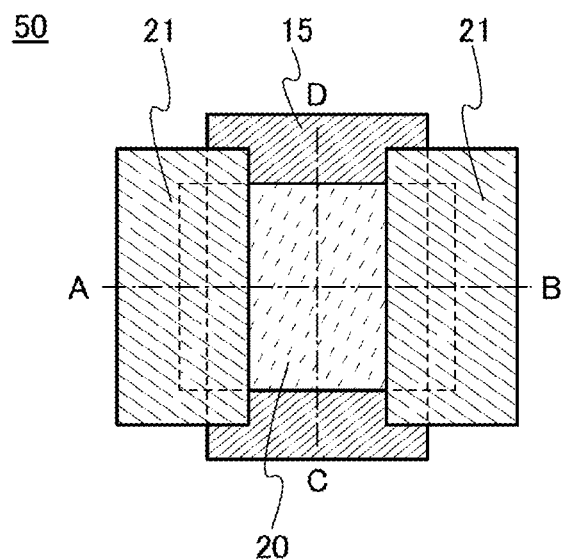
FIGS. 8A to 8D illustrate one embodiment of a transistor.
Figure 8C:
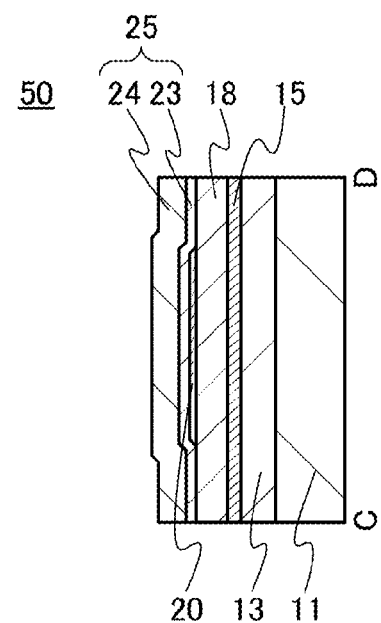
Figure 8B:
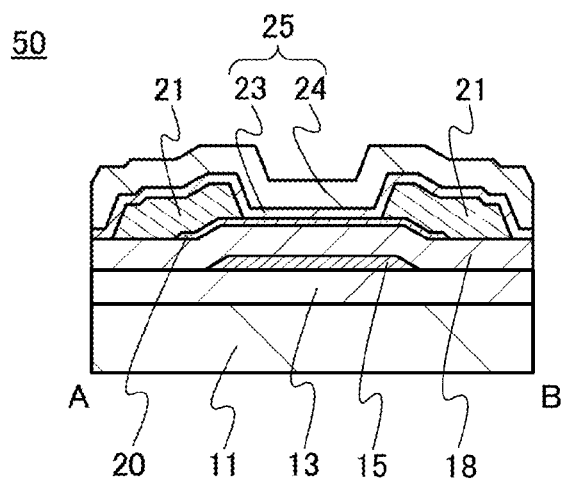

FIGS. 8A to 8C are a top view and cross-sectional views of a transistor 50 which can be used as the transistors 105 and 107 of the pulse signal output circuit. FIG. 8A is a top view of the transistor 50, FIG. 8B is a cross-sectional view taken along a dashed-dotted line A-B in FIG. 8A, and FIG. 8C is a cross-sectional view taken along a dashed-dotted line C-D in FIG. 8A. Note that in FIG. 8A, a substrate 11, a base insulating film 13, some components of the transistor 50 (e.g., a gate insulating film 18), an insulating film 23, an insulating film 24, and the like are omitted for simplicity.

The transistor 50 illustrated in FIGS. 8B and 8C includes a gate electrode 15 over the base insulating film 13. Moreover, a gate insulating film 18 over the base insulating film 13 and the gate electrode 15, an oxide semiconductor film 20 overlapping with the gate electrode 15 with the gate insulating film 18 provided therebetween, and a pair of electrodes 21 in contact with the oxide semiconductor film 20 are included. A protective film 25 including the insulating film 23 and the insulating film 24 is formed over the gate insulating film 18, the oxide semiconductor film 20, and the pair of electrodes 21.

Further, the insulating film 23 is formed to be in contact with the oxide semiconductor film 20 in the transistor 50 described in this embodiment. The insulating film 23 is an oxide insulating film into which and from which oxygen is diffused. Note that here, diffusion of oxygen includes movement of oxygen remaining in the insulating film 23 as well as movement of oxygen to the oxide semiconductor film 20 through the insulating film 23.

The insulating film 24 provided over the insulating film 23 is an oxide insulating film containing more oxygen than that of a stoichiometric composition; thus, when an oxide insulating film into which and from which oxygen is diffused is formed as the insulating film 23, oxygen released from the insulating film 24 over the insulating film 23 can be diffused into the oxide semiconductor film 20 through the insulating film 23.

As the insulating film 23, a silicon oxide film, a silicon oxynitride film, or the like having a thickness greater than or equal to 5 nm and less than or equal to 150 nm, preferably greater than or equal to 5 nm and less than or equal to 50 nm, more preferably greater than or equal to 10 nm and less than or equal to 30 nm can be used.

Further, the insulating film 24 is formed to be in contact with the insulating film 23. The insulating film 24 is an oxide insulating film which contains more oxygen than that of the stoichiometric composition.

As the insulating film 24, a silicon oxide film, a silicon oxynitride film, or the like having a thickness greater than or equal to 30 nm and less than or equal to 500 nm, preferably greater than or equal to 150 nm and less than or equal to 400 nm can be used.

Part of oxygen is released by heat treatment from the oxide insulating film which contains more oxygen than that of the stoichiometric composition. Therefore, when the oxide insulating film from which part of oxygen is released by heat treatment is provided over the insulating film 23 as the insulating film 24, oxygen can be diffused into the oxide semiconductor film 20 and oxygen vacancies in the oxide semiconductor film 20 can be compensated. For example, when the insulating film 24 is formed over the insulating film 23 while the substrate 11 is subjected to heat treatment, oxygen can be diffused into the oxide semiconductor film 20 and oxygen vacancies in the oxide semiconductor film 20 can be compensated. Alternatively, when the insulating film 24 is formed over the insulating film 23 and is then subjected to heat treatment, oxygen can be diffused into the oxide semiconductor film 20 and oxygen vacancies in the oxide semiconductor film 20 can be compensated. Consequently, the amount of oxygen vacancies in the oxide semiconductor film can be reduced.

When the oxide insulating film which contains more oxygen than that of the stoichiometric composition is provided over a back channel of the oxide semiconductor film 20 (a surface of the oxide semiconductor film 20, which is opposite to a surface facing the gate electrode 15) with the oxide insulating film into which and from which oxygen is diffused provided therebetween, oxygen can be diffused into the back channel side of the oxide semiconductor film 20, and oxygen vacancies on the back channel side can be reduced. The transistor 50 having such a structure has the threshold voltage shifted in the positive direction due to a BT stress test and a BT photostress test. The amount of change (ΔVth) is preferably small. For example, the amount of change (ΔVth) is less than or equal to 2.5 V, preferably less than or equal to 1.5 V. In the pulse signal output circuit of one embodiment of the present invention, supplied power supply voltage is increased over time, and as the amount of change increases, the supplied power supply voltage becomes higher, so that power consumption of the whole pulse signal output circuit is increased. Thus, by using the transistor described in this embodiment for the pulse signal output circuit of one embodiment of the present invention, an increase in power supply voltage and power consumption of the pulse signal output circuit of one embodiment of the present invention can be suppressed.

In the case where the oxide semiconductor film 20 is not damaged in the formation process of the insulating film 24, a structure in which the insulating film 23 is not provided and only the insulating film 24 that is an oxide insulating film from which part of oxygen is eliminated by heating is provided as a protective film may be employed.

Further, it is possible to prevent outward diffusion of oxygen from the oxide semiconductor film 20 and entry of hydrogen, water, or the like into the oxide semiconductor film 20 from the outside by providing an insulating film having a blocking effect against oxygen, hydrogen, water, and the like over the insulating film 24. As for the insulating film having a blocking effect against oxygen, hydrogen, water, and the like, an aluminum oxide film, an aluminum oxynitride film, a gallium oxide film, a gallium oxynitride film, an yttrium oxide film, an yttrium oxynitride film, a hafnium oxide film, and a hafnium oxynitride film can be given as examples.

Here, a BT stress test and a BT photostress test on the transistor described in this embodiment and electrical characteristics of the transistor are described with reference to FIG. 8D.

The BT stress test is one kind of accelerated test and can evaluate, in a short time, change in characteristics of transistors over time, which is caused by driving the transistor for a long period. In particular, the amount of change in threshold voltage of the transistor between before and after the BT stress test is an important indicator when examining the reliability of the transistor. If the amount of change in the threshold voltage between before and after the BT stress test is small, the transistor has higher reliability.

Next, a specific method of the BT stress test is described. First, initial characteristics of the transistor are measured at an initial temperature. Next, the temperature of the substrate over which the transistor is formed (substrate temperature) is set at fixed temperature, the pair of electrodes serving as a source and a drain of the transistor are set at a same potential, and the gate electrode is supplied for a certain period with potential different from that of the pair of electrodes serving as a source and a drain. The substrate temperature may be determined as appropriate in accordance with the test purpose. Then, the substrate temperature is set at a temperature similar to that of the initial temperature, and electrical characteristics of the transistor are measured again. As a result, a difference between the threshold voltage in the initial characteristics and the threshold voltage in the electrical characteristics after the BT stress test can be obtained as the amount of change in the threshold voltage.

Note that the test in the case where the potential applied to the gate electrode is higher than the potential of the source and the drain is referred to as a positive BT stress test, and the test in the case where the potential applied to the gate electrode is lower than the potential of the source and the drain is referred to as a negative BT stress test. A BT stress test with light irradiation is referred to as a BT photostress test. The test in the case where light irradiation is performed and the potential applied to the gate electrode is higher than the potential of the source and the drain is referred to as a positive BT photostress test, and the test in the case where light irradiation is performed and the potential applied to the gate electrode is lower than the potential of the source and the drain is referred to as a negative BT photostress test.

The stress conditions for the BT stress test can be determined by setting the substrate temperature, the electric field intensity applied to the gate insulating film, and the time of application of an electric field. The intensity of the electric field applied to the gate insulating film is determined in accordance with a value obtained by dividing a potential difference between the gate, and the source and the drain by the thickness of the gate insulating film. For example, in the case where the intensity of the electric field applied to the 100-nm-thick gate insulating film is to be 3 MV/cm, the potential difference between the gate electrode, and the source and the drain can be set to 30 V.

Figure 8D:
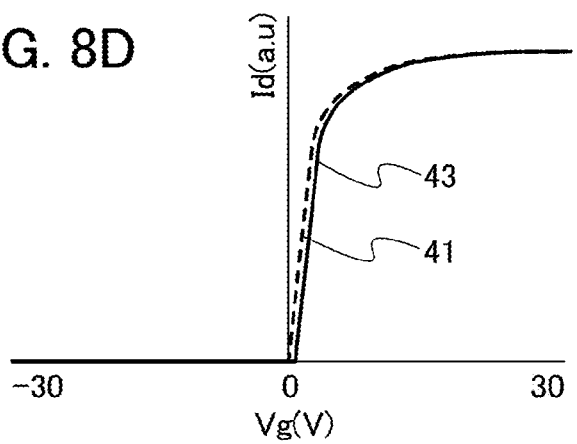

FIG. 8D shows electrical characteristics of the transistor, and the horizontal axis indicates the gate voltage and the vertical axis indicates the drain current. A dashed line 41 denotes the initial characteristics of the transistor, and a solid line 43 denotes the electrical characteristics of the transistor after the BT stress test. The transistor of this embodiment has the following electrical characteristics: the amount of change in the threshold voltage between the dashed line 41 and the solid line 43 is positive, and is less than or equal to 2.5 V, preferably less than or equal to 1.5 V. Therefore, in the transistor of this embodiment, the threshold voltage is not shifted in the negative direction in the electrical characteristics after the BT stress test. That is, the transistor described in this embodiment holds normally-off characteristics even after the transistor is driven for a long period. In other words, the transistor described in this embodiment does not have normally-on characteristics even after the transistor is driven for a long period. Thus, with the transistor described in this embodiment, a pulse signal output circuit of one embodiment of the present invention can be manufactured. Further, the amount of change in the threshold voltage of the transistor described in this embodiment is small. As a result, it is apparent that the transistor 50 of this embodiment has high reliability. For example, the transistor described in this embodiment can be used not only as the transistors 105 and 107 included in the output circuit 109 but also as the transistors included in the first input signal generation circuit 101 and the second input signal generation circuit 103 in the pulse signal output circuit 100 described in the above embodiments.

Note that a transistor including an oxide semiconductor film is an n-channel transistor; therefore, in this specification, a transistor which can be regarded as having no drain current flowing therein when a gate voltage is 0 V is defined as a transistor having normally-off characteristics. In contrast, a transistor which can be regarded as having a drain current flowing therein when a gate voltage is 0 V is defined as a transistor having normally-on characteristics.

Other details of the transistor 50 are described below.

There is no particular limitation on the property of a material and the like of the substrate 11 as long as the substrate has heat resistance enough to withstand at least later heat treatment. For example, a glass substrate, a ceramic substrate, a quartz substrate, a sapphire substrate, or the like may be used as the substrate 11. Alternatively, a single crystal semiconductor substrate or a polycrystalline semiconductor substrate made of silicon, silicon carbide, or the like, a compound semiconductor substrate made of silicon germanium or the like, an SOI substrate, or the like may be used as the substrate 11. Furthermore, any of these substrates further provided with a semiconductor element may be used as the substrate 11.

Still alternatively, a flexible substrate may be used as the substrate 11, and the base insulating film 13 and the transistor 50 may be provided directly on the flexible substrate. Alternatively, a separation layer may be provided between the substrate 11 and the base insulating film 13. The separation layer can be used when part or the whole of a pulse signal output circuit formed over the separation layer is separated from the substrate 11 and transferred onto another substrate. In such a case, the transistor 50 can be transferred to a substrate having low heat resistance or a flexible substrate as well.

As the base insulating film 13, a silicon oxide film, a silicon oxynitride film, a silicon nitride film, a silicon nitride oxide film, a gallium oxide film, a hafnium oxide film, an yttrium oxide film, an aluminum oxide film, an aluminum oxynitride film, and the like can be given as examples. Note that when a silicon nitride film, a gallium oxide film, a hafnium oxide film, an yttrium oxide film, an aluminum oxide film, or the like is used as the base insulating film 13, it is possible to suppress diffusion of impurities such as an alkali metal, water, and hydrogen into the oxide semiconductor film 20 from the substrate 11. Note that in this specification, a "silicon oxynitride film" refers to a film that includes more oxygen than nitrogen, and a "silicon nitride oxide film" refers to a film that includes more nitrogen than oxygen.

The gate electrode 15 can be formed using a metal element selected from aluminum, chromium, copper, tantalum, titanium, molybdenum, and tungsten; an alloy containing any of these metal elements as a component; an alloy containing these metal elements in combination; or the like. Further, one or more metal elements selected from manganese and zirconium may be used. Further, the gate electrode 15 may have a single-layer structure or a stacked-layer structure of two or more layers. A single-layer structure of an aluminum film containing silicon; a two-layer structure in which a titanium film is stacked over an aluminum film; a two-layer structure in which a titanium film is stacked over a titanium nitride film; a two-layer structure in which a tungsten film is stacked over a titanium nitride film; a two-layer structure in which a tungsten film is stacked over a tantalum nitride film or a tungsten nitride film; and a three-layer structure in which a titanium film, an aluminum film, and a titanium film are stacked in this order can be given as examples. Alternatively, a film, an alloy film, or a nitride film which contains aluminum and one or more elements selected from titanium, tantalum, tungsten, molybdenum, chromium, neodymium, and scandium may be used.

The gate electrode 15 can also be formed using a light-transmitting conductive material such as indium tin oxide, indium oxide containing tungsten oxide, indium zinc oxide containing tungsten oxide, indium oxide containing titanium oxide, indium tin oxide containing titanium oxide, indium zinc oxide, or indium tin oxide to which silicon oxide is added. It is also possible to have a stacked-layer structure formed using the above light-transmitting conductive material and the above metal element.

Further, an In—Ga—Zn-based oxynitride semiconductor film, an In—Sn-based oxynitride semiconductor film, an In—Ga-based oxynitride semiconductor film, an In—Zn-based oxynitride semiconductor film, a Sn-based oxynitride semiconductor film, an In-based oxynitride semiconductor film, a film of a metal nitride (such as InN or ZnN), or the like may be provided between the gate electrode 15 and the gate insulating film 18. These films each have a work function higher than or equal to 5 eV, preferably higher than or equal to 5.5 eV, which is higher than the electron affinity of an oxide semiconductor; thus, the threshold voltage of a transistor including the oxide semiconductor can be shifted in the positive direction. Accordingly, a switching element having what is called normally-off characteristics can be obtained. For example, in the case of using an In—Ga—Zn-based oxynitride semiconductor film, an In—Ga—Zn-based oxynitride semiconductor film having a higher nitrogen concentration than at least the oxide semiconductor film 20, specifically, an In—Ga—Zn-based oxynitride semiconductor film having a nitrogen concentration higher than or equal to 7 at. % is used.

The gate insulating film 18 can be formed to have a single-layer structure or a stacked-layer structure using, for example, one or more of a silicon oxide film, a silicon oxynitride film, a silicon nitride oxide film, a silicon nitride film, an aluminum oxide film, a hafnium oxide film, a gallium oxide film, and a Ga—Zn-based metal oxide film. The gate insulating film 18 may be formed using an oxide insulator from which oxygen is released by heating. With the use of a film from which oxygen is released by heating as the gate insulating film 18, interface states at the interface between the oxide semiconductor film 20 and the gate insulating film 18 can be reduced; accordingly, a transistor with less deterioration in electrical characteristics can be obtained. Further, it is possible to prevent outward diffusion of oxygen from the oxide semiconductor film 20 and entry of hydrogen, water, or the like into the oxide semiconductor film 20 from the outside by providing an insulating film having a blocking effect against oxygen, hydrogen, water, and the like on the gate electrode 15 side of the gate insulating film 18. As for the insulating film having a blocking effect against oxygen, hydrogen, water, and the like, an aluminum oxide film, an aluminum oxynitride film, a gallium oxide film, a gallium oxynitride film, an yttrium oxide film, an yttrium oxynitride film, a hafnium oxide film, and a hafnium oxynitride film can be given as examples.

The gate insulating film 18 may be formed using a high-k material such as hafnium silicate ($HfSiO_x$), hafnium silicate to which nitrogen is added ($HfSi_xO_yN_z$), hafnium aluminate to which nitrogen is added ($HfAl_xO_yN_z$), hafnium oxide, or yttrium oxide, so that gate leakage current of the transistor can be reduced.

The thickness of the gate insulating film 18 is preferably greater than or equal to 5 nm and less than or equal to 400 nm, more preferably greater than or equal to 10 nm and less than or equal to 300 nm, still more preferably greater than or equal to 50 nm and less than or equal to 250 nm.

An oxide semiconductor included in the oxide semiconductor film 20 preferably contains at least indium (In) or zinc (Zn). Alternatively, the oxide semiconductor film 20 preferably contains both In and Zn. In order to reduce fluctuations in electrical characteristics of the transistors including the oxide semiconductor, the oxide semiconductor preferably contains one or more of stabilizers in addition to In or Zn.

As for stabilizers, gallium (Ga), tin (Sn), hafnium (Hf), aluminum (Al), zirconium (Zr), and the like can be given as examples. As another stabilizer, lanthanoids such as lanthanum (La), cerium (Ce), praseodymium (Pr), neodymium (Nd), samarium (Sm), europium (Eu), gadolinium (Gd), terbium (Tb), dysprosium (Dy), holmium (Ho), erbium (Er), thulium (Tm), ytterbium (Yb), and lutetium (Lu) can be given as examples.

As the oxide semiconductor, for example, the following can be used: a single component metal oxide such as indium oxide, tin oxide, or zinc oxide; a two-component metal oxide such as an In—Zn-based metal oxide, a Sn—Zn-based metal oxide, an Al—Zn-based metal oxide, a Zn—Mg-based metal oxide, a Sn—Mg-based metal oxide, an In—Mg-based metal oxide, an In—Ga-based metal oxide, or an In—W-based metal oxide; a three-component metal oxide such as an In—Ga—Zn-based metal oxide (also referred to as IGZO), an In—Al—Zn-based metal oxide, an In—Sn—Zn-based metal oxide, a Sn—Ga—Zn-based metal oxide, an Al—Ga—Zn-based metal oxide, a Sn—Al—Zn-based metal oxide, an In—Hf—Zn-based metal oxide, an In—La—Zn-based metal oxide, an In—Ce—Zn-based metal oxide, an In—Pr—Zn-based metal oxide, an In—Nd—Zn-based metal oxide, an In—Sm—Zn-based metal oxide, an In—Eu—Zn-based metal oxide, an In—Gd—Zn-based metal oxide, an In—Tb—Zn-based metal oxide, an In—Dy—Zn-based metal oxide, an In—Ho—Zn-based metal oxide, an In—Er—Zn-based metal oxide, an In—Tm—Zn-based metal oxide, an In—Yb—Zn-based metal oxide, or an In—Lu—Zn-based metal oxide; or a four-component metal oxide such as an In—Sn—Ga—Zn-based metal oxide, an In—Hf—Ga—Zn-based metal oxide, an In—Al—Ga—Zn-based metal oxide, an In—Sn—Al—Zn-based metal oxide, an In—Sn—Hf—Zn-based metal oxide, or an In—Hf—Al—Zn-based metal oxide.

Note that, for example, an In—Ga—Zn-based metal oxide means an oxide containing In, Ga, and Zn as its main components and there is no particular limitation on the ratio of In, Ga, and Zn. The In—Ga—Zn-based metal oxide may contain a metal element other than In, Ga, and Zn.

Alternatively, a material represented by $InMO_3(ZnO)_m$, (m>0 is satisfied, and m is not an integer) may be used as the oxide semiconductor. Note that M represents one or more metal elements selected from Ga, Fe, Mn, and Co. Alternatively, as the oxide semiconductor, a material represented by $In_2SnO_5(ZnO)_n$ (n>0 is satisfied, n is an integer) may be used.

For example, it is possible to use an In—Ga—Zn-based metal oxide containing In, Ga, and Zn at an atomic ratio of 1:1:1 (=1/3:1/3:1/3), 2:2:1 (=2/5:2/5:1/5), or 3:1:2 (=1/2:1/6:1/3), or any of oxides whose composition is in the neighborhood of the above compositions. Alternatively, an In—Sn—Zn-based metal oxide containing In, Sn, and Zn at an atomic ratio of 1:1:1 (=1/3:1/3:1/3), 2:1:3 (=1/3:1/6:1/2), or 2:1:5 (=1/4:1/8:5/8), or any of oxides whose composition is in the neighborhood of the above compositions may be used. Note that in the atomic ratio of each metal oxide, there is a margin of error of ±20% of the above atomic ratios.

However, the composition is not limited to those described above, and a material having the appropriate composition may be used depending on needed semiconductor characteristics and electrical characteristics (e.g., field-effect mobility and threshold voltage). In order to obtain needed semiconductor characteristics and electrical characteristics, it is preferred that the carrier density, the impurity concentration, the defect density, the atomic ratio of a metal element and oxygen, the interatomic distance, the density, and the like be set to be appropriate.

For example, a high mobility can be obtained relatively easily in the case where the In—Sn—Zn-based metal oxide is used. However, the mobility can be increased by reducing the defect density in the bulk also in the case where the In—Ga—Zn-based metal oxide is used.

Further, the energy gap of a metal oxide that can form the oxide semiconductor film 20 is greater than or equal to 2 eV, preferably greater than or equal to 2.5 eV, more preferably greater than or equal to 3 eV. In this manner, the off-state current of a transistor can be reduced by using an oxide semiconductor having a wide energy gap.

Note that the oxide semiconductor film 20 may be a film having an amorphous structure, a single crystal structure, or a polycrystalline structure.

As the oxide semiconductor film 20, a c-axis aligned crystalline oxide semiconductor film (also referred to as CAAC-OS film) having crystal parts may be used.

In most cases, a crystal part in the CAAC-OS film fits inside a cube whose one side is less than 100 nm. In an image obtained with a transmission electron microscope (TEM), a boundary between the crystal parts in the CAAC-OS film are not clearly detected. Further, with the TEM, a grain boundary in the CAAC-OS film is not clearly found. Thus, in the CAAC-OS film, a reduction in electron mobility due to the grain boundary is suppressed.

In each of the crystal parts included in the CAAC-OS film, for example, a c-axis is aligned in a direction parallel to a normal vector of a surface where the CAAC-OS film is formed or a normal vector of a surface of the CAAC-OS film. Further, in each of the crystal parts, metal atoms are arranged in a triangular or hexagonal configuration when seen from the direction perpendicular to the a-b plane, and metal atoms are arranged in a layered manner or metal atoms and oxygen atoms are arranged in a layered manner when seen from the direction perpendicular to the c-axis. Note that, among crystal parts, the directions of the a-axis and the b-axis of one crystal part may be different from those of another crystal part. In this specification, a term "perpendicular" includes a range from 80° to 100°, preferably from 85° to 95°. In addition, a term "parallel" includes a range from −10° to 10°, preferably from −5° to 5°.

In the CAAC-OS film, distribution of crystal parts is not necessarily uniform. For example, in the formation process of the CAAC-OS film, in the case where crystal growth occurs from a surface side of the oxide semiconductor film, the proportion of crystal parts in the vicinity of the surface of the oxide semiconductor film is in some cases higher than that in the vicinity of the surface where the oxide semiconductor film is formed. Further, when an impurity is added to the CAAC-OS film, crystallinity of the crystal part in a region to which the impurity is added is in some cases lowered.

Since the c-axes of the crystal parts included in the CAAC-OS film are aligned in the direction parallel to a normal vector of a surface where the CAAC-OS film is formed or a normal vector of a surface of the CAAC-OS film, the directions of the c-axes may be different from each other depending on the shape of the CAAC-OS film (the cross-sectional shape of the surface where the CAAC-OS film is formed or the cross-sectional shape of the surface of the CAAC-OS film). Note that the film deposition is accompanied with the formation of the crystal parts or followed by the formation of the crystal parts through crystallization treatment such as heat treatment. Hence, the direction of the c-axis of the crystal parts is the direction parallel to a normal vector of the surface where the CAAC-OS film is formed or a normal vector of the surface of the CAAC-OS film.

In a transistor using the CAAC-OS film, change in electrical characteristics due to irradiation with visible light or ultraviolet light is small. Thus, the transistor has high reliability.

Alternatively, the oxide semiconductor film 20 may have a stacked-layer structure of a plurality of oxide semiconductor films. For example, the oxide semiconductor film 20 may have a stacked-layer structure of a first oxide semiconductor film and a second oxide semiconductor film which are formed using metal oxides with different compositions. Alternatively, for example, the first oxide semiconductor film may be formed using any of two-component metal oxide, a three-component metal oxide, and a four-component metal oxide, and the second oxide semiconductor film may be formed using any of these which is different from the oxide for the first oxide semiconductor film.

Further, the constituent elements of the first oxide semiconductor film and the second oxide semiconductor film may be made the same and the composition of the constituent elements of the first oxide semiconductor film and the second oxide semiconductor film may be made different. For example, the first oxide semiconductor film may contain In, Ga, and Zn at an atomic ratio of 1:1:1, and the second oxide semiconductor film may contain In, Ga, and Zn at an atomic ratio of 3:1:2. Alternatively, the first oxide semiconductor film may contain In, Ga, and Zn at an atomic ratio of 1:3:2, and the second oxide semiconductor film may contain In, Ga, and Zn at an atomic ratio of 2:1:3.

At this time, one of the first oxide semiconductor film and the second oxide semiconductor film, which is closer to the gate electrode (on the channel side), preferably contains In and Ga at a proportion of In>Ga. The other oxide semiconductor film, which is farther from the gate electrode (on the back channel side) preferably contains In and Ga at a proportion of In≤Ga.

Further, the oxide semiconductor film 20 may have a three-layer structure of a first oxide semiconductor film, a second oxide semiconductor film, and a third oxide semiconductor film, in which the constituent elements thereof are made the same and the composition of the constituent elements of the first oxide semiconductor film, the second oxide semiconductor film, and the third oxide semiconductor film is made different. For example, the first oxide semiconductor film may contain In, Ga, and Zn at an atomic ratio of 1:3:2, the second oxide semiconductor film may contain In, Ga, and Zn at an atomic ratio of 3:1:2, and the third oxide semiconductor film may contain In, Ga, and Zn at an atomic ratio of 1:1:1.

An oxide semiconductor film which contains less In than Ga and Zn at an atomic ratio, typically, the first oxide semiconductor film containing In, Ga, and Zn at an atomic ratio of 1:3:2, has a higher insulating property than an oxide semiconductor film containing more In than Ga and Zn at an atomic ratio, typically, the second oxide semiconductor film, and an oxide semiconductor film containing Ga, Zn, and In at the same atomic ratio, typically, the third oxide semiconductor film. Further, when the first oxide semiconductor film containing In, Ga, and Zn at an atomic ratio of 1:3:2 has an amorphous structure, the insulating property is further improved. Accordingly, part of the second oxide semiconductor film and the third oxide semiconductor film serve as a channel region, and the first oxide semiconductor film serves as a gate insulating film.

Since the constituent elements of the first oxide semiconductor film, the second oxide semiconductor film, and the third oxide semiconductor film are the same, the first oxide semiconductor film has fewer trap levels at the interface with the second oxide semiconductor film. Therefore, when the oxide semiconductor film 20 has the above structure, the amount of change in the threshold voltage of the transistor due to a change over time or a BT photostress test can be reduced.

In an oxide semiconductor, the s orbital of heavy metal mainly contributes to carrier transfer, and when the In content in the oxide semiconductor is increased, overlap of the s orbitals is likely to be increased. Therefore, an oxide containing In and Ga at a proportion of In>Ga has higher mobility than an oxide containing In and Ga at a proportion of In≤Ga. Further, in Ga, the formation energy of an oxygen vacancy is larger and thus an oxygen vacancy is less likely to occur, than in In; therefore, the oxide containing In and Ga at a proportion of In≤Ga has more stable characteristics than the oxide containing In and Ga at a proportion of In>Ga.

An oxide semiconductor containing In and Ga at a proportion of In>Ga is used on the channel side, and an oxide semiconductor containing In and Ga at a proportion of In≤Ga is used on the back channel side; so that field-effect mobility and reliability of the transistor can be further improved.

Further, the first oxide semiconductor film, the second oxide semiconductor film, and the third oxide semiconductor film may be formed using oxide semiconductors having different crystallinity. That is, the oxide semiconductor film 20 may be formed using any of a single crystal oxide semiconductor, a polycrystalline oxide semiconductor, a microcrystalline oxide semiconductor, and a CAAC-OS, as appropriate. When an amorphous oxide semiconductor is used for either the first oxide semiconductor film or the second oxide semiconductor film, internal stress or external stress of the oxide semiconductor film 20 is relieved, change in characteristics of the transistor is reduced, and reliability of the transistor can be further improved.

The thickness of the oxide semiconductor film 20 is preferably greater than or equal to 1 nm and less than or equal to 100 nm, more preferably greater than or equal to 1 nm and less than or equal to 50 nm, still more preferably greater than or equal to 1 nm and less than or equal to 30 nm, further preferably greater than or equal to 3 nm and less than or equal to 20 nm.

In the oxide semiconductor film 20, the concentration of alkali metal or alkaline earth metal which is obtained by secondary ion mass spectrometry (SIMS) is preferably $1 \times 10^{18}$ atoms/cm$^3$ or less, more preferably $2 \times 10^{16}$ atoms/cm$^3$ or less. This is because an alkali metal and an alkaline earth metal are bonded to an oxide semiconductor to generate carriers in some cases, which causes an increase in off-state current of the transistor.

In the oxide semiconductor film 20, the hydrogen concentration which is obtained by secondary ion mass spectrometry is preferably less than $5 \times 10^{18}$ atoms/cm$^3$, more preferably less than or equal to $1 \times 10^{18}$ atoms/cm$^3$, still more preferably less than or equal to $5 \times 10^{17}$ atoms/cm$^3$, yet still more preferably less than or equal to $1 \times 10^{16}$ atoms/cm$^3$.

Hydrogen contained in the oxide semiconductor film 20 reacts with oxygen bonded to a metal atom to produce water, and a defect is formed in a lattice from which oxygen is released (or a portion from which oxygen is removed). In addition, a bond of part of hydrogen and oxygen causes generation of electrons serving as carriers. Thus, it is preferable to reduce hydrogen concentration in the oxide semiconductor film by reducing the impurities containing hydrogen as much as possible in the step of forming the oxide semiconductor film. Therefore, an oxide semiconductor film which is highly purified by removing hydrogen as much as possible is used as a channel region, so that a shift of the threshold voltage in the negative direction can be reduced and the leakage current between a source and a drain of the transistor, typically the off-state current, can be decreased to several yA/μm to several zA/μm. As a result, electrical characteristics of the transistor can be improved.

The oxide semiconductor film 20 may contain nitrogen at a concentration lower than or equal to $5 \times 10^{18}$ atoms/cm$^3$.

The pair of electrodes 21 is formed to have a single-layer structure or a stacked-layer structure including, as a conductive material, any of metals such as aluminum, titanium, chromium, nickel, copper, yttrium, zirconium, molybdenum, silver, tantalum, and tungsten or an alloy containing any of these metals as its main component. A single-layer structure of an aluminum film containing silicon; a two-layer structure in which a titanium film is stacked over an aluminum film; a two-layer structure in which a titanium film is stacked over a tungsten film; a two-layer structure in which a copper film is formed over a copper-magnesium-aluminum alloy film; a three-layer structure in which a titanium film or a titanium nitride film, an aluminum film or a copper film, and a titanium film or a titanium nitride film are stacked in this order; and a three-layer structure in which a molybdenum film or a molybdenum nitride film, an aluminum film or a copper film, and a molybdenum film or a molybdenum nitride film are stacked in this order can be given as examples. Note that a transparent conductive material containing indium oxide, tin oxide, or zinc oxide may be used.

Next, a method for manufacturing the transistor 50 illustrated in FIGS. 8A to 8C is described with reference to FIGS. 9A to 9D.

Figure 9A:
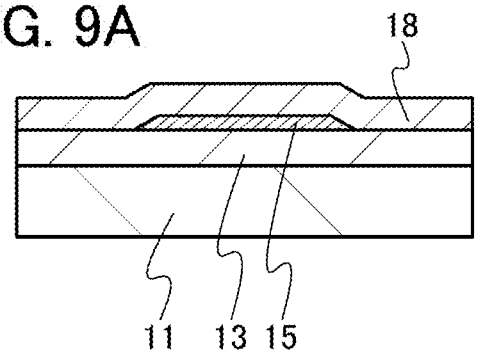
FIGS. 9A to 9D are cross-sectional views illustrating one embodiment of a method for manufacturing the transistor.

As illustrated in FIG. 9A, the base insulating film 13 and the gate electrode 15 are formed over the substrate 11, and the gate insulating film 18 is formed over the gate electrode 15.

The base insulating film 13 is formed by a sputtering method, a CVD method or the like. Here, a 100-nm-thick silicon oxynitride film is formed by a CVD method.

A formation method of the gate electrode 15 is described below. First, a conductive film is formed by a sputtering method, a CVD method, an evaporation method, or the like and then a mask is formed over the conductive film by a photolithography process. Then, part of the conductive film is etched using the mask to form the gate electrode 15. After that, the mask is removed.

Note that instead of the above formation method, the gate electrode 15 may be formed by an electrolytic plating method, a printing method, an ink-jet method, or the like.

Here, a 100-nm-thick tungsten film is formed by a sputtering method. Then, a mask is formed by a photolithography process and the tungsten film is dry-etched using the mask to form the gate electrode 15.

The gate insulating film 18 is formed by a sputtering method, a CVD method, an evaporation method, or the like.

In the case where the gate insulating film 18 is formed using a silicon oxide film, a silicon oxynitride film, or a silicon nitride oxide film, a deposition gas containing silicon and an oxidizing gas are preferred to be used as a source gas. As typical examples of the deposition gas containing silicon, silane, disilane, trisilane, silane fluoride, and the like can be cited. As the oxidizing gas, oxygen, ozone, dinitrogen monoxide, nitrogen dioxide, and the like can be given as examples.

In the case where a silicon nitride film is formed as the gate insulating film 18, it is preferred to use a two-step formation method. First, a first silicon nitride film with few defects is formed by a plasma CVD method in which a mixed gas of silane, nitrogen, and ammonia is used as a source gas. Then, a second silicon nitride film in which the hydrogen concentration is low and hydrogen can be blocked is formed by switching the source gas to a mixed gas of silane and nitrogen. With such a formation method, a silicon nitride film having few defects and a blocking property against hydrogen can be formed as the gate insulating film 18.

Moreover, in the case where a gallium oxide film is formed as the gate insulating film 18, a metal organic chemical vapor deposition (MOCVD) method can be used.

Figure 9B:
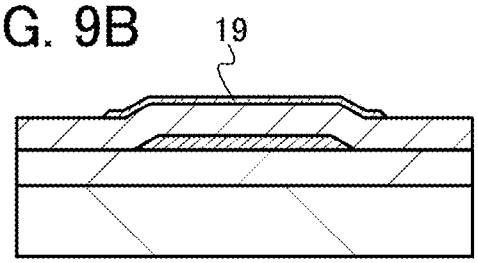

Next, as illustrated in FIG. 9B, an oxide semiconductor film 19 is formed over the gate insulating film 18.

A formation method of the oxide semiconductor film 19 is described below. An oxide semiconductor film is formed over the gate insulating film 18 by a sputtering method, a coating method, a pulsed laser deposition method, a laser ablation method, or the like. Then, after a mask is formed over the oxide semiconductor film by a photolithography process, the oxide semiconductor film is partly etched using the mask. Accordingly, the oxide semiconductor film 19 which is over the gate insulating film 18 and subjected to element isolation so as to partly overlap with the gate electrode 15 is formed as illustrated in FIG. 9B. After that, the mask is removed.

Alternatively, by using a printing method for forming the oxide semiconductor film 19, the oxide semiconductor film 19 subjected to element isolation can be formed directly.

In the case where the oxide semiconductor film is formed by a sputtering method, a power supply device for generating plasma can be an RF power supply device, an AC power supply device, a DC power supply device, or the like as appropriate.

As a sputtering gas, a rare gas (typically argon) atmosphere, an oxygen gas atmosphere, or a mixed gas of a rare gas and oxygen is used as appropriate. In the case of using the mixed gas of a rare gas and oxygen, the proportion of oxygen is preferably higher than that of a rare gas.

Further, a target may be appropriately selected in accordance with the composition of the oxide semiconductor film to be formed.

As a target for forming a CAAC-OS film, for example, a polycrystalline oxide semiconductor sputtering target can be used. When ions collide with the sputtering target, a crystal region included in the sputtering target might be separated from the target along an a-b plane; in other words, a sputtered particle having a plane parallel to an a-b plane (flat-plate-like sputtered particle or pellet-like sputtered particle) might be separated from the sputtering target. In that case, the flat-plate-like sputtered particle reaches a substrate while maintaining their crystal state, whereby a crystal state of the sputtering target is transferred to the substrate. As a result, the CAAC-OS film can be formed.

For the deposition of the CAAC-OS film, the following conditions are preferred to be used.

By reducing the amount of impurities entering the CAAC-OS film during the deposition, the crystal state can be prevented from being broken by the impurities. For example, reducing impurities (e.g., hydrogen, water, carbon dioxide, and nitrogen) which exist in the deposition chamber is favorable. Furthermore, impurities in a deposition gas can be reduced. Specifically, a deposition gas whose dew point is lower than or equal to −80° C., preferably lower than or equal to −100° C., can be used.

By increasing the substrate heating temperature during the deposition, migration of a sputtered particle is likely to occur after the sputtered particle is attached to a substrate surface. Specifically, the substrate heating temperature during the deposition is higher than or equal to 100° C. and lower than or equal to 740° C., preferably higher than or equal to 200° C. and lower than or equal to 500° C. By increasing the substrate heating temperature during the deposition, when the flat-plate-like sputtered particle reaches the substrate, migration occurs on the substrate surface, so that a flat plane of the flat-plate-like sputtered particle is attached to the substrate.

Furthermore, it is preferred that the proportion of oxygen in the deposition gas be increased and the power be optimized in order to reduce plasma damage at the deposition. The proportion of oxygen in the deposition gas is higher than or equal to 30 vol % preferably 100 vol %.

As an example of the sputtering target, an In—Ga—Zn—O compound target is described below.

The In—Ga—Zn—O compound target, which is polycrystalline, is made by mixing $InO_X$ powder, $GaO_Y$ powder, and $ZnO_Z$ powder in a predetermined ratio, applying pressure, and performing heat treatment at a temperature higher than or equal to 1000° C. and lower than or equal to 1500° C. Note that X, Y, and Z are each a given positive number. Here, the predetermined ratio is a molar ratio of $InO_X$ powder to $GaO_Y$ powder and $ZnO_Z$ powder which is 2:2:1, 8:4:3, 3:1:1, 1:1:1, 4:2:3, or 3:1:2 for example. The kinds of powder and the ratio for mixing powder may be determined as appropriate depending on the desired sputtering target.

After the oxide semiconductor film is formed, heat treatment may be performed so that the oxide semiconductor film is dehydrated or dehydrogenated. The temperature of the heat treatment is typically higher than or equal to 150° C. and lower than the strain point of the substrate, preferably higher than or equal to 250° C. and lower than or equal to 450° C., more preferably higher than or equal to 300° C. and lower than or equal to 450° C.

The heat treatment is performed under an inert gas atmosphere containing nitrogen or a rare gas such as helium, neon, argon, xenon, or krypton. Alternatively, the heat treatment may be performed under an inert gas atmosphere first, and then under an oxygen atmosphere. It is preferable that the above inert gas atmosphere and the above oxygen atmosphere do not contain hydrogen, water, and the like. The treatment time is 3 minutes to 24 hours.

By performing heat treatment after the oxide semiconductor film is formed, in the oxide semiconductor film 20, the hydrogen concentration can be less than $5\times10^{18}$ atoms/cm$^3$, preferably less than or equal to $1\times10^{18}$ atoms/cm$^3$, more preferably less than or equal to $5\times10^{17}$ atoms/cm$^3$, still more preferably less than or equal to $1\times10^{16}$ atoms/cm$^3$.

Here, a 35-nm-thick oxide semiconductor film is formed by a sputtering method, a mask is formed over the oxide semiconductor film, and then part of the oxide semiconductor film is selectively etched. Accordingly, the oxide semiconductor film 19 is formed.

Figure 9C:
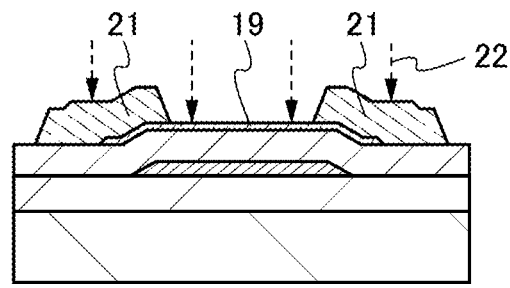

Next, as illustrated in FIG. 9C, the pair of electrodes 21 is formed.

A formation method of the pair of electrodes 21 is described below. First, a conductive film is formed by a sputtering method, a CVD method, an evaporation method, or the like. Then, a mask is formed over the conductive film by a photolithography process. After that, part of the conductive film is etched using the mask to form the pair of electrodes 21. Then, the mask is removed.

Here, a 50-nm-thick tungsten film, a 400-nm-thick aluminum film, and a 100-nm-thick titanium film are sequentially stacked. Then, a mask is formed over the titanium film by a photolithography process and the tungsten film, the aluminum film, and the titanium film are dry-etched using the mask to form the pair of electrodes 21.

After the pair of electrodes 21 is formed, cleaning treatment is preferred to be performed to remove an etching residue. A short circuit of the pair of electrodes 21 can be suppressed by this cleaning treatment. The cleaning treatment can be performed using an alkaline solution such as a tetramethylammonium hydroxide (TMAH) solution; an acidic solution such as a diluted hydrofluoric acid solution, an oxalic acid solution, or a phosphoric acid solution; or water.

Figure 9D:
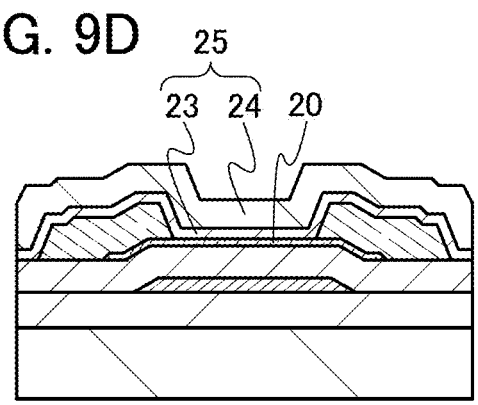

Next, the oxide semiconductor film 20 illustrated in FIG. 9D may be formed in such a manner that the oxide semiconductor film 19 is exposed to plasma generated in an oxidizing atmosphere to be supplied with oxygen 22 as illustrated in FIG. 9C. As an oxidizing atmosphere, atmospheres of oxygen, ozone, dinitrogen monoxide, nitrogen dioxide, and the like can be given as examples. Further, in the plasma treatment, the oxide semiconductor film 19 is preferred to be exposed to plasma generated with no bias applied to a lower electrode on which the substrate 11 is mounted. Consequently, the oxide semiconductor film 19 can be supplied with oxygen without being damaged; accordingly, the amount of oxygen vacancies in the oxide semiconductor film 20 can be reduced.

Here, the oxide semiconductor film 20 is formed by exposing the oxide semiconductor film 19 to oxygen plasma which is generated in such a manner that dinitrogen monoxide is introduced into a treatment chamber of a plasma CVD apparatus, and an upper electrode provided in the treatment chamber is supplied with high-frequency power of 150 W with the use of a 27.12 MHz high-frequency power supply.

The surface of the oxide semiconductor film 19 is exposed to plasma generated in an oxidizing atmosphere to be able to be supply oxygen to the oxide semiconductor film 19, whereby the amount of oxygen vacancies in the oxide semiconductor film can be reduced. Moreover, impurities remaining on the surface of the oxide semiconductor film 19 due to the etching treatment, for example, a halogen such as fluorine or chlorine, can be removed.

Next, the insulating film 23 is formed over the oxide semiconductor film 20 and the pair of electrodes 21. Then, the insulating film 24 is formed over the insulating film 23. At this time, the insulating film 23 is formed without exposure to the atmosphere after the oxide semiconductor film 20 is formed by the above plasma treatment, whereby the concentration of impurities at the interface between the oxide semiconductor film 20 and the insulating film 23 can be reduced.

Further, it is preferred to form the insulating film 24 without exposure to the atmosphere, directly after the insulating film 23 is formed. After the insulating film 23 is formed, the insulating film 24 is formed continuously by adjusting at least one of the flow rate of the source gas, the pressure, the high-frequency power, and the substrate temperature without exposure to the atmosphere, whereby the concentration of impurities at the interface between the insulating film 23 and the insulating film 24 can be reduced and further oxygen contained in the insulating film 24 can be diffused into the oxide semiconductor film 20; accordingly, the amount of oxygen vacancies in the oxide semiconductor film 20 can be reduced.

As the insulating film 23, a silicon oxide film or a silicon oxynitride film is formed under the following conditions: the substrate placed in a treatment chamber of the plasma CVD apparatus, which is vacuum-evacuated, is held at a temperature higher than or equal to 180° C. and lower than or equal to 400° C., preferably higher than or equal to 200° C. and lower than or equal to 370° C., the pressure in the treatment chamber is greater than or equal to 30 Pa and less than or equal to 250 Pa, preferably greater than or equal to 40 Pa and less than or equal to 250 Pa, more preferably greater than or equal to 100 Pa and less than or equal to 250 Pa with introduction of a source gas into the treatment chamber, and high-frequency power is supplied to an electrode provided in the treatment chamber.

A deposition gas containing silicon and an oxidizing gas are preferred to be used as the source gas of the insulating film 23. As typical examples of the deposition gas containing silicon, silane, disilane, trisilane, silane fluoride, and the like can be cited. As the oxidizing gas, oxygen, ozone, dinitrogen monoxide, nitrogen dioxide, and the like can be given as examples.

Under the above conditions, the oxide insulating film into which and from which oxygen is diffused can be formed as the insulating film 23. With the insulating film 23, damage to the oxide semiconductor film 20 can be reduced during a later formation process of the insulating film 24.

Note that when the ratio of the amount of the oxidizing gas to the amount of the deposition gas containing silicon is 100 or higher, the hydrogen content in the insulating film 23 can be reduced. Consequently, the amount of hydrogen entering the oxide semiconductor film 20 can be reduced; thus, the negative shift in the threshold voltage of the transistor can be suppressed and leakage current between a source and a drain of the transistor, typically, the off-state current can be reduced to several yA/μm to several zA/μm; thus, electrical characteristics of the transistor can be improved.

Here, as the insulating film 23, a 10-nm-thick silicon oxynitride film is formed by a plasma CVD method under the following conditions: silane with a flow rate of 20 sccm and dinitrogen monoxide with a flow rate of 3000 sccm are used as the source gas, the pressure in the treatment chamber is 200 Pa, the substrate temperature is 220° C., and the high-frequency power of 100 W is supplied to an upper electrode of parallel plate electrodes with the use of a 27.12 MHz high-frequency power supply. Under the above conditions, a silicon oxynitride film into which and from which oxygen is diffused can be formed.

As the insulating film 24, a silicon oxide film or a silicon oxynitride film is formed under the following conditions: the substrate placed in a treatment chamber of the plasma CVD apparatus, which is vacuum-evacuated, is held at a temperature higher than or equal to 180° C. and lower than or equal to 250° C., more preferably higher than or equal to 180° C. and lower than or equal to 230° C., the pressure is greater than or equal to 100 Pa and less than or equal to 250 Pa, preferably greater than or equal to 100 Pa and less than or equal to 200 Pa with introduction of a source gas into the treatment chamber, and high-frequency power higher than or equal to 0.17 W/cm$^2$ and lower than or equal to 0.5 W/cm$^2$, preferably higher than or equal to 0.25 W/cm$^2$ and lower than or equal to 0.35 W/cm$^2$ is supplied to an electrode provided in the treatment chamber.

As the film formation conditions of the insulating film 24, the high-frequency power having the above power density is supplied to the treatment chamber having the above pressure, whereby the degradation efficiency of the source gas in plasma is increased, oxygen radicals are increased, and oxidation of the source gas is promoted; therefore, the oxygen content of the insulating film 24 becomes higher than that in the stoichiometric composition. However, the bonding strength of silicon and oxygen is weak in the above substrate temperature range; therefore, part of oxygen is released by heating. Thus, it is possible to form an oxide insulating film which contains more oxygen than that of the stoichiometric composition and from which part of oxygen is released by heating. Moreover, the insulating film 23 is provided over the oxide semiconductor film 20. Accordingly, in the process for forming the insulating film 24, the insulating film 23 serves as a protective film of the oxide semiconductor film 20. Consequently, the insulating film 24 can be formed using the high-frequency power having a high power density while damage to the oxide semiconductor film 20 is reduced.

Here, as the insulating film 24, a 400-nm-thick silicon oxynitride film is formed by a plasma CVD method under the following conditions: silane with a flow rate of 160 sccm and dinitrogen monoxide with a flow rate of 4000 sccm are used as the source gas, the pressure in the treatment chamber is 200 Pa, the substrate temperature is 220° C., and the high-frequency power of 1500 W is supplied to an upper electrode of parallel plate electrodes with the use of a 27 MHz high-frequency power supply. Note that the plasma CVD apparatus used in this embodiment is a parallel plate plasma CVD apparatus in which the electrode area is 6000 cm$^2$, and the power per unit area (power density) into which the supplied power is converted is 0.25 W/cm$^2$.

The insulating film 24 may be formed by a sputtering method. For example, by setting the temperature of the substrate 11 higher than or equal to room temperature and lower than or equal to 300° C., using a rare gas (typically, argon), oxygen, or a mixture gas of a rare gas (typically, argon) and oxygen as a sputtering gas, and using a silicon oxide target or a silicon target as the target, an oxide insulating film from which part of oxygen is released by heating can be formed.

Next, heat treatment is performed. The temperature of the heat treatment is typically higher than or equal to 150° C. and lower than the strain point of the substrate, preferably higher than or equal to 200° C. and lower than or equal to 450° C., more preferably higher than or equal to 300° C. and lower than or equal to 450° C.

An electric furnace, an RTA apparatus, or the like can be used for the heat treatment. With the use of the RTA apparatus, the heat treatment can be performed at a temperature higher than or equal to the strain point of the substrate if the heating time is short. Therefore, the heat treatment time can be shortened.

The heat treatment may be performed under an atmosphere of nitrogen, oxygen, ultra-dry air (air in which a water content is less than or equal to 20 ppm, preferably less than or equal to 1 ppm, more preferably less than or equal to 10 ppb), or a rare gas (e.g., argon or helium). The atmosphere of nitrogen, oxygen, ultra-dry air, or a rare gas is preferred not to contain hydrogen, water, and the like.

Here, the heat treatment is performed at 350° C. under a mixed atmosphere of nitrogen and oxygen for one hour.

Through the above process, a transistor having the threshold voltage which is shifted in the positive direction by a BT stress test and a BT photostress test can be manufactured. With the transistor, the pulse signal output circuit of one embodiment of the present invention can be manufactured.

Note that the structures, methods, and the like described in this embodiment can be used as appropriate in combination with any of the structures, methods, and the like described in the other embodiments and examples.

Embodiment 5

In this embodiment, a transistor having a structure different from that of Embodiment 4 is described with reference to FIG. 10. A transistor 70 of this embodiment includes a plurality of gate electrodes facing each other with an oxide semiconductor film provided therebetween.

Figure 10:
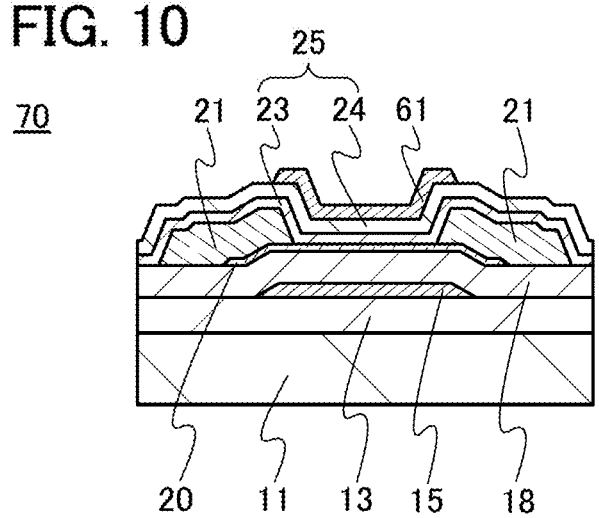
FIG. 10 is a cross-sectional view illustrating one embodiment of a transistor.

A transistor 70 illustrated in FIG. 10 includes the base insulating film 13 over the substrate 11 and the gate electrode 15 over the base insulating film 13. Moreover, the gate insulating film 18 over the base insulating film 13 and the gate electrode 15, the oxide semiconductor film 20 overlapping with the gate electrode 15 with the gate insulating film 18 provided therebetween, and the pair of electrodes 21 in contact with the oxide semiconductor film 20 are included. A protective film 25 including the insulating film 23 and the insulating film 24 is over the gate insulating film 18, the oxide semiconductor film 20, and the pair of electrodes 21. Further, a gate electrode 61 overlapping with the oxide semiconductor film 20 with the protective insulating film 25 provided therebetween is included.

The gate electrode 61 can be formed in a manner similar to that of the gate electrode 15 of Embodiment 4.

The transistor 70 of this embodiment has the gate electrode 15 and the gate electrode 61 facing each other with the oxide semiconductor film 20 provided therebetween. By application of different potentials to the gate electrode 15 and the gate electrode 61, the threshold voltage of the transistor 70 can be controlled, and in a preferable manner, the negative shift in the threshold voltage can be suppressed. Alternatively, by application of the same potential to the gate electrode 15 and the gate electrode 61, the on-state current of the transistor 70 can be increased. Moreover, the oxide semiconductor film 20 whose surface is exposed to plasma generated in an oxidizing atmosphere and the insulating film 23 which is formed in succession after the plasma treatment are included, whereby impurities between the oxide semiconductor film 20 and the gate electrode 61 can be reduced, and change in the threshold voltage of the transistor 70 can be reduced. Further, with the use of the oxide semiconductor film 20 in which the amount of oxygen vacancies is reduced, the negative shift in the threshold voltage of the transistor 70 can be suppressed. The transistor 70 described in this embodiment can be manufactured as a transistor in which the threshold voltage is shifted in the positive direction by a BT stress test and a BT photostress test as in the transistor 50 described in Embodiment 4. With the transistor, a pulse signal output circuit of one embodiment of the present invention can be manufactured.

Note that the structures, methods, and the like described in this embodiment can be used as appropriate in combination with any of the structures, methods, and the like described in the other embodiments and examples.

Embodiment 6

With the use of the shift register of one embodiment of the present invention described in any of the above embodiments, a semiconductor device having a display function (also referred to as a display device) can be manufactured. Furthermore, when part or whole of a driver circuit is formed over the same substrate as a pixel portion, a system-on-panel can be obtained.

As a display element used for the display device, a liquid crystal element (also referred to as a liquid crystal display element) or a light-emitting element (also referred to as a light-emitting display element) can be used. The light-emitting element includes, in its category, an element whose luminance is controlled by a current or a voltage, and specifically includes, in its category, an inorganic electroluminescent (EL) element, an organic EL element, and the like. Furthermore, a display medium whose contrast is changed by an electric effect, such as electronic ink, can be used.

Figure 11A:
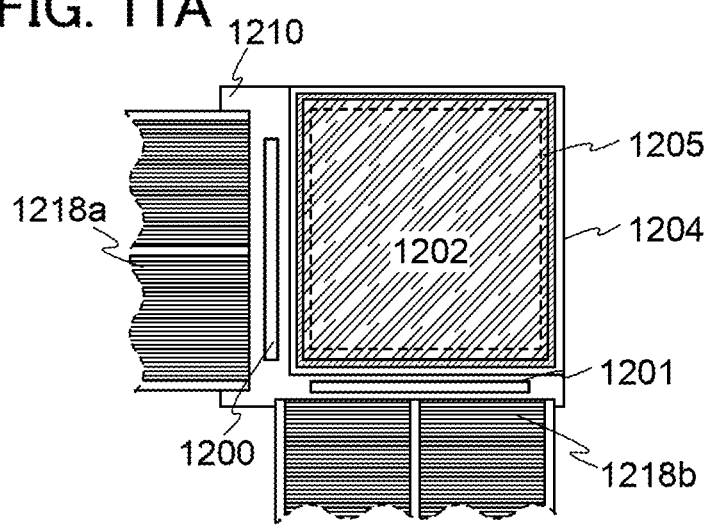
FIGS. 11A to 11C are top views illustrating embodiments of display devices.

In FIG. 11A, a sealant 1205 is provided so as to surround a pixel portion 1202 provided over a first substrate 1210, and the pixel portion 1202 is sealed between the first substrate 1210 and a second substrate 1204. In FIG. 11A, a scan line driver circuit 1201 and a signal line driver circuit 1200 each of which is formed over a substrate separately prepared are mounted in a region which is different from a region surrounded by the sealant 1205 over the first substrate 1210. Further, a variety of signals and potentials are supplied to the signal line driver circuit 1200 which is separately formed, and the scan line driver circuit 1201 or the pixel portion 1202 from flexible printed circuits (FPCs) 1218a and 1218b.

Figure 11B:
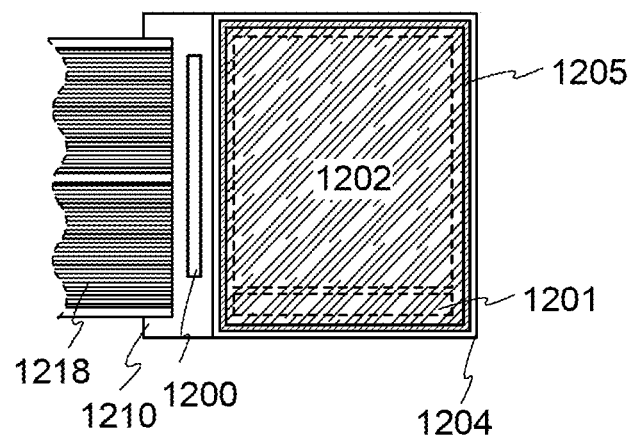
Figure 11C:
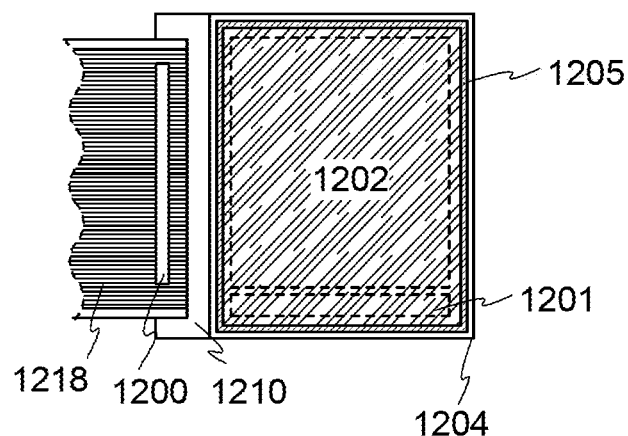

In FIGS. 11B and 11C, the sealant 1205 is provided so as to surround the pixel portion 1202 and the scan line driver circuit 1201 which are provided over the first substrate 1210. The second substrate 1204 is provided over the pixel portion 1202 and the scan line driver circuit 1201. Consequently, the pixel portion 1202 and the scan line driver circuit 1201 are sealed together with the display element by the first substrate 1210, the sealant 1205, and the second substrate 1204. In FIGS. 11B and 11C, the signal line driver circuit 1200 which is formed over a substrate separately prepared is mounted in a region which is different from a region surrounded by the sealant 1205 over the first substrate 1210. In FIGS. 11B and 11C, a variety of signals and potentials are supplied to the signal line driver circuit 1200 which is separately formed, and the scan line driver circuit 1201 or the pixel portion 1202 from an FPC 1218.

Although FIGS. 11B and 11C each illustrate an example in which the signal line driver circuit 1200 is formed separately and mounted on the first substrate 1210, the present invention is not limited to this structure. The scan line driver circuit may be separately formed and then mounted, or only part of the signal line driver circuit or part of the scan line driver circuit may be separately formed and then mounted.

Note that a connection method of a separately formed driver circuit is not particularly limited, and a chip on glass (COG) method, a wire bonding method, a tape automated bonding (TAB) method, or the like can be used. FIG. 11A illustrates an example in which the signal line driver circuit 1200 and the scan line driver circuit 1201 are mounted by a COG method. FIG. 11B illustrates an example in which the signal line driver circuit 1200 is mounted by a COG method. FIG. 11C illustrates an example in which the signal line driver circuit 1200 is mounted by a TAB method.

In addition, the display device includes a panel in which the display element is sealed, and a module in which an IC or the like including a controller is mounted on the panel.

Note that a display device in this specification means an image display device, a display device, or a light source (including a lighting device). Furthermore, the display device also includes the following modules in its category: a module to which a connector such as an FPC or a TCP is attached; a module having a TCP at the tip of which a printed wiring board is provided; and a module in which an integrated circuit (IC) is directly mounted on a display element by a COG method.

Further, the pixel portion 1202 provided over the first substrate 1210 includes a plurality of transistors, and the transistors using a known semiconductor material can be used as the transistors. For example, a transistor manufactured using an oxide semiconductor is preferably used.

As the display element included in the display device, a light-emitting element utilizing electroluminescence can be used. Light-emitting elements utilizing electroluminescence are classified according to whether a light-emitting material is an organic compound or an inorganic compound. In general, the former is referred to as an organic EL element, and the latter is referred to as an inorganic EL element.

In an organic EL element, by application of voltage to a light-emitting element, electrons and holes are separately injected from a pair of electrodes into a layer including a light-emitting organic compound, and current flows. Then, recombination of these carriers (the electrons and holes) makes the light-emitting organic compound to form an excited state and to emit light when it returns from the excited state to a ground state. Because of such a mechanism, the light-emitting element is called a current-excitation light-emitting element.

The inorganic EL elements are classified according to their element structures into a dispersion-type inorganic EL element and a thin-film inorganic EL element. A dispersion-type inorganic EL element has a light-emitting layer where particles of a light-emitting material are dispersed in a binder, and its light emission mechanism is donor-acceptor recombination type light emission that utilizes a donor level and an acceptor level. A thin-film inorganic EL element has a structure where a light-emitting layer is sandwiched between dielectric layers, which are further sandwiched between electrodes, and its light emission mechanism is localized type light emission that utilizes inner-shell electron transition of metal ions.

In the case where a liquid crystal element is used as the display element, a thermotropic liquid crystal, a low-molecular liquid crystal, a high-molecular liquid crystal, a polymer dispersed liquid crystal, a ferroelectric liquid crystal, an antiferroelectric liquid crystal, or the like can be used. These liquid crystal materials exhibit a cholesteric phase, a smectic phase, a cubic phase, a chiral nematic phase, an isotropic phase, or the like depending on conditions.

Alternatively, a liquid crystal exhibiting a blue phase for which an alignment film is unnecessary may be used. A blue phase is one of liquid crystal phases, which is generated just before a cholesteric phase changes into an isotropic phase while temperature of a cholesteric liquid crystal is increased. Since the blue phase appears only in a narrow temperature range, a liquid crystal composition containing a chiral material at 5 wt % or more is preferably used for a liquid crystal layer in order to improve the temperature range. The liquid crystal composition which includes a liquid crystal showing a blue phase and a chiral material has a short response time of 1 msec or less, has optical isotropy, which makes the alignment process unneeded and the viewing angle dependence small. In addition, an alignment film does not need to be provided and thus rubbing treatment is not necessary. Therefore, electrostatic discharge damage caused by the rubbing treatment can be prevented and defects and damage of the liquid crystal display device in the manufacturing process can be reduced. Thus, liquid crystal display devices can be manufactured with improved productivity.

The specific resistivity of the liquid crystal material is greater than or equal to $1 \times 10^9 \Omega \cdot cm$, preferably greater than or equal to $1 \times 10^{11} \Omega \cdot cm$, still preferably greater than or equal to $1 \times 10^{12} \Omega \cdot cm$. Note that the specific resistance in this specification is measured at 20° C.

The value of a storage capacitor formed in the liquid crystal display device is set in consideration of the leakage current of the transistor provided in the pixel portion or the like so that charge can be held for a predetermined period. The value of the storage capacitor may be set in consideration of the off-state current of a transistor or the like.

For the liquid crystal display device, a twisted nematic (TN) mode, an in-plane-switching (IPS) mode, a fringe field switching (FFS) mode, an axially symmetric aligned microcell (ASM) mode, an optical compensated birefringence (OCB) mode, a ferroelectric liquid crystal (FLC) mode, an antiferroelectric liquid crystal (AFLC) mode, or the like is used.

A normally black liquid crystal display device such as a transmissive liquid crystal display device utilizing a vertical alignment (VA) mode is preferable. Some examples of the vertical alignment mode are given. For example, a multi-domain vertical alignment (MVA) mode, a patterned vertical alignment (PVA) mode, an ASV mode, or the like can be used.

Furthermore, this embodiment can be applied to a VA liquid crystal display device. The VA liquid crystal display device is a kind of form in which alignment of liquid crystal molecules of a liquid crystal display panel is controlled. In the VA liquid crystal display device, liquid crystal molecules are aligned in a vertical direction with respect to a panel surface when no voltage is applied. Moreover, it is possible to use a method called domain multiplication or multi-domain design, in which a pixel is divided into some regions (subpixels) and molecules are aligned in different directions in their respective regions.

In the display device described in this embodiment, a black matrix (a light-blocking layer), an optical member (an optical substrate) such as a polarizing member, a retardation member, or an anti-reflection member, and the like can be provided as appropriate. For example, circular polarization may be obtained by using a polarizing substrate and a retardation substrate. In addition, a backlight, a side light, or the like may be used as a light source.

As a display method in the pixel portion, a progressive method, an interlace method, or the like can be used. Further, color elements controlled in a pixel at the time of color display are not limited to three colors: R, G, and B (R, G, and B correspond to red, green, and blue, respectively). For example, R, G, B, and W (W corresponds to white), or R, G, B, and one or more of yellow, cyan, magenta, and the like can be used. Further, the sizes of display regions may be different between respective dots of color elements. The disclosed invention is not limited to the application to a display device for color display but can also be applied to a display device for monochrome display.

In the liquid crystal display device, a liquid crystal element can be an element in which a liquid crystal is provided between a counter electrode and a pixel electrode electrically connected to a switching element. In many cases, the counter electrodes have the same potential in the entire pixel portion. Therefore, the counter electrode is also referred to as a common electrode. Note that the potential of the counter electrode is controlled by a peripheral circuit such as a driver circuit. The potential of the counter electrode is adjusted in accordance with a potential of a signal line which is actually applied to the pixel electrode. When the potential of the signal line which is actually applied to the pixel electrode is changed, a defect might occur in a display screen; therefore, the potential of the counter electrode is preferred to be optimized so as to correspond to the center of potential amplitude of the pixel electrode. Next, a liquid crystal display device including a first counter electrode provided in a driver circuit portion (a scan line driver circuit and a signal line driver circuit) and a second counter electrode provided in a pixel portion, which can be supplied with different potentials, is described.

Figure 12A:
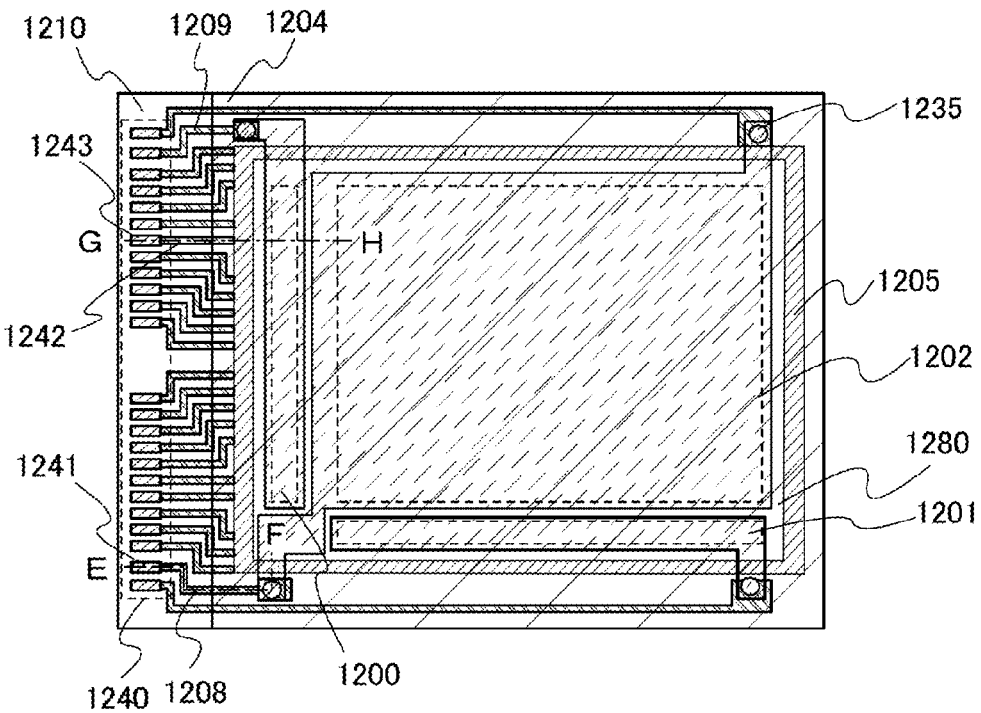
FIGS. 12A to 12C are a top view and cross-sectional views illustrating one embodiment of a display device.
Figure 12B:
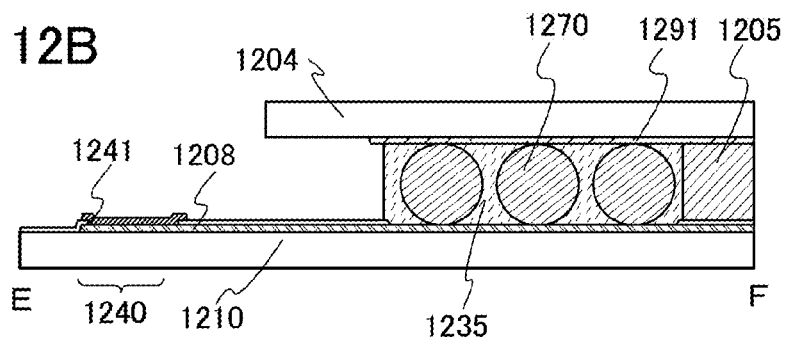
Figure 12C:
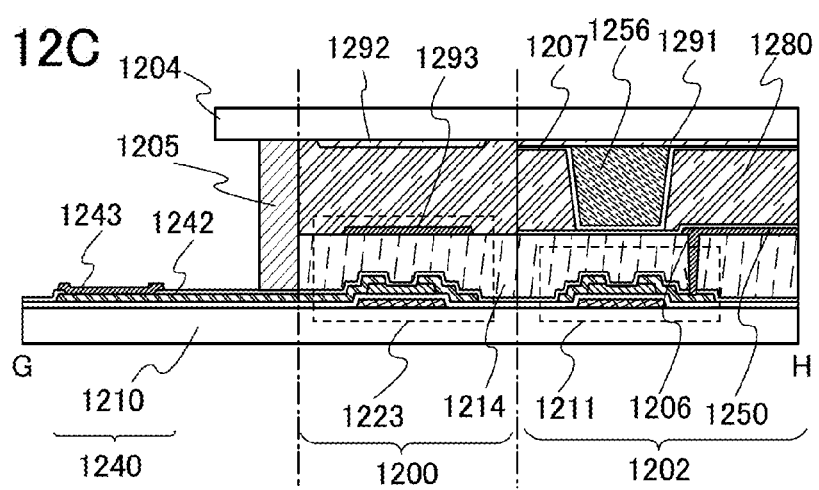

FIG. 12A is a top view of the liquid crystal display device. The top view of FIG. 12A illustrates any of the display devices illustrated in FIGS. 11A to 11C in which the FPC 1218 has not been attached to a first substrate 1210. FIG. 12B is a cross-sectional view taken along a chain line E-F of FIG. 12A, which illustrates a connection region of a conductive particle and a connection wiring. FIG. 12C is a cross-sectional view taken along a chain line G-H of FIG. 12A, which illustrates a connection region of the pixel portion and a connection wiring.

In the liquid crystal display device, the first substrate 1210 which is provided with pixel electrodes each electrically connected to a switching element, and a second substrate 1204 provided with a first counter electrode 1291 and a second counter electrode 1292 are attached to each other with a sealant 1205, and the interior space surrounded by the sealant 1205 is filled with a liquid crystal 1280. A signal line driver circuit 1200, a scan line driver circuit 1201, and a pixel portion 1202 in which the pixel electrodes are formed in a matrix form are provided over the first substrate 1210.

The second counter electrode 1292 provided over the driver circuit portion has a potential which is different from that of the first counter electrode 1291. Different potentials can be supplied to the first counter electrode 1291 provided in the pixel portion 1202 and the second counter electrode 1292 provided in the driver circuit portion.

A potential difference (voltage) is applied to the pixel electrode through the switching element. Therefore, there is a possibility that the voltage applied to the pixel electrode is less than the voltage which is actually applied to a wiring connected to the switching element by several volts. Thus, it is preferred that a potential difference (voltage) applied to the first counter electrode 1291 be set in consideration of the difference.

As a driver circuit portion, the signal line driver circuit 1200 provided with a circuit including a transistor 1223 which is a switching element over the first substrate 1210 is illustrated.

The pixel portion 1202 includes a transistor 1211 as a switching element. Further, the pixel portion 1202 includes a pixel electrode 1250 which is over an insulating film 1214 and is connected to the transistor 1211.

The transistors 1211 and 1223 each include an oxide semiconductor film, a gate insulating film, and a gate electrode. The transistor 1223 includes a conductive film 1293 which overlaps with the gate electrode and the oxide semiconductor film with the insulating film 1214 interposed therebetween (see FIG. 12C).

In the transistor 1223, the oxide semiconductor film is interposed between the gate electrode and the conductive film 1293. With such a structure, variation in threshold voltage of the transistor 1223 can be reduced, so that a liquid crystal display device provided with the transistor 1223, which has stable electrical characteristics, can be provided. The conductive film 1293 may be at the same potential as the gate electrode or may be at a floating potential or a fixed potential such as a ground potential or 0 V. By setting the potential of the conductive film 1293 to an arbitrary value, the threshold voltage of the transistor 1223 can be controlled though depending on a distance between the pair of substrates.

The conductive film 1293 may be processed into a pattern having an opening so as to be provided in a region overlapping with the gate electrode and the oxide semiconductor film.

The second counter electrode 1292 provided in the driver circuit portion has a flat shape and may be processed into a pattern having an opening. By processing the second counter electrode 1292 into the pattern having an opening, parasitic capacitance formed between the second counter electrode 1292 and a conductive film included in a transistor provided in the driver circuit portion can be reduced. Accordingly, lower power consumption of the liquid crystal display device can be achieved.

In this specification, a pattern having an opening (a slit) of the second counter electrode 1292 in the driver circuit portion includes patterns which are partly opened, such as a bend portion and a branching comb-like portion as well as a pattern which is opened in a closed space.

A known material can be used for each of the first substrate 1210 and the second substrate 1204. For example, a material which can be used for the substrate 11 described in the above embodiments can be used.

The sealant 1205 is applied over the first substrate or the second substrate by a screen printing method, or with an ink-jet apparatus or a dispensing apparatus. For the sealant 1205, typically, a material containing a visible light curable resin, an ultraviolet curable resin, or a thermosetting resin can be used. Note that it is preferable to select a sealing material which is insoluble in the liquid crystal 1280 for the sealant 1205.

The kind of the pixel electrode 1250 is different in a transmissive liquid crystal display device and a reflective liquid crystal display device. In the case of a transmissive liquid crystal display device, the pixel electrode 1250 is formed of a light-transmitting material. As examples of the light-transmitting material, indium tin oxide, zinc oxide, indium zinc oxide, gallium-doped zinc oxide, and the like can be given. Further, the pixel electrode 1250 can be formed of a conductive composition including a conductive polymer, as well. As the conductive polymer, a so-called π-electron conjugated conductive polymer can be used.

On the other hand, in the case of a reflective liquid crystal display device, a metal electrode having high reflectivity is used as the pixel electrode. Specifically, aluminum, silver, or the like is used. Further, the reflectivity is increased by making the surface of the pixel electrode rough. Therefore, a base film of the pixel electrode may be made rough.

Further, in the case of a semi-transmissive liquid crystal display device, a transmissive material and a reflective material are used for the pixel electrode.

Further, a terminal portion 1240 is formed in an edge portion of the first substrate 1210. FIGS. 12B and 12C each show an example of a cross-sectional structure of the terminal portion 1240.

FIG. 12B is a cross-sectional view of a region where an upper wiring and a lower wiring are electrically connected to each other with conductive particles 1270 contained in a resin layer 1235. A connection wiring 1208 is formed over the first substrate 1210. A connection electrode 1241 which is formed at the same time as the pixel electrode 1250 is formed over the connection wiring 1208. The connection electrode 1241 is electrically connected to the first counter electrode 1291 through the connection wiring 1208 and the conductive particles 1270. Further, the connection electrode 1241 is connected to an FPC (not illustrated). Note that in FIG. 12B, the conductive particles 1270 are fixed by the resin layer 1235. The resin layer 1235 can be formed using an organic resin insulating material like that used for the sealant 1205.

FIG. 12C is a cross-sectional view of a region where the pixel electrode 1250 and a connection terminal 1243 are connected. A connection wiring 1242 formed at the same time as a source electrode and a drain electrode of the transistor 1211 is formed over the first substrate 1210. A connection terminal 1243 formed at the same time as the pixel electrode 1250 is formed over the connection wiring 1242. The connection terminal 1243 is electrically connected to the pixel electrode 1250 via the connection wiring 1242. Note that, since an active matrix liquid crystal display device is used in this embodiment, the pixel electrode 1250 and the connection wiring 1242 are connected through the transistor 1211 or the signal line driver circuit 1200.

The second substrate 1204 provided with the first counter electrode 1291 and the second counter electrode 1292 or the first substrate 1210 provided with the pixel electrode 1250 is further provided with a pillar spacer 1256. The pillar spacer 1256 is provided to keep a distance between the first substrate 1210 and the second substrate 1204. In this embodiment, an example is described in which the pillar spacer 1256 is provided on the second substrate 1204 side. The pillar spacer is also called a photolitho spacer, a post spacer, a scallop spacer, or a column spacer. Alternatively, a spherical spacer may be used. In this embodiment, a pillar spacer is used. The pillar spacer 1256 can be formed using a known material by a known method.

As the conductive particle 1270, a conductive particle in which an insulating sphere is covered with a thin metal film can be used. The insulating sphere is formed using silica glass, hard resin, or the like. The thin metal film can be formed to have a single-layer structure or a stacked-layer structure using one or more of gold, silver, palladium, nickel, indium tin oxide, and indium zinc oxide. For example, as each metal thin film, a gold thin film, a stack of a nickel thin film and a gold thin film, or the like can be used. By using the conductive particle 1270 in which the insulating sphere is contained at the center, elasticity can be improved so that destruction due to external pressure can be reduced.

The space around the conductive particles 1270 may be filled with a conductive resin layer formed with a conductive polymer instead of an insulating resin layer. As typical examples of the conductive polymer, conductive polyaniline, conductive polypyrrole, conductive polythiophene, a complex of polyethylenedioxythiophene (PEDOT) and poly(styrenesulfonic acid) (PSS), and the like can be cited. Further, any of the afore-mentioned examples of the conductive polymer which can be used for the pixel electrode 1250 can be used as appropriate, as well. The conductive polymer is formed by applying the conductive polymer with an ink-jet apparatus, a dispensing apparatus, or the like. The resin layer is in contact with the counter electrode or the connection wiring; thus, connection resistance between the counter electrode and the connection wiring can be reduced.

Note that the connection wiring 1208 and the first counter electrode 1291 formed on the second substrate 1204 are electrically connected to each other through the conductive particles 1270. Further, a connection wiring 1209 and the second counter electrode 1292 formed on the second substrate 1204 are electrically connected to each other through a conductive particle 1270. The connection wiring 1209 and the connection wiring 1208 have different potentials.

Here, cross-sectional views of a common connection portion (also referred to as a common contact portion) for electrically connecting the counter electrodes (the first counter electrode 1291 and the second counter electrode 1292) provided on the second substrate 1204 to the terminal portion 1240 and top views of the common connection portion are shown in FIGS. 13A and 13B and FIGS. 14A and 14B. Note that an example in which the common connection portion is formed over the first substrate 1210 is shown. In FIGS. 13A and 13B and FIGS. 14A and 14B, a transistor 1211 included in the pixel portion 1202 is formed over the first substrate 1210, in addition to the common connection portion. The common connection portion is formed through the same process as the transistor 1211 of the pixel portion 1202, whereby the common connection portion can be formed without complicating the process. Moreover, over the first substrate 1210, not only the pixel portion 1202 but also a driver circuit (the scan line driver circuit 1201) may be formed in addition to the common connection portion, or the common connection portion may be formed through the same process as the transistor 1223 included in the driver circuit (the scan line driver circuit 1201).

In this embodiment, as illustrated in FIG. 12A, the common connection portion is provided in a position which does not overlap with the sealant 1205 (except for the pixel portion) and a paste (e.g., the resin layer 1235) including the conductive particles 1270 is provided separately from the sealant 1205 so as to overlap with the common connection portion, whereby the connection wiring provided over the first substrate 1210 and the counter electrode provided on the second substrate 1204 are electrically connected to each other. Note that the common connection portion may be provided in a position overlapping with the sealant 1205 for bonding the first substrate 1210 and the second substrate 1204 and may electrically connect the connection wiring provided over the first substrate 1210 to the counter electrodes provided on the second substrate 1204 through the conductive particles 1270 contained in the resin layer 1235.

Figure 13A:
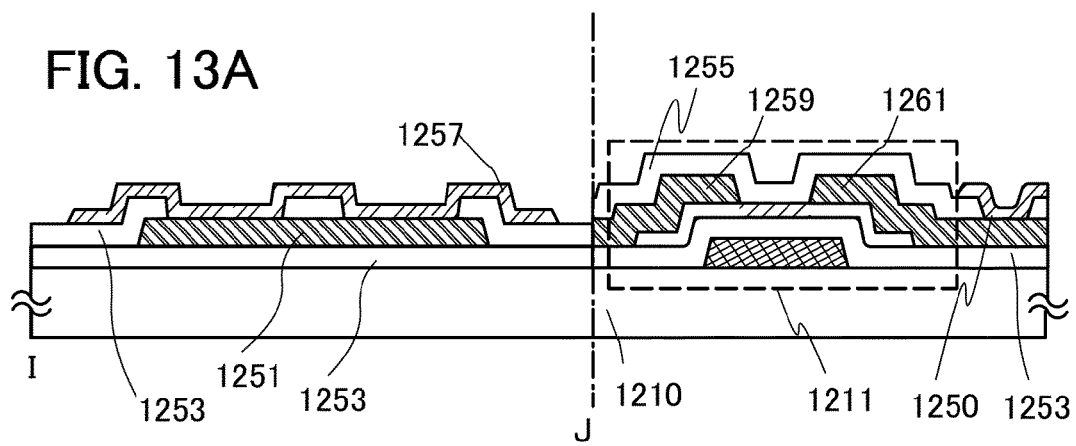
FIGS. 13A and 13B are a cross-sectional view and a top view illustrating a common connection portion of a display device.
Figure 13B:
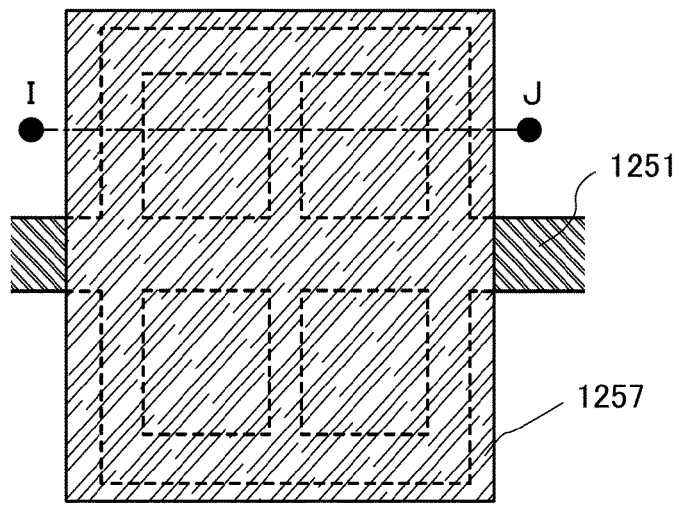

FIG. 13A illustrates a cross-sectional view of a liquid crystal display device in which the transistor 1211 of the pixel portion 1202 and a common connection portion are manufactured over the same substrate, and FIG. 13B illustrates a top view of the common connection portion.

In FIG. 13A, the transistor 1211 which is electrically connected to a pixel electrode 1250 is a channel-etched transistor.

FIG. 13B shows an example of the top view of the common connection portion, and a chain line I-J in FIG. 13B corresponds to a cross section of the common connection portion of FIG. 13A. Note that in FIG. 13B, portions the same as those in FIG. 13A are denoted by the same reference numerals.

A common potential line 1251 is provided over a gate insulating film 1253 and is formed using the same material and through the same process as a source electrode 1259 and a drain electrode 1261 of the transistor 1211.

The common potential line 1251 is covered with a protective insulating film 1255. The protective insulating film 1255 has a plurality of openings in positions overlapping with the common potential line 1251. These openings are formed through the same process as a contact hole that connects the drain electrode 1261 of the transistor 1211 and the pixel electrode 1250.

Note that the contact hole in the pixel portion and the openings in the common connection portion are distinctively described because their sizes differ considerably. In FIG. 13A, the pixel portion 1202 and the common connection portion are not illustrated on the same scale. For example, the length of the chain line I-J in the common connection portion is about 500 μm, whereas the size of the transistor of the pixel portion 1202 is less than 50 μm; thus, the area of the common connection portion is ten times or more as large as that of the transistor. However, the scales of the pixel portion 1202 and the common connection portion are changed in FIG. 13A for simplification.

Moreover, a common electrode 1257 is provided over the protective insulating film 1255 and is formed using the same material and through the same process as the pixel electrode 1250 in the pixel portion 1202.

In this manner, the common connection portion is manufactured through the same process as the transistor 1211 in the pixel portion 1202. The common potential line 1251 is preferred to have a structure with which wiring resistance as a metal wiring can be reduced.

Then, the first substrate 1210 provided with the pixel portion 1202 and the common connection portion is fixed to the second substrate 1204 provided with the counter electrodes with the sealant 1205.

When the sealant 1205 is made to contain conductive particles 1270, the pair of substrates are aligned so that the sealant 1205 overlaps with the common connection portion. For example, in the case of a small liquid crystal panel, two common connection portions overlap the sealant at opposite corners of the pixel portion 1202 and the like. In the case of a large liquid crystal panel, four or more common connection portions overlap the sealant.

Note that the common electrode 1257 is in contact with the conductive particles 1270 included in the sealant and is electrically connected to the counter electrodes on the second substrate 1204.

Figure 14A:
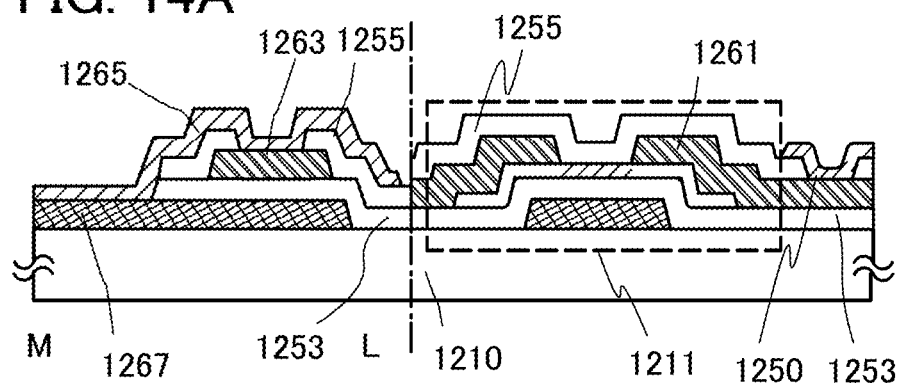
FIGS. 14A and 14B are a cross-sectional view and a top view illustrating a common connection portion of a display device.
Figure 14B:
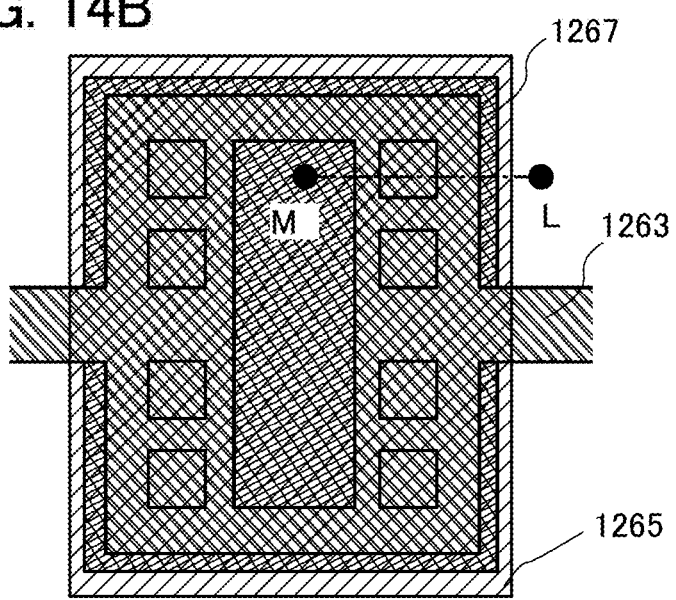

Next, a common connection portion whose structure is partly different from that of the common connection portion illustrated in FIGS. 13A and 13B is illustrated in FIGS. 14A and 14B. In FIGS. 13A and 13B, the common connection portion in which the common potential line 1251 is formed with a wiring formed using the same material and through the same process as a wiring (gate wiring) processed into a gate electrode is illustrated. In FIGS. 14A and 14B, an electrode formed using the same material and through the same process as a gate wiring is provided in the common connection portion, and a wiring formed using the same material and through the same process as the source electrode 1259 and the drain electrode 1261 (a source wiring and a drain wiring) is used to form the common potential line 1263 provided over the common connection portion.

FIG. 14B shows an example of the top view of the common connection portion, and a chain line L-M in FIG. 14B corresponds to a cross section of the common connection portion of FIG. 14A.

A connection electrode 1267 is provided over the first substrate 1210 and is formed using the same material and through the same process as a gate electrode of the transistor 1211.

Further, the connection electrode 1267 is covered with the gate insulating film 1253 and the protective insulating film 1255. The gate insulating film 1253 and the protective insulating film 1255 have an opening at a position overlapping with the connection electrode 1267. This opening has a greater depth than the opening in the common connection portion illustrated in FIGS. 13A and 13B, and the depth corresponds to the thickness of the two insulating films. Note that this opening is formed by etching through the same process as the contact hole that connects the drain electrode 1261 and the pixel electrode 1250, and then further by etching the gate insulating film 1253 selectively.

A common potential line 1263 is provided over the gate insulating film 1253 and is formed using the same material and through the same process as the source electrode 1259 and the drain electrode 1261.

The common potential line 1263 is covered with the protective insulating film 1255. The protective insulating film 1255 has a plurality of openings in positions overlapping with the common potential line 1263. These openings are formed through the same process as the contact hole that connects the drain electrode 1261 and the pixel electrode 1250.

Moreover, a common electrode 1265 is provided over the protective insulating film 1255 and is formed using the same material and through the same process as the pixel electrode 1250 in the pixel portion 1202.

In this manner, the common connection portion is formed through the same process as the transistor 1211 of the pixel portion 1202.

Further, in the common connection portion illustrated in FIGS. 14A and 14B, a plurality of conductive particles are selectively disposed only in the opening of the gate insulating film 1253. That is, the plurality of conductive particles are disposed in a region where the common electrode 1265 and the connection electrode 1267 are in contact with each other. The common electrode 1265 in contact with both the connection electrode 1267 and the common potential line 1263 is an electrode which is in contact with the conductive particles and is electrically connected to the counter electrodes of the second substrate 1204.

Although an example of the common connection portion electrically connected to the counter electrodes is shown here, such a common connection portion can be used as a connection portion connected to another wiring or a connection portion connected to an external connection terminal or the like without being limited to the above example. Note that the structure of the common connection portion illustrated in FIGS. 13A and 13B and the structure of the common connection portion illustrated in FIGS. 14A and 14B can be combined freely.

Further, with the display device described in this embodiment, an electronic paper in which electronic ink is driven can be manufactured. The electronic paper is also called an electrophoretic display device (electrophoretic display) and has advantages in that it has the same level of readability as regular paper, it has less power consumption than other display devices, and it can be set to have a thin and light form.

An electrophoretic display device can have various modes. An electrophoretic display device contains a plurality of microcapsules dispersed in a solvent or a solute, each microcapsule containing first particles which are positively charged and second particles which are negatively charged. By applying an electric field to the microcapsules, the particles in the microcapsules move in opposite directions to each other and only the color of the particles gathering on one side is displayed. Note that the first particles and the second particles each contain pigment and do not move without an electric field. Moreover, the first particles and the second particles have different colors (which may be colorless).

Thus, an electrophoretic display device is a display device that utilizes a so-called dielectrophoretic effect by which a substance having a high dielectric constant moves to a high-electric field region.

A solution in which the above microcapsules are dispersed in a solvent is referred to as electronic ink. This electronic ink can be printed on a surface of glass, plastic, cloth, paper, or the like. Furthermore, by using a color filter or particles that have a pigment, color display can also be achieved.

Note that the first particles and the second particles in the microcapsules may each be formed of a single material selected from a conductive material, an insulating material, a semiconductor material, a magnetic material, a liquid crystal material, a ferroelectric material, an electroluminescent material, an electrochromic material, and a magnetophoretic material, or formed of a composite material of any of these.

As the electronic paper, a display device using a twisting ball display system can be used. In the twisting ball display system, spherical particles each colored in black and white are arranged between a first electrode and a second electrode which are electrodes used for a display element, and a potential difference is generated between the first electrode and the second electrode to control orientation of the spherical particles, so that display is performed.

With the use of the shift register which is one embodiment of the present invention, the above described display device can have a variety of functions.

Note that the structures, methods, and the like described in this embodiment can be used as appropriate in combination with any of the structures, methods, and the like described in the other embodiments and examples.

Embodiment 7

A display device using a shift register of one embodiment of the present invention can be applied to a variety of electronic devices (including game machines). Examples of the electronic devices include television sets (also referred to as televisions or television receivers), monitors of computers or the like, cameras such as digital cameras or digital video cameras, digital photo frames, cellular phones (also referred to as mobile phones or cellular phone sets), portable game consoles, portable information terminals, audio reproducing devices, large-sized game machines such as pachinko machines, electronic paper, and the like. The electronic paper can be used for electronic devices for displaying information in a variety of fields. For example, the electronic paper can be applied to an electronic book (e-book) reader, a poster, a digital signage, a public information display (PID), an advertisement in a vehicle such as a train, displays of various cards such as a credit card, and the like. The portable information terminal which is an example of electronic devices is described with reference to FIGS. 15A to 15C.

FIGS. 15A and 15B illustrate a foldable tablet terminal. FIG. 15A illustrates the tablet terminal which is unfolded. The tablet terminal includes a housing 9630, a display portion 9631a, a display portion 9631b, a display mode switch 9034, a power switch 9035, a power-saving mode switch 9036, a clasp 9033, and an operation switch 9038.

Part of the display portion 9631a can be a touch panel region 9632a, and data can be input by touching operation keys 9638 that are displayed. Although a structure in which a half region in the display portion 9631a has only a display function and the other half region has a touch panel function is shown as an example, the display portion 9631a is not limited to this structure. The whole region in the display portion 9631a may have a touch panel function. For example, the display portion 9631a can display keyboard buttons in the whole region to be a touch panel, and the display portion 9631b can be used as a display screen. The shift register of one embodiment of the present invention can be used for a driving circuit for controlling the display portions 9631a and 9631b.

In a manner similar to that of the display portion 9631a, part of the display portion 9631b can be a touch panel region 9632b. When a keyboard display switching button 9639 displayed on the touch panel is touched with a finger, a stylus, or the like, a keyboard can be displayed on the display portion 9631b.

Touch input can be performed in the touch panel region 9632a and the touch panel region 9632b at the same time.

The display mode switch 9034 can switch the display between a portrait mode and a landscape mode, and between monochrome display and color display, for example. The power-saving mode switch 9036 can control display luminance to be optimal in accordance with the amount of external light in use of the tablet terminal which is detected by an optical sensor incorporated in the tablet terminal. Another detection device including a sensor for detecting inclination, such as a gyroscope or an acceleration sensor, may be incorporated in the tablet terminal, in addition to the optical sensor.

Although the display portion 9631a and the display portion 9631b have the same display area in FIG. 15A as an example, one embodiment of the present invention is not particularly limited to this example. The display portion 9631a and the display portion 9631b may have different areas or different display quality. For example, one of them may be a display panel that can display higher-definition images than the other.

FIG. 15B illustrates the tablet terminal which is folded. The tablet terminal includes the housing 9630, a solar battery 9633, a charge and discharge control circuit 9634, a battery 9635, and a DC-DC converter 9636. As an example, FIG. 15B illustrates the charge and discharge control circuit 9634 including the battery 9635 and the DC-DC converter 9636.

Since the tablet terminal can be folded, the housing 9630 can be closed when not in use. Thus, the display portion 9631a and the display portion 9631b can be protected, which makes it possible to provide a tablet terminal with high durability and improved reliability for long-term use.

The tablet terminal illustrated in FIGS. 15A and 15B can also have a function of displaying various kinds of data (e.g., a still image, a moving image, and a text image), a function of displaying a calendar, the date, the time, or the like on the display portion, a touch-input function of operating or editing data displayed on the display portion by touch input, a function of controlling processing by various kinds of software (programs), and the like.

The solar battery 9633, which is attached on a surface of the tablet terminal, can supply electric power to a touch panel, a display portion, an image signal processor, and the like. Note that the solar battery 9633 can be provided on one or both surfaces of the housing 9630, so that the battery 9635 can be charged efficiently.

The structure and operation of the charge and discharge control circuit 9634 illustrated in FIG. 15B is described with reference to a block diagram in FIG. 15C. FIG. 15C illustrates the solar battery 9633, the battery 9635, the DC-DC converter 9636, a converter 9637, switches 9650 to 9654, and the display portion 9631. The battery 9635, the DC-DC converter 9636, the converter 9637, and the switches 9650 to 9654 correspond to the charge and discharge control circuit 9634 illustrated in FIG. 15B.

First, an example of operation in the case where power is generated by the solar battery 9633 using external light is described. The voltage of power generated by the solar battery 9633 is raised or lowered by the DC-DC converter 9636 so that a voltage for charging the battery 9635 is obtained. When the display portion 9631 is operated with the power from the solar battery 9633, the switch 9650 is turned on and the voltage of the power is raised or lowered by the converter 9637 to a voltage needed for operating the display portion 9631. In addition, when display on the display portion 9631 is not performed, the switch 9650 is turned off and the switch 9652 is turned on so that charge of the battery 9635 may be performed.

Although the solar battery 9633 is shown as an example of a power generation means, there is no particular limitation on the power generation means and the battery 9635 may be charged with another power generation means such as a piezoelectric element or a thermoelectric conversion element (Peltier element). For example, the battery 9635 may be charged with a non-contact power transmission module which is capable of charging by transmitting and receiving power by wireless (without contact), or another charge means used in combination.

This embodiment can be implemented by being combined with any of the other embodiments and examples as appropriate.

Example 1

In this example, measurement results of a BT stress test and a BT photostress test of a transistor which can be used for the pulse signal output circuit of one embodiment of the present invention are described. Specifically, the amount of change in the threshold voltage of the transistor is described.

First of all, the manufacturing processes of a sample A1, a sample A2, a sample A3, and a sample A4 in this example are described with reference to FIGS. 9A to 9D.

First, the gate electrode 15 was formed over the substrate 11 which was a glass substrate. Next, the gate insulating film 18 including an insulating film and an insulating film was formed over the gate electrode 15 (see FIG. 9A). In this example, the base insulating film 13 was not formed.

The gate electrode 15 was formed as follows: a 100-nm-thick tungsten film was formed by a sputtering method, a mask was formed over the tungsten film by a photolithography process, and the tungsten film was partly etched using the mask.

A 50-nm-thick silicon nitride film was formed as the insulating film 16, and a 200-nm-thick silicon oxynitride film was formed as the insulating film 17. The silicon nitride film was formed under the following conditions: silane with a flow rate of 50 sccm and nitrogen with a flow rate of 5000 sccm were supplied to a treatment chamber of a plasma CVD apparatus, the pressure in the treatment chamber was controlled to be 60 Pa, and the power of 150 W was supplied with the use of a 27.12 MHz high-frequency power supply. The silicon oxynitride film was formed under the following conditions: silane with a flow rate of 20 sccm and nitrogen with a flow rate of 3000 sccm were supplied to a treatment chamber of the plasma CVD apparatus, the pressure in the treatment chamber was controlled to be 40 Pa, and the power of 100 W was supplied with the use of a 27 MHz high-frequency power supply. Note that the substrate temperature in formation of the silicon nitride film and the silicon oxynitride film was 350° C.

Next, the oxide semiconductor film 19 overlapping with the gate electrode 15 with the gate insulating film 18 provided therebetween was formed (see FIG. 9B).

Here, an IGZO film which was a CAAC-OS film was formed over the gate insulating film 18 by a sputtering method, a mask is formed over the IGZO film by a photolithography process, and the IGZO film was partly etched using the mask. Then, the etched IGZO film was subjected to heat treatment, so that the oxide semiconductor film 19 was formed. In this example, a 35-nm-thick IGZO film was formed.

The IGZO film was formed under the following conditions: a sputtering target containing In, Ga, and Zn at an atomic ratio of 1:1:1 was used, argon with a flow rate of 50 sccm and oxygen with a flow rate of 50 sccm were supplied as a sputtering gas to a treatment chamber of a sputtering apparatus, the pressure in the treatment chamber was controlled to be 0.6 Pa, and the direct current power of 5 kW was supplied. Note that the IGZO film was formed at a substrate temperature of 170° C.

As the heat treatment, heating at 450° C. under a nitrogen atmosphere for one hour and then heating at 450° C. under a mixed atmosphere of nitrogen and oxygen for one hour were performed.

Next, the pair of electrodes 21 (a source electrode and a drain electrode) which was in contact with the oxide semiconductor film 19 was formed (see FIG. 9C).

A conductive film was formed over the gate insulating film 18 and the oxide semiconductor film 19, a mask was formed over the conductive film by a photolithography process, and the conductive film was partly etched using the mask, so that the pair of electrodes 21 was formed. Note that as the conductive film, a 400-nm-thick aluminum film was formed over a 50-nm-thick tungsten film, and a 100-nm-thick titanium film was formed over the aluminum film.

Next, the substrate was moved to a treatment chamber filled with dinitrogen monoxide. Then, the oxide semiconductor film 20 illustrated in FIG. 9D was formed by exposing the oxide semiconductor film 19 to oxygen plasma which was generated in such a manner that an upper electrode provided in the treatment chamber was supplied with high-frequency power of 150 W with the use of a 27.12 MHz high-frequency power supply.

The insulating film 23 was formed in succession over the oxide semiconductor film 20 and the pair of electrodes 21 without exposure to the atmosphere after the above plasma treatment.

As the insulating film 23 in each of the samples A1 to A3, a silicon oxynitride film was formed by a plasma CVD method under the following conditions: silane with a flow rate of 30 sccm and dinitrogen monoxide with a flow rate of 4000 sccm were used as a source gas, the pressure in a treatment chamber was 40 Pa, the substrate temperature was 220° C., and the high-frequency power of 150 W was supplied to parallel plate electrodes. A sample in which the thickness of the insulating film 23 is 20 nm is referred to as the sample A1, a sample in which the thickness of the insulating film 23 is 50 nm is referred to as the sample A2, and a sample in which the thickness of the insulating film 23 is 100 nm is referred to as the sample A3. Note that since the substrate temperature in this process is 220° C. which is relatively low, the silicon oxynitride film in some cases resulted in a silicon oxide film not containing nitrogen. Moreover since the substrate temperature in this process is 220° C. which is relatively low, the amount of released hydrogen in the film formation process is small compared with that in the film formation process at 350° C.; therefore, the silicon oxynitride film (silicon oxide film) contain hydrogen in some cases.

As the insulating film 23 in the sample A4, a 20-nm-thick silicon oxynitride film was formed by a plasma CVD method under the following conditions: silane with a flow rate of 20 sccm and dinitrogen monoxide with a flow rate of 3000 sccm were used as a source gas, the pressure in the treatment chamber was 200 Pa, the substrate temperature was 350° C., and the high-frequency power of 100 W was supplied to parallel plate electrodes.

Next, the insulating film 24 was formed over the insulating film 23.

As the insulating film 24, a silicon oxynitride film was formed by a plasma CVD method under the following conditions: silane with a flow rate of 160 sccm and dinitrogen monoxide with a flow rate of 4000 sccm were used as a source gas, the pressure in a treatment chamber was 200 Pa, the substrate temperature was 220° C., and the high-frequency power of 1500 W was supplied to an upper electrode of parallel plate electrodes. Under the above conditions, it is possible to form a silicon oxynitride film which contains more oxygen than that of the stoichiometric composition and from which part of oxygen is released by heating. The thickness of the silicon oxynitride film in each of the samples A1 to A3 was 400 nm, and the thickness of the silicon oxynitride film in the sample A4 was 380 nm.

Next, heat treatment was performed. The heat treatment was performed at 350° C. under a mixed atmosphere of oxygen and nitrogen for one hour.

Next, an insulating film was formed over the insulating film 24. Here, a 1.5-μm-thick acrylic resin was formed as the insulating film. After that, heat treatment was performed. The heat treatment was performed at 250° C. under an atmosphere containing nitrogen for one hour.

Through the above process, the samples A1 to A4 were manufactured.

Next, a BT stress test and a BT photostress test were performed on the samples A1 to A4. Here, as the BT stress test, a positive BT stress test and a negative BT stress test were performed. The positive BT stress test was performed under the following conditions: the substrate temperature was 80° C., the intensity of an electric field applied to the gate insulating film was 1.28 MV/cm, and the application time was 2000 seconds.

Under conditions similar to those of the above positive BT stress test, the positive BT photostress test in which the transistor is irradiated with white light of 3000 lx (irradiating intensity of approximately 0.22 mW/cm$^2$) emitted from a white LED was performed.

Here, a measurement method of the positive BT stress test is described. To measure initial characteristics of the transistor subjected to the positive BT stress test, a change in characteristics of current (drain current) flowing between the source and the drain electrode, that is, Vg-Id characteristics were measured under the following conditions: the substrate temperature was 25° C., the voltage (drain voltage) between the source electrode and the drain electrode was 1 V or 10 V, and the voltage (gate voltage) between the source electrode and the gate electrode was changed from −30 V to +30 V.

Next, the substrate temperature was raised to 80° C., and then, the potentials of the source and the drain of the transistor were set to 0 V. Then, voltage was kept being applied to the gate electrode for 2000 seconds so that the intensity of the electric field applied to the gate insulating film was 1.28 MV/cm.

Note that in a negative BT stress test, a voltage of −30 V was applied to the gate electrode, and in a positive BT stress test, a voltage of 30 V was applied to the gate electrode. In a negative BT photostress test, a voltage of −30 V was applied to the gate electrode while irradiation with white light of 3000 1× was performed, and in a positive BT photostress test, a voltage of 30 V was applied to the gate electrode while irradiation with white light of 3000 1× was performed.

Next, the substrate temperature was lowered to 25° C. while voltage was continuously applied to the gate electrode, and the source and the drain. After the substrate temperature was reached to 25° C., the application of voltage to the gate electrode, and the source and the drain was stopped.

Next, Vg-Id characteristics were measured under the same conditions as the measurement of the initial characteristics, and Vg-Id characteristics after the BT stress test and the BT photostress test were obtained. +BT shows a difference between a threshold voltage in the initial characteristics and a threshold voltage after BT stress tests (ΔVth), and the vertical axis indicates the ΔVth.

Figure 17:
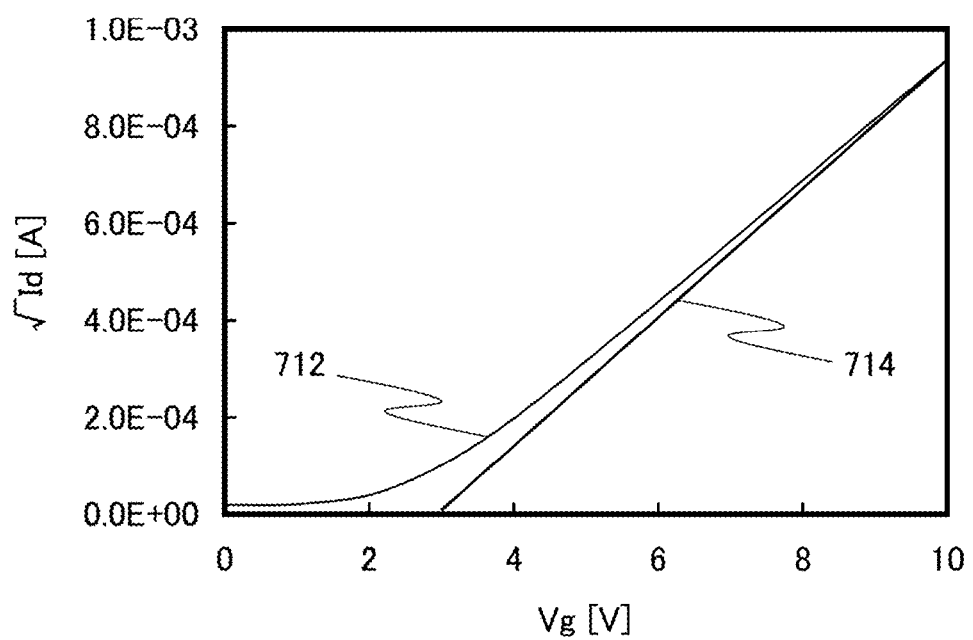
FIG. 17 is a graph for explaining the definition of the threshold voltages of the transistors in Example 1.

Here, a threshold voltage in this specification are described with reference to FIG. 17.

In this specification, in a curve 712 where the horizontal axis indicates the gate voltage (Vg [V]) and the vertical axis indicates the square root of drain current ($Id^{1/2}$ [A]), the threshold voltage (Vth) is defined as a gate voltage at a point of intersection of an extrapolated tangent line 714 of $Id^{1/2}$ having the highest inclination with the Vg axis (i.e., $d^{1/2}$ of 0 A). Note that in this specification, threshold voltage is calculated with a drain voltage Vd of 10 V.

FIG. 16 shows that the amount of change in the threshold voltage (ΔVth) is positive in any of the samples A1 to A4 which were subjected to the BT stress tests or the BT photostress tests, and the amount is 3.0 V or lower, which is small.

Accordingly, it is found that, with the use of a stack of an oxide insulating film into which and from which oxygen is diffused and an oxide insulating film which contains more oxygen than that of the stoichiometric composition as a protective film of a transistor, the amount of change in threshold voltage of a transistor in the positive BT stress test and the positive BT photostress test can be reduced.

Example 2

In this example, diffusion of oxygen into and from the insulating film 23 described in Embodiment 4 is described with reference to FIGS. 18A and 18B. In this example, the diffusion of oxygen is described by measuring the concentration of oxygen by SSDP-secondary ion mass spectrometry (SSDP-SIMS) (SIMS from the back side).

First, methods for forming a sample B1 and a sample B2 are described.

A 100-nm-thick silicon oxynitride (SiON) film was formed over a silicon wafer under the conditions of forming the insulating film 23, which is described in Embodiment 4. Here, the silicon oxynitride film was formed under the following conditions: the silicon wafer was placed in a treatment chamber of a plasma CVD apparatus, silane with a flow rate of 30 sccm and dinitrogen monoxide with a flow rate of 4000 sccm which were used as a source gas were supplied to the treatment chamber, the pressure in the treatment chamber was controlled to be 200 Pa, and the power of 150 W was supplied with the use of a 27.12 MHz high-frequency power supply. The silicon oxynitride film was formed at a temperature of the silicon wafer being 220° C. Note that the plasma CVD apparatus used in this example is a parallel plate plasma CVD apparatus in which the electrode area is 6000 $cm^2$, and the power per unit area (power density) into which the supplied power is converted is 0.025 $W/cm^2$.

Next, a 100-nm-thick silicon oxide ($SiO_x$) film was formed over the silicon oxynitride film by a sputtering method. Here, the silicon oxide film containing $^{18}O$ was formed under the following conditions: the silicon wafer was placed in a treatment chamber of a sputtering apparatus, $^{18}O$ (an isotope of $^{16}O$) with a flow rate of 300 sccm which was used as a source gas was supplied to the treatment chamber, the pressure in the treatment chamber was controlled to be 0.7 Pa, and the power of 8000 W was supplied with the use of a high-frequency power supply. This sample is referred to as the sample B1.

Next, the sample B1 is heated at 350° C. for one hour. This sample is referred to as the sample B2.

Next, the concentration profile of $^{18}O$ contained in each of the samples B1 and B2 was measured by SSDP-SIMS (measurement from the back side, here from the silicon wafer side).

Other than $^{16}O$ which is a main nuclide in oxygen, isotopes such as $^{17}O$ and $^{18}O$ exist. It is known that the proportions of $^{17}O$ and $^{18}O$ in all of the oxygen atoms in nature are about 0.038% and about 0.201%, respectively. That is, the concentrations of $^{17}O$ and $^{18}O$ can be estimated by measuring the concentration of $^{16}O$ in the silicon oxynitride film by SIMS. Here, the concentration of $^{18}O$ in the silicon oxynitride film and the concentration of $^{18}O$ estimated from its proportion to $^{16}O$ are compared, whereby whether $^{18}O$ is diffused or not into the silicon oxynitride film from the silicon oxide ($SiO_x$) film can be judged.

Here, the concentrations of $^{16}O$ and $^{18}O$ in the silicon oxynitride film were measured. Note that a cesium primary ion ($Cs^+$) can be used as a primary ion species.

Figure 18A:
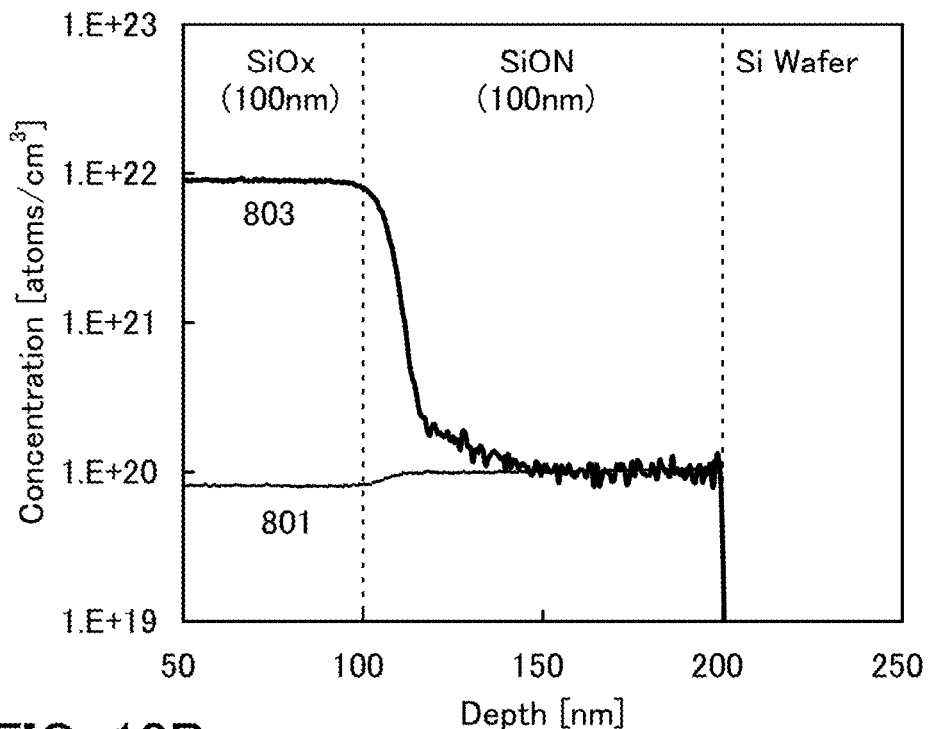
FIGS. 18A and 18B show SSDP-SIMS measurement results of Example 2.
Figure 18B:
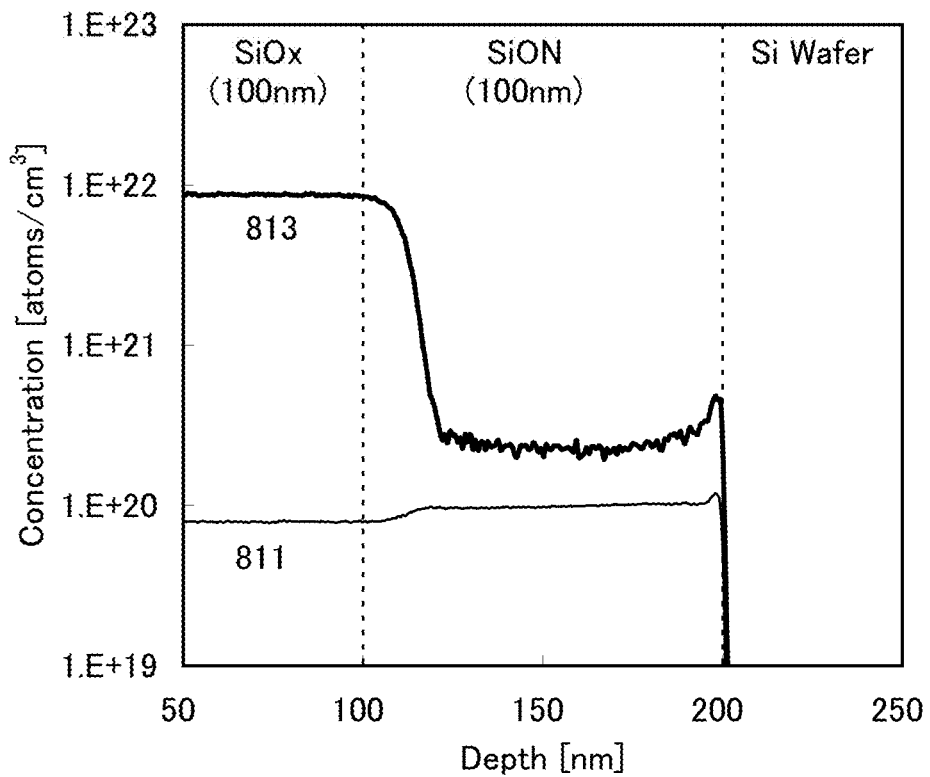

FIGS. 18A and 18B each show the concentration profiles of $^{18}O$ which were obtained by the SSDP-SIMS measurement.

FIG. 18A shows the measurement result of the sample B1. A curve 801 is the concentration profile of $^{18}O$ which was calculated on the basis of the concentration profile of $^{16}O$ measured by SSDP-SIMS with the assumption of a natural proportion of $^{18}O$, and a curve 803 is the concentration profile of $^{18}O$ measured by SSDP-SIMS.

FIG. 18B shows the measurement result of the sample B2. A curve 811 is the concentration profile of $^{18}O$ which was calculated on the basis of the concentration profile of $^{16}O$ measured by SSDP-SIMS, and a curve 813 is the concentration profile of $^{18}O$ measured by SSDP-SIMS.

In the SiON in FIG. 18A, the curve 801 and the curve 803 coincide with each other. That is, it is found that $^{18}O$ contained in the $SiO_x$ is not diffused into the SiON in the sample B1.

On the other hand, the concentration shown by the curve 813 is raised more than that shown by the curve 811 in the SiON in FIG. 18B. That is, it is found that $^{18}O$ contained in the $SiO_x$ is diffused into the SiON by the heat treatment and the concentration of $^{18}O$ in the SiON is increased.

As described above, oxygen is diffused into the silicon oxynitride film formed under the conditions of forming the insulating film 23, which is described in Embodiment 4. That is, excess oxygen contained in an insulating film in contact with the silicon oxynitride film can be diffused into the silicon oxynitride film.

Example 3

In this example, change in defects of the oxide semiconductor film which is caused at the same time as the formation of the insulating film 23 and the insulating film 24 described in Embodiment 4 is described with reference to FIGS. 19A to 19C, FIGS. 20A to 20C, and FIG. 21. In this example, results of electron spin resonance (ESR) by which the amount of oxygen vacancies in the oxide semiconductor film was measured are described.

Figure 19A:
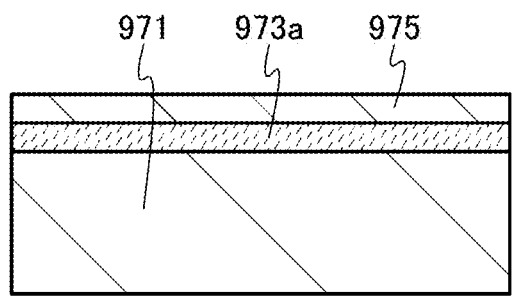
FIGS. 19A to 19C show samples of Example 3.
Figure 19B:
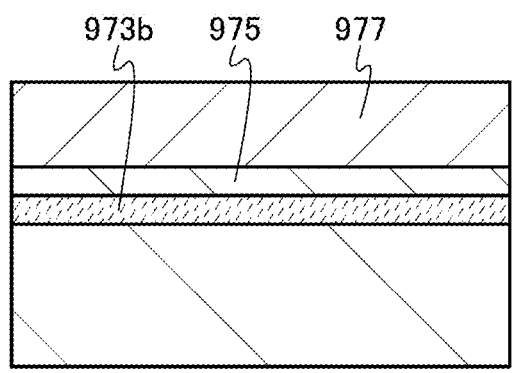
Figure 19C:
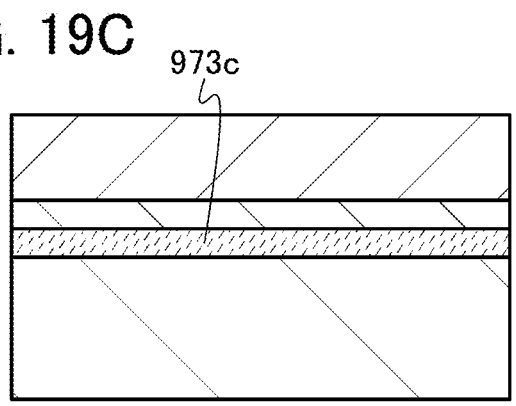

First, methods for forming samples C1, samples C2, and samples C3 which are illustrated in FIGS. 19A to 19C are described.

A method for forming the sample C1 illustrated in FIG. 19A is described.

A 100-nm-thick IGZO film 973a which was a CAAC-OS film was formed by a sputtering method over a quartz substrate 971. Here, the IGZO film was formed under the following conditions: a sputtering target containing In, Ga, and Zn at an atomic ratio of 1:1:1 was used, argon with a flow rate of 50 sccm and oxygen with a flow rate of 50 sccm were supplied as a sputtering gas to a treatment chamber of a sputtering apparatus, the pressure in the treatment chamber was controlled to be 0.6 Pa, and the direct current power of 5 kW was supplied. Note that the IGZO film was formed at a substrate temperature of 170° C.

Next, a silicon oxynitride film 975 ($1^{st}$-SiON) was formed over the IGZO film 973a under the conditions of forming the insulating film 23, which is described in Embodiment 4. Here, the silicon oxynitride film 975 was formed under the following conditions: the quartz substrate was placed in a treatment chamber of a plasma CVD apparatus, silane with a flow rate of 30 sccm and dinitrogen monoxide with a flow rate of 4000 sccm which were used as a source gas were supplied to the treatment chamber, and the power of 150 W was supplied with the use of a 27.12 MHz high-frequency power supply. The silicon oxynitride film was formed at a temperature of the quartz substrate being 220° C. Note that the plasma CVD apparatus used in this example is a parallel plate plasma CVD apparatus in which the electrode area is 6000 cm$^2$, and the power per unit area (power density) into which the supplied power is converted is 0.025 W/cm$^2$.

A plurality of samples C1 were formed in such a manner that the pressure in the treatment chamber during the formation of the silicon oxynitride film 975 was controlled to be 40 Pa, 120 Pa, and 200 Pa and the silicon oxynitride films 975 were formed to thicknesses of 20 nm, 50 nm, and 100 nm.

Next, a method for forming the samples C2 illustrated in FIG. 19B is described.

A silicon oxynitride film 977 was formed over a sample C1 under the conditions of forming the insulating film 24 formation, which is described in Embodiment 4. Here, the 400-nm-thick silicon oxynitride film was formed by a plasma CVD method under the following conditions: the quartz substrate was placed in a treatment chamber of the plasma CVD apparatus, silane with a flow rate of 160 sccm and dinitrogen monoxide with a flow rate of 4000 sccm which were used as a source gas were supplied to the treatment chamber, the pressure in the treatment chamber was 200 Pa, the substrate temperature was 220° C., and the high-frequency power of 1500 W was supplied to an upper electrode of parallel plate electrodes.

Note that here, the IGZO film which was a CAAC-film is an IGZO film 973b illustrated in FIG. 19B.

Next, a method for forming the samples C3 illustrated in FIG. 19C is described.

The samples C3 were formed by heating samples C2 at 350° C. for one hour. Note that here, the IGZO film which was a CAAC-OS film is an IGZO film 973c illustrated in FIG. 19C.

Next, ESR measurement was performed on the samples C1 to C3. In the ESR measurement performed at a predetermined temperature, a value of a magnetic field ($H_0$) where a microwave is absorbed is used for an equation $g=h\nu/\beta H_0$, so that a parameter of a g-factor can be obtained. Note that the frequency of the microwave is denoted by $\nu$. Note that h and $\beta$ represent the Planck constant and the Bohr magneton, respectively, and are both constants.

Here, the ESR measurement was performed under the following conditions. The measurement temperature was room temperature (25° C.), the high-frequency power (power of microwaves) of 9.4 GHz was 20 mW, and the direction of a magnetic field was parallel to a surface of each of the IGZO films in the samples. Note that the lower limit of the detection of the spin densities of a signal due to oxygen vacancies in the IGZO film, which appeared when g (g-factor) was 1.93, was $2.2 \times 10^{16}$ spins/cm$^3$.

Figure 20A:
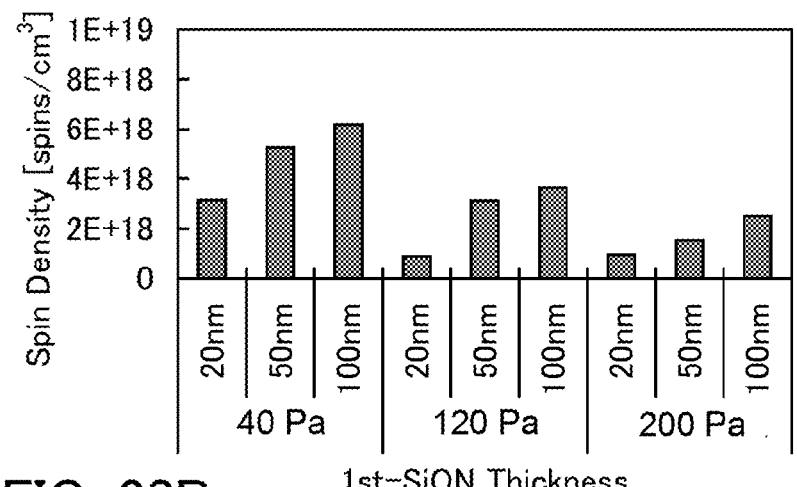
FIGS. 20A to 20C show ESR measurement results of Example 3.
Figure 20B:
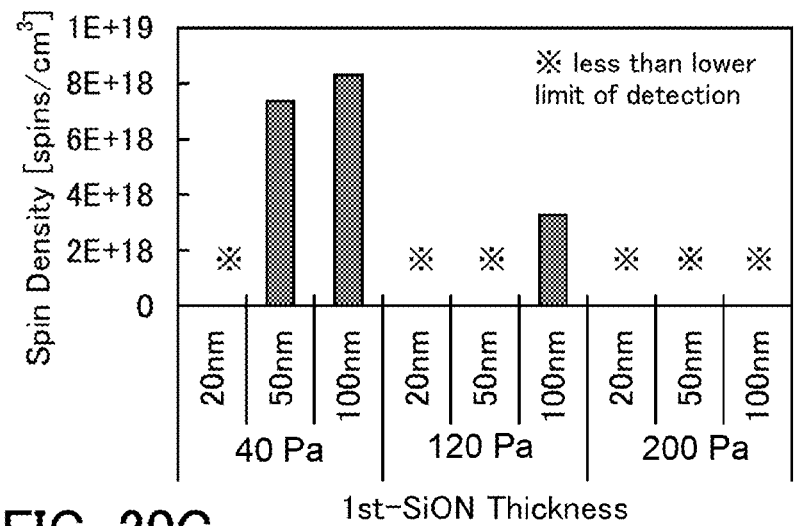
Figure 20C:
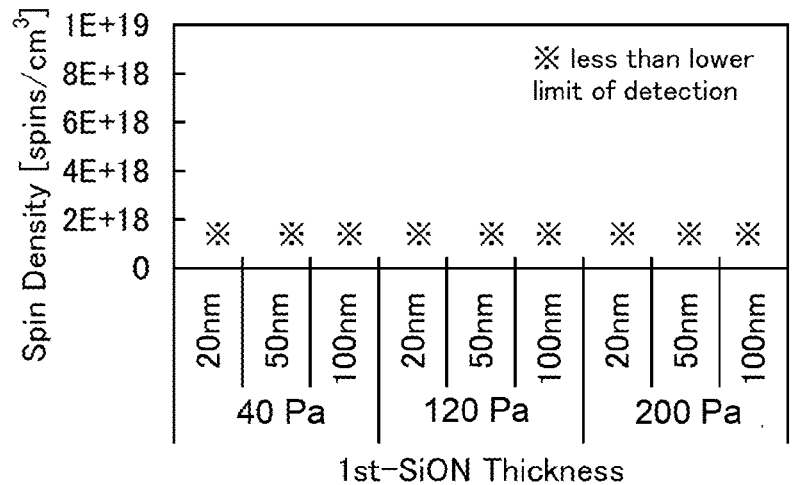

FIGS. 20A to 20C each show spin densities of signals that appear when g (g-factor) is 1.93. FIG. 20A shows spin densities in the samples C1, FIG. 20B shows spin densities in the samples C2, and FIG. 20C shows spin densities in the samples C3.

Figure 21:
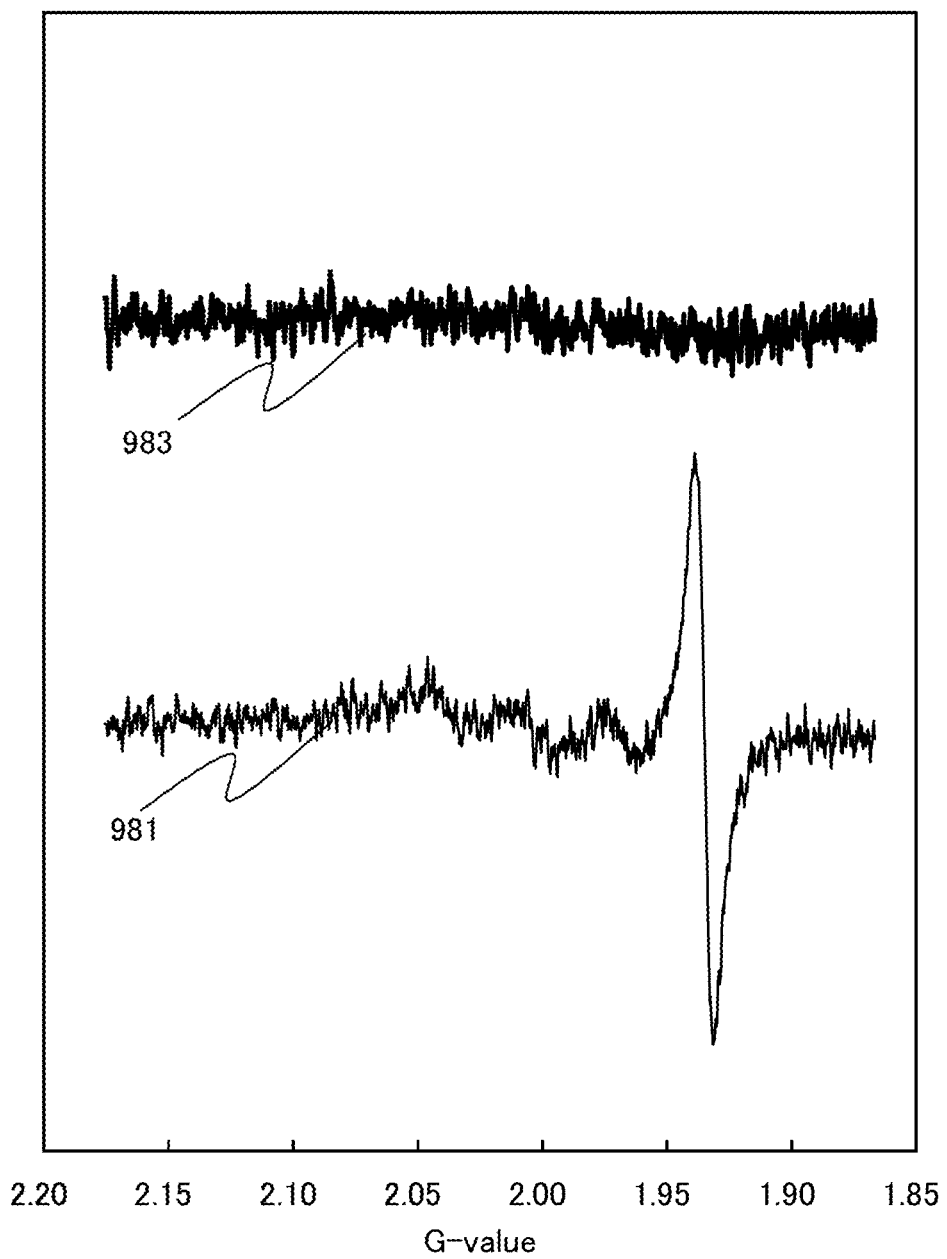
FIG. 21 shows ESR measurement results of Example 3.
Figure 22:
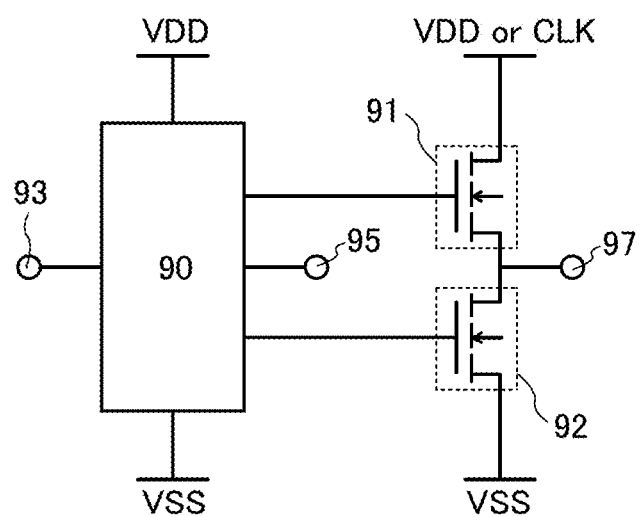
FIG. 22 is a circuit diagram of an example of a conventional pulse signal output circuit.

Moreover, the IGZO films included in one of the samples C2 and one of the samples C3 shown in FIGS. 20B and 20C were evaluated by ESR and their first derivative curves are shown in FIG. 21.

A curve 981 is a first derivative curve of a sample C2 in which a 50-nm-thick silicon oxynitride film 975 was formed under the film formation conditions of the pressure of 40 Pa.

A curve 983 is a first derivative curve of a sample C3 in which a 50-nm-thick silicon oxynitride film 975 was formed under the film formation conditions of the pressure of 40 Pa.

It is found from FIG. 21 that, in the sample C2, a signal having symmetry due to an oxygen vacancy is detected at a g-factor of 1.93, which means that the IGZO film contains an oxygen vacancy. On the other hand, it is found that, in the sample C3, a signal having symmetry due to an oxygen vacancy is not detected (i.e., the amount of oxygen vacancies was less than or equal to the lower limit of detection) and that the amount of oxygen vacancies in the IGZO film cannot be detected.

It is found from FIG. 20A that as the thickness of the silicon oxynitride film 975 is larger or the film formation pressure is lower, the amount of oxygen vacancies in the IGZO film 973a increases. This is because it is more difficult for the excess oxygen contained in the silicon oxynitride film 977 to diffuse into the IGZO film as the thickness of the silicon oxynitride film 975 formed under the conditions of forming the insulating film 24 described in Embodiment 1 increases. Further, as the film formation pressure decreases, the oxide semiconductor film is more damaged and thus the amount of oxygen vacancies increases, under such film formation conditions of the silicon oxynitride film 975.

It is found from FIG. 20B that, in most of the samples where the silicon oxynitride film 977 is formed over the silicon oxynitride film 975, the amount of oxygen vacancies in the IGZO film 973*b* is less than or equal to the lower limit of detection, though the amount of oxygen vacancies increases in some samples.

This is because oxygen vacancies in the IGZO film 973*b* are reduced as follows: the silicon oxynitride film 977 which is an oxide insulating film which contains more oxygen than that of the stoichiometric composition is formed over the silicon oxynitride film 975, so that excess oxygen contained in the silicon oxynitride film 977 is diffused into the IGZO film 973*b* through the silicon oxynitride film 975.

It is found from FIG. 20C that the amount of oxygen vacancies in the IGZO film 973*c* is less than or equal to the lower limit of detection by the heat treatment performed after the silicon oxynitride film 977 is formed over the silicon oxynitride film 975.

This is because oxygen vacancies in the IGZO film 973*c* are reduced as follows: the silicon oxynitride film 977 which is an oxide insulating film which contains more oxygen than that of the stoichiometric composition is formed over the silicon oxynitride film 975, so that excess oxygen contained in the silicon oxynitride film 977 is diffused into the IGZO film 973*c* through the silicon oxynitride film 975.

As described above, the amount of oxygen vacancies in an oxide semiconductor film can be reduced by stacking a silicon oxynitride film over the oxide semiconductor film. Moreover, with application of the structure to a transistor, as shown in Example 1, the transistor in which the threshold voltage is shifted in the positive direction and the amount of change in threshold voltage is less than or equal to 2.5 V can be manufactured.

This application is based on Japanese Patent Application serial No. 2012-124661 filed with Japan Patent Office on May 31, 2012, the entire contents of which are hereby incorporated by reference.

What is claimed is:

1. A pulse signal output circuit comprising:
    a first input signal generation circuit;
    a second input signal generation circuit;
    an output circuit including a first transistor and a second transistor, the output circuit outputting a pulse signal in response to a signal output from the first input signal generation circuit and the second input signal generation circuit;
    a reference circuit which obtains the first threshold voltage of the first transistor and the second threshold voltage of the second transistor; and
    a power supply output circuit which generates a power supply potential raised by a potential higher than or equal to a potential which is equal to or substantially equal to the first threshold voltage or the second threshold voltage and supplies the power supply potential to the first input signal generation circuit and the second input signal generation circuit.

2. The pulse signal output circuit according to claim 1,
    wherein a first threshold voltage of the first transistor is shifted in the positive direction and a second threshold voltage of the second transistor is shifted in the positive direction by a positive BT stress under the following conditions: the substrate temperature is 80° C., the intensity of an electric field applied to the gate insulating film is 1.28 MV/cm, and the application time is 2000 seconds.

3. The pulse signal output circuit according to claim 1, wherein the first transistor and the second transistor have the same polarity.

4. The pulse signal output circuit according to claim 1, wherein the reference circuit comprises a third transistor and a fourth transistor.

5. The pulse signal output circuit according to claim 1, wherein the reference circuit comprises:
    a counter detecting driving time of each of the first transistor and the second transistor, and
    a memory storing reference data for obtaining the first threshold voltage and the second threshold voltage.

6. A shift register comprising the pulse signal output circuit according to claim 1.

7. A pulse signal output circuit comprising:
    first to fourth transistors;
    a first input signal generation circuit;
    a second input signal generation circuit;
    a reference circuit configured to obtain a first threshold voltage of the third transistor and a second threshold voltage of the fourth transistor; and
    a power supply output circuit configured to generate a high-potential-side power supply potential and a low-potential-side power supply potential based on an output of the reference circuit, and supply the high-potential-side power supply potential and the low-potential-side power supply potential to the first input signal generation circuit and the second input signal generation circuit,
    wherein a first terminal of the first transistor and a first terminal of the second transistor are electrically connected to each other and function as a first output terminal,
    wherein a first terminal of the third transistor and a first terminal of the fourth transistor are electrically connected to each other and function as a second output terminal,
    wherein a gate terminal of the first transistor, a gate terminal of the third transistor, and an output terminal of the first input signal generation circuit are electrically connected to one another, and
    wherein a gate terminal of the second transistor, a gate terminal of the fourth transistor, and an output terminal of the second input signal generation circuit are electrically connected to one another.

8. The pulse signal output circuit according to claim 7, wherein a load connected to the second output terminal is heavier than a load connected to the first output terminal.

9. The pulse signal output circuit according to claim 7, wherein an output signal of the second input signal generation circuit is input to the first input signal generation circuit.

10. The pulse signal output circuit according to claim 7, wherein the third transistor and the fourth transistor have the same polarity.

11. The pulse signal output circuit according to claim 7, wherein the reference circuit comprises a fifth transistor and a sixth transistor.

12. The pulse signal output circuit according to claim 7, wherein the reference circuit comprises:
    a counter detecting driving time of each of the third transistor and the fourth transistor, and
    a memory storing reference data for obtaining the first threshold voltage and the second threshold voltage.

13. A shift register comprising the pulse signal output circuit according to claim 7.

14. A pulse signal output circuit comprising:
    an output circuit including a first transistor, a second transistor, a third transistor, and a fourth transistor;

a reference circuit configured to obtain a first threshold voltage of the third transistor and a second threshold voltage of the fourth transistor; and a power supply output circuit configured to generate a high-potential-side power supply potential and a low-potential-side power supply potential based on an output of the reference circuit, wherein a first terminal of the first transistor and a first terminal of the second transistor are electrically connected to each other and function as a first output terminal, wherein a first terminal of the third transistor and a first terminal of the fourth transistor are electrically connected to each other and function as a second output terminal, wherein a gate terminal of the first transistor and a gate terminal of the third transistor are electrically connected to one another, and wherein a gate terminal of the second transistor and a gate terminal of the fourth transistor are electrically connected to one another.

15. The pulse signal output circuit according to claim 14, wherein a load connected to the second output terminal is heavier than a load connected to the first output terminal.

16. The pulse signal output circuit according to claim 14, wherein the third transistor and the fourth transistor have the same polarity.

17. The pulse signal output circuit according to claim 14, wherein the reference circuit comprises a fifth transistor and a sixth transistor.

18. The pulse signal output circuit according to claim 14, wherein the reference circuit comprises:
   a counter detecting driving time of each of the third transistor and the fourth transistor, and
   a memory storing reference data for obtaining the first threshold voltage and the second threshold voltage.

19. A shift register comprising the pulse signal output circuit according to claim 14.

* * * * *